US009508864B2

(12) United States Patent
Yamazaki

(10) Patent No.: US 9,508,864 B2
(45) Date of Patent: Nov. 29, 2016

(54) OXIDE, SEMICONDUCTOR DEVICE, MODULE, AND ELECTRONIC DEVICE

(71) Applicant: Semiconductor Energy Laboratory Co., Ltd., Atsugi-shi, Kanagawa-ken (JP)

(72) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/624,975

(22) Filed: Feb. 18, 2015

(65) Prior Publication Data

US 2015/0236162 A1  Aug. 20, 2015

(30) Foreign Application Priority Data

Feb. 19, 2014  (JP) ................................. 2014-029542

(51) Int. Cl.
*H01L 29/78* (2006.01)
*H01L 29/786* (2006.01)

(52) U.S. Cl.
CPC ..... *H01L 29/7869* (2013.01); *H01L 29/78648* (2013.01); *H01L 29/78696* (2013.01)

(58) Field of Classification Search
CPC ... H01L 29/24; H01L 29/7869; H01L 21/00; H01L 21/16; H01L 21/479; H01L 21/47; H01L 29/78; H01L 29/786
USPC .......................................................... 257/43
See application file for complete search history.

(56) References Cited

U.S. PATENT DOCUMENTS

| 5,528,032 A | 6/1996 | Uchiyama |
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |

(Continued)

FOREIGN PATENT DOCUMENTS

| CN | 103290371 A | 9/2013 |
| DE | 112012002394 | 2/2014 |

(Continued)

OTHER PUBLICATIONS

Noboru Kimizuka et al.; "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures over 1000° C."; Journal of Solid State Chemistry, vol. 60; pp. 382-384; Jan. 1, 1985.

(Continued)

*Primary Examiner* — Monica D Harrison
(74) *Attorney, Agent, or Firm* — Fish & Richardson P.C.

(57) ABSTRACT

To provide a crystalline oxide semiconductor which can be used as a semiconductor of a transistor or the like. The crystalline oxide semiconductor is an oxide over a surface and includes a plurality of flat-plate-like In—Ga—Zn oxides. Each of the plurality of flat-plate-like In—Ga—Zn oxides has a crystal structure and includes a first layer, a second layer, and a third layer. The first layer includes a gallium atom, a zinc atom, and an oxygen atom. The second layer includes an indium atom and an oxygen atom. The third layer includes a gallium atom, a zinc atom, and an oxygen atom. A flat plane of each of the plurality of flat-plate-like In—Ga—Zn oxides is substantially perpendicular to a normal vector of the surface.

14 Claims, 56 Drawing Sheets

(56) References Cited

U.S. PATENT DOCUMENTS

| | | |
|---|---|---|
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 8,202,365 B2 | 6/2012 | Umeda et al. |
| 8,237,166 B2 | 8/2012 | Kumomi |
| 8,274,078 B2 | 9/2012 | Itagaki et al. |
| 8,319,218 B2 | 11/2012 | Yamazaki et al. |
| 8,492,758 B2 | 7/2013 | Yamazaki et al. |
| 8,547,771 B2 | 10/2013 | Koyama |
| 8,669,556 B2 | 3/2014 | Yamazaki et al. |
| 8,680,522 B2 | 3/2014 | Yamazaki et al. |
| 8,765,522 B2 | 7/2014 | Yamazaki |
| 8,889,477 B2 | 11/2014 | Yamazaki et al. |
| 8,952,381 B2 | 2/2015 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0180217 A1 | 9/2004 | Inoue et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099803 A1 | 5/2008 | Li et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0051938 A1 | 3/2010 | Hayashi et al. |
| 2010/0065844 A1 | 3/2010 | Tokunaga |
| 2010/0092800 A1 | 4/2010 | Itagaki et al. |
| 2010/0108502 A1 | 5/2010 | Inoue et al. |
| 2010/0109002 A1 | 5/2010 | Itagaki et al. |
| 2010/0320458 A1 | 12/2010 | Umeda et al. |
| 2010/0320459 A1 | 12/2010 | Umeda et al. |
| 2011/0084264 A1 | 4/2011 | Yamazaki et al. |
| 2011/0101352 A1 | 5/2011 | Hosono et al. |
| 2011/0127521 A1 | 6/2011 | Yamazaki |
| 2011/0127579 A1 | 6/2011 | Yamazaki |
| 2011/0201162 A1 | 8/2011 | Hosono et al. |
| 2012/0012838 A1 | 1/2012 | Hosono et al. |
| 2012/0037901 A1 | 2/2012 | Mori et al. |
| 2012/0064703 A1 | 3/2012 | Jintyou et al. |
| 2012/0138922 A1 | 6/2012 | Yamazaki et al. |
| 2012/0153364 A1 | 6/2012 | Yamazaki et al. |
| 2012/0184066 A1 | 7/2012 | Yano et al. |
| 2012/0261657 A1 | 10/2012 | Takahashi et al. |
| 2012/0267622 A1 | 10/2012 | Yamazaki et al. |
| 2012/0312681 A1 | 12/2012 | Yamazaki et al. |
| 2012/0325650 A1 | 12/2012 | Yamazaki et al. |
| 2013/0062601 A1 | 3/2013 | Yamazaki et al. |
| 2013/0082337 A1 | 4/2013 | Chudzik et al. |
| 2013/0153889 A1 | 6/2013 | Yamazaki et al. |
| 2013/0214273 A1 | 8/2013 | Yamazaki et al. |
| 2013/0221351 A1 | 8/2013 | Ebata et al. |
| 2013/0270549 A1 | 10/2013 | Okazaki et al. |
| 2013/0298989 A1 | 11/2013 | Tomizawa et al. |
| 2013/0300462 A1 | 11/2013 | Koyama et al. |
| 2013/0320330 A1 | 12/2013 | Yamazaki |
| 2013/0320335 A1 | 12/2013 | Yamazaki |
| 2013/0321333 A1 | 12/2013 | Tamura |
| 2013/0334533 A1 | 12/2013 | Yamazaki |
| 2013/0341180 A1 | 12/2013 | Yamazaki |
| 2014/0001032 A1 | 1/2014 | Yamazaki |
| 2014/0021036 A1 | 1/2014 | Yamazaki |
| 2014/0042014 A1 | 2/2014 | Yamazaki |
| 2014/0042018 A1* | 2/2014 | Yamazaki ............... 204/192.25 |
| 2014/0045299 A1 | 2/2014 | Yamazaki |
| 2014/0097867 A1 | 4/2014 | Koyama |
| 2014/0102877 A1 | 4/2014 | Yamazaki |
| 2014/0103339 A1 | 4/2014 | Yamazaki et al. |
| 2014/0124776 A1 | 5/2014 | Takahashi et al. |
| 2014/0145183 A1 | 5/2014 | Yamazaki |
| 2014/0151687 A1 | 6/2014 | Yamazaki |
| 2014/0175435 A1 | 6/2014 | Yamazaki et al. |
| 2014/0183527 A1 | 7/2014 | Yamazaki et al. |
| 2014/0183530 A1 | 7/2014 | Yamazaki et al. |
| 2014/0183532 A1 | 7/2014 | Yamazaki et al. |
| 2014/0203276 A1 | 7/2014 | Yamazaki et al. |

(56) References Cited

U.S. PATENT DOCUMENTS

| | | |
|---|---|---|
| 2014/0225104 A1 | 8/2014 | Yamazaki et al. |
| 2014/0284596 A1 | 9/2014 | Yamazaki et al. |
| 2014/0306219 A1 | 10/2014 | Yamazaki et al. |
| 2014/0333864 A1 | 11/2014 | Miyake et al. |
| 2014/0346500 A1 | 11/2014 | Yamazaki |
| 2014/0374743 A1 | 12/2014 | Yamazaki |
| 2015/0021593 A1 | 1/2015 | Yamazaki |
| 2015/0034475 A1 | 2/2015 | Yamazaki |
| 2015/0107988 A1 | 4/2015 | Yamazaki |
| 2015/0123127 A1 | 5/2015 | Yamazaki |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 A | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2011-135064 A | 7/2011 |
| JP | 2012-059860 A | 3/2012 |
| JP | 2012-257187 A | 12/2012 |
| JP | 2013-145864 A | 7/2013 |
| KR | 2014-0007495 A | 1/2014 |
| TW | 201140700 | 11/2011 |
| TW | 201303059 | 1/2013 |
| WO | WO-2004/114391 | 12/2004 |
| WO | WO-2011/065210 | 6/2011 |
| WO | WO-2012/169449 | 12/2012 |

OTHER PUBLICATIONS

Noboru Kimizuka et al.; "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System"; Journal of Solid State Chemistry, vol. 116, No. 1; pp. 170-178; Apr. 1, 1995.

Shunpei Yamazaki et al.; "Research, Development, and Application of Crystalline Oxide Semiconductor"; SID Digest '12 : SID International Symposium Digest of Technical Papers; pp. 183-186; Jun. 5, 2012.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for Amoled Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Godo.H et al., "Temperature Dependence of Characteristics and Electronic Structure For Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids ( Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physial Review Letters), Jan. 26, 2007, vol. 98, pp. 045501-1-045501-4.

Lee.H et al., "Current Status of, Challenges to, and Perspective View of AM-OLED ", IDW '06 :Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", Nirim Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn—Oxide TFTS With a Novel Passivation Layer", SID Digest '09 : SID International Symposium Digest of Technical Papers, May 31, 2009, pp. 264-267.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a $Zn4s$ conductor", Philosophical Magazine, 2001, vol. 81, No. 5, pp. 501-515.

Orita.M et al., "Mechanism of Electrical Conductivity of Transparent $InGaZnO4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GiZo ($Ga_2O_3$—$In_2O_3$-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

(56) References Cited

OTHER PUBLICATIONS

Tsuda.K et al., "Ultra Low Power Consumption Technologies for Mobile TFT-LCDs", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
International Search Report (Application No. PCT/IB2015/050946) Dated Jun. 9, 2015.
Written Opinion (Application No. PCT/IB2015/050946) Dated Jun. 9, 2015.

* cited by examiner

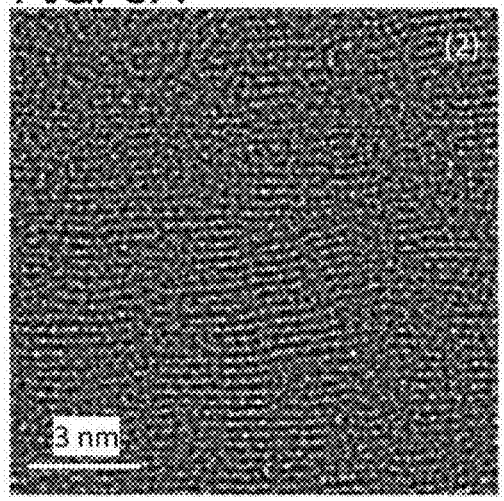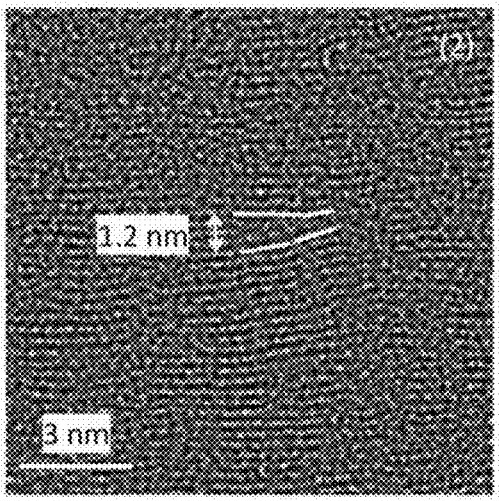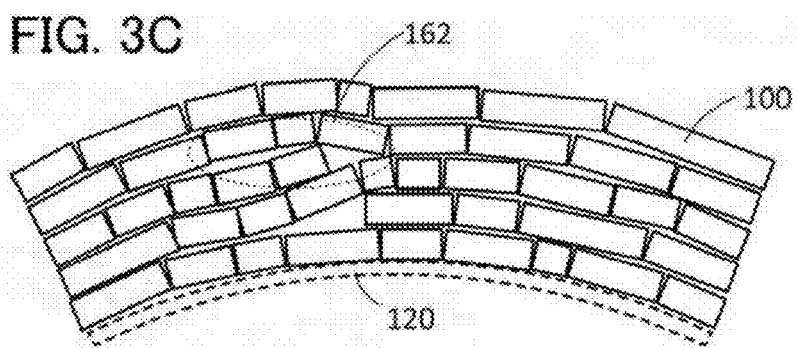

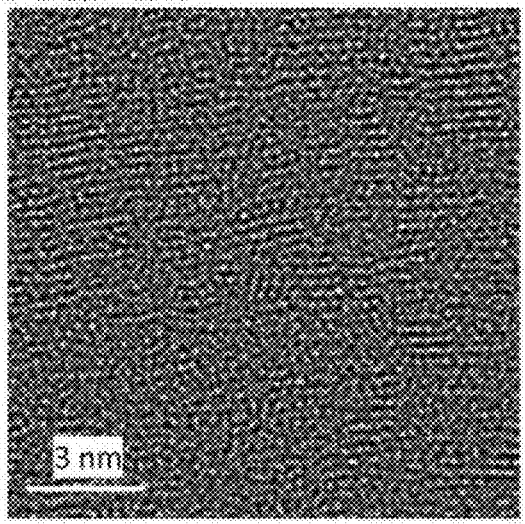 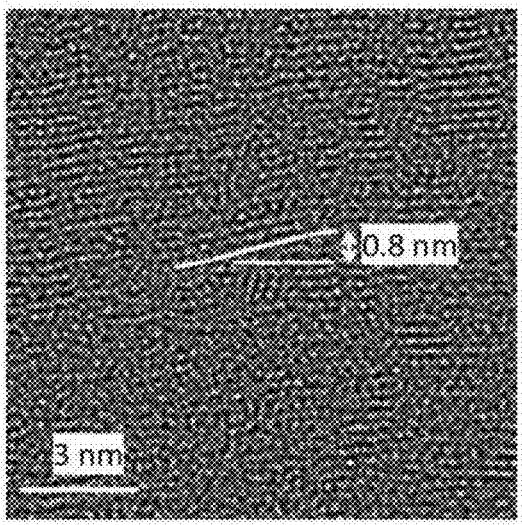
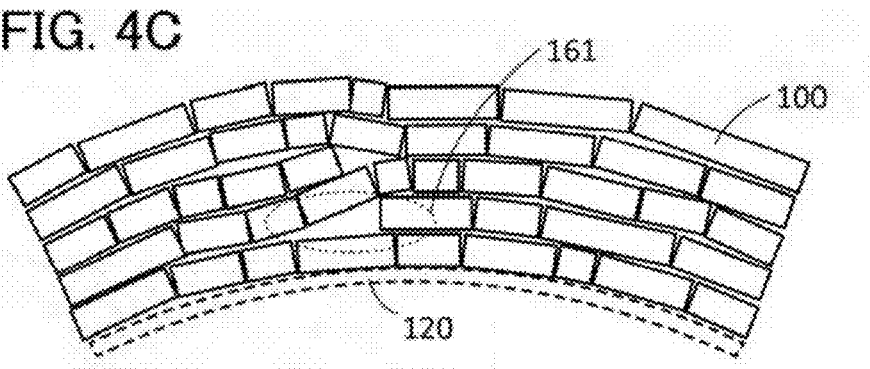

FIG. 11A
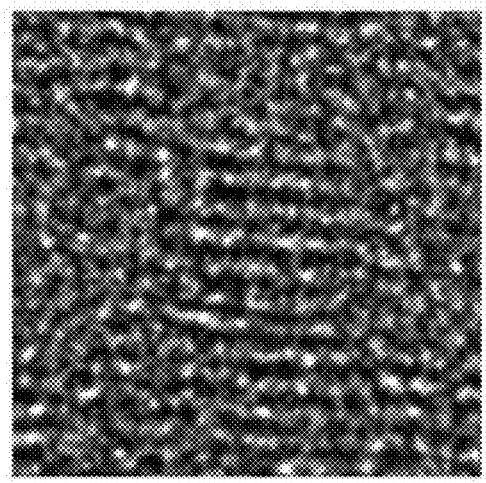 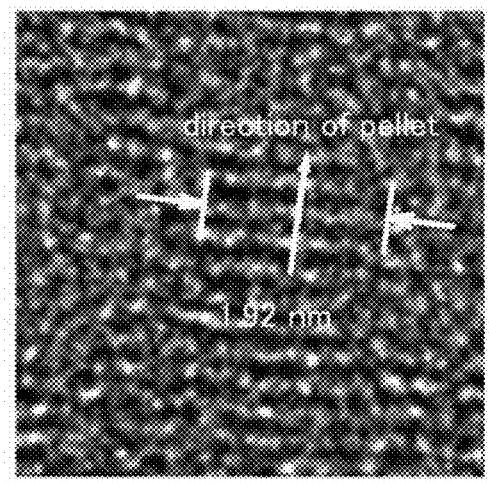
FIG. 11B
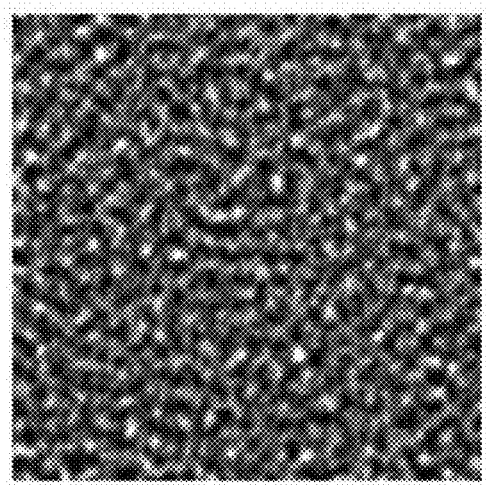 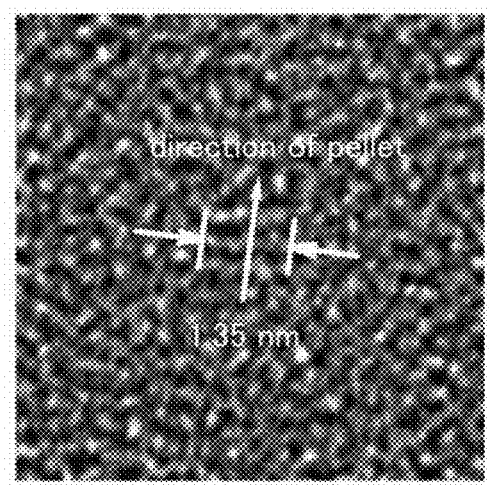

10 nm 10 nm

2nm

2nm

2nm

2nm

InGaZnO₄

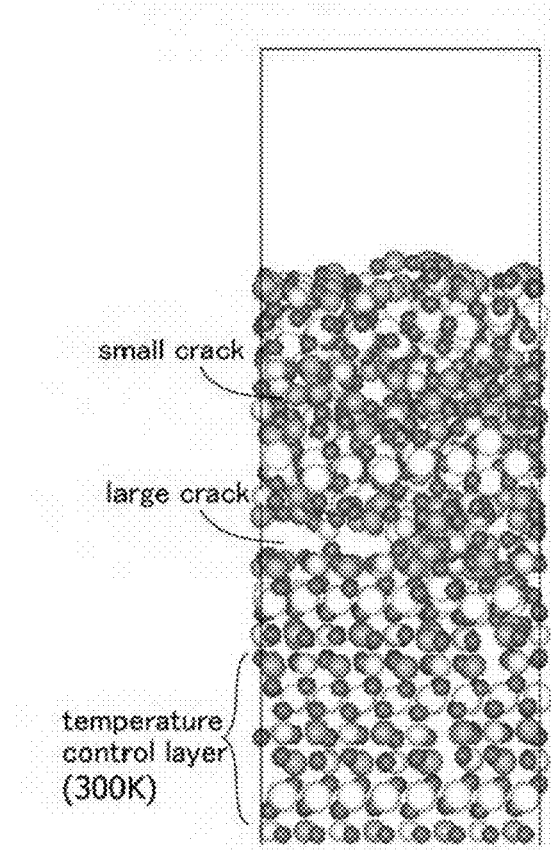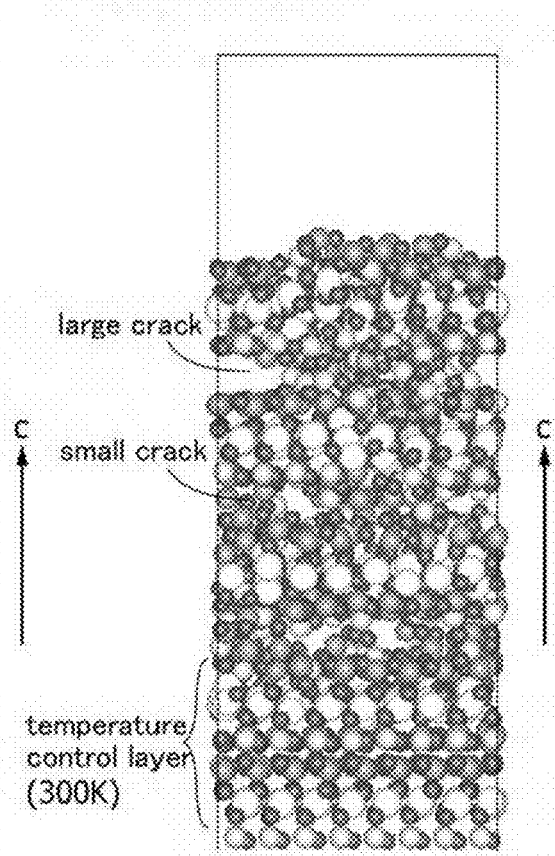

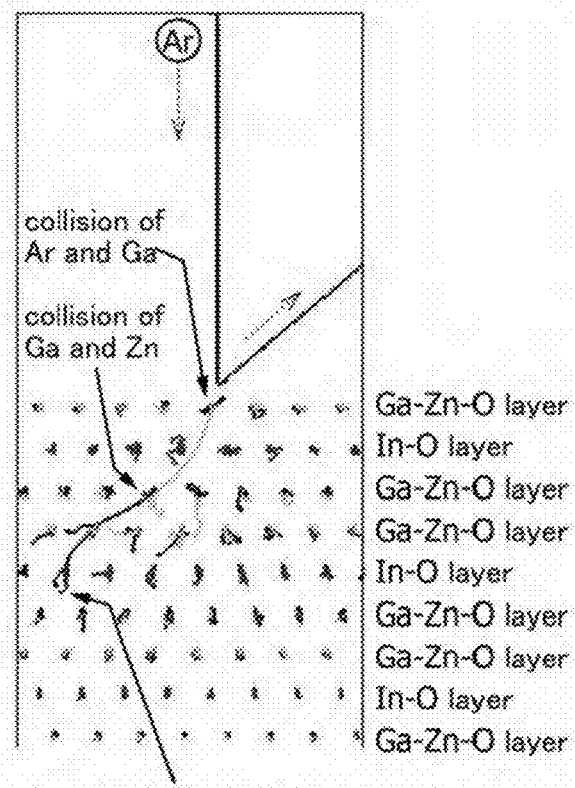
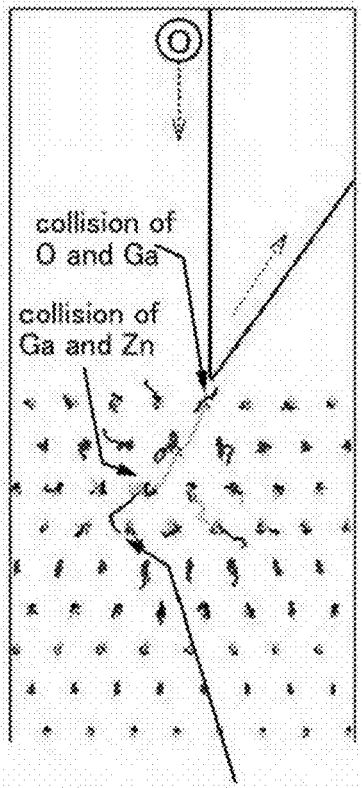
FIG. 32A
FIG. 32B

FIG. 55A1 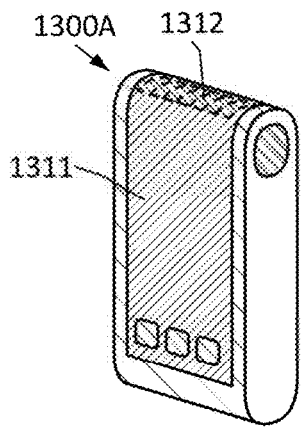
FIG. 55A2 
FIG. 55A3 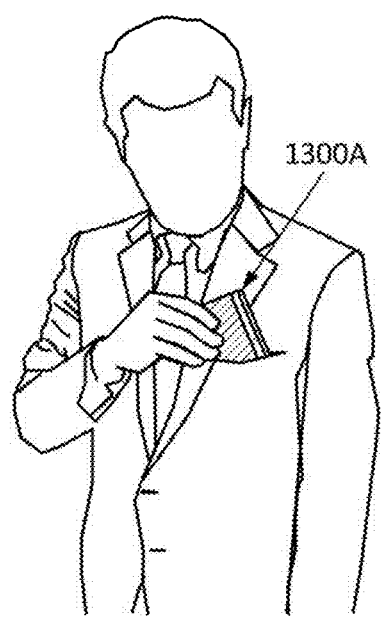
FIG. 55B1 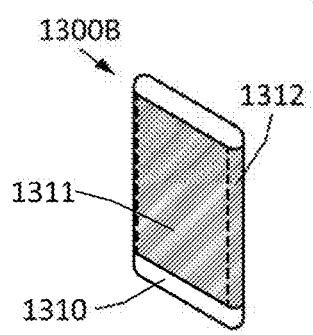
FIG. 55B2 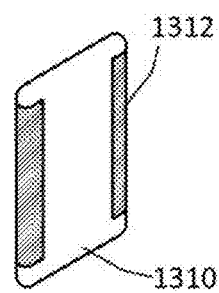
FIG. 55C1 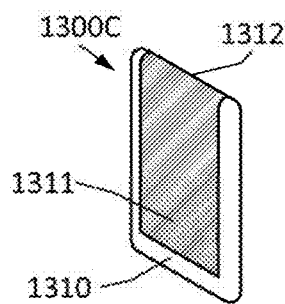
FIG. 55C2 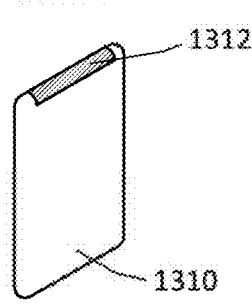

OXIDE, SEMICONDUCTOR DEVICE, MODULE, AND ELECTRONIC DEVICE

TECHNICAL FIELD

The present invention relates to an object, a method, or a manufacturing method. Furthermore, the present invention relates to a process, a machine, manufacture, or a composition of matter. In particular, the present invention relates to, for example, a semiconductor, a semiconductor device, a display device, a light-emitting device, a lighting device, a power storage device, a memory device, or a processor. The present invention relates to a method for manufacturing a semiconductor, a semiconductor device, a display device, a liquid crystal display device, a light-emitting device, or a memory device. The present invention relates to a driving method of a semiconductor device, a display device, a liquid crystal display device, a light-emitting device, or a memory device.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

Whether amorphous silicon or polycrystalline silicon is used as a semiconductor in a transistor depends on the purpose. For example, in the case of a transistor included in a large display device, amorphous silicon, which can be formed using an established technique for forming a film over a large substrate, is preferably used. On the other hand, in the case of a transistor included in a high-performance display device where a driver circuit and a pixel circuit are formed over the same substrate, polycrystalline silicon, which can be used to form a transistor having a high field-effect mobility, is preferably used. As a method for forming polycrystalline silicon, high-temperature heat treatment or laser light treatment which is performed on amorphous silicon has been known.

In recent years, an oxide semiconductor has attracted attention. For example, a transistor which includes an amorphous In—Ga—Zn oxide is disclosed (see Patent Document 1). An oxide semiconductor can be formed by a sputtering method or the like, and thus can be used for a semiconductor of a transistor in a large display device. Moreover, a transistor including an oxide semiconductor has high field-effect mobility; therefore, a high-performance display device where a driver circuit and a pixel circuit are formed over the same substrate can be obtained. In addition, there is an advantage that capital investment can be reduced because part of production equipment for a transistor including amorphous silicon can be retrofitted and utilized.

In 1985, synthesis of an In—Ga—Zn oxide crystal was reported (see Non-Patent Document 1). Furthermore, in 1995, it was reported that an In—Ga—Zn oxide has a homologous structure and is represented by a composition formula $InGaO_3(ZnO)_m$ (m is a natural number) (see Non-Patent Document 2).

In 2012, it was reported that a transistor including a crystalline In—Ga—Zn oxide has more excellent electrical characteristics and higher reliability than a transistor including an amorphous In—Ga—Zn oxide film (see Non-Patent Document 3). Non-Patent Document 3 reports that a grain boundary is not clearly observed in an In—Ga—Zn oxide including a c-axis aligned crystal (CAAC).

A transistor including an oxide semiconductor is known to have an extremely low leakage current in an off state. For example, a low-power CPU utilizing a characteristic of low leakage current of the transistor including an oxide semiconductor are disclosed (see Patent Document 2). Patent Document 3 discloses that a transistor having high field-effect mobility can be obtained by a well potential formed using an active layer formed of an oxide semiconductor.

REFERENCE

Patent Document

[Patent Document 1] Japanese Published Patent Application No. 2006-165528
[Patent Document 2] Japanese Published Patent Application No. 2012-257187
[Patent Document 3] Japanese Published Patent Application No. 2012-59860

Non-Patent Document

[Non-Patent Document 1] N. Kimizuka, and T. Mohri, "Spinel, $YbFe_2O_4$, and $Yb_2Fe_3O_7$ Types of Structures for Compounds in the $In_2O_3$ and $Sc_2O_3$-$A_2O_3$—BO Systems (A; Fe, Ga, or Al; B: Mg, Mn, Fe, Ni, Cu, or Zn) at Temperatures over 1000° C.", *Journal of Solid State Chemistry*, Vol. 60, 1985, pp. 382-384
[Non-Patent Document 2] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System", *Journal of Solid State Chemistry*, Vol. 116, 1995, pp. 170-178
[Non-Patent Document 3] S. Yamazaki, J. Koyama, Y. Yamamoto, and K. Okamoto, *Society for Information Display* 2012 DIGEST, pp. 183-186

DISCLOSURE OF INVENTION

An object of the present invention is to provide a method for forming a crystalline oxide that can be used as a semiconductor of a transistor or the like. In particular, an object of the present invention is to provide a method for forming a crystalline oxide having few defects such as grain boundaries.

Another object is to provide a semiconductor device using a crystalline oxide semiconductor. Another object is to provide a novel semiconductor device. Another object is to provide a module including a semiconductor device using a crystalline oxide semiconductor. Another object is to provide an electronic device including a semiconductor device using a crystalline oxide semiconductor or a module including a semiconductor device using a crystalline oxide semiconductor.

Note that the descriptions of these objects do not disturb the existence of other objects. In one embodiment of the present invention, there is no need to achieve all the objects.

Other objects will be apparent from and can be derived from the description of the specification, the drawings, the claims, and the like.

(1)

An embodiment of the present invention is an oxide which is over a surface and includes a plurality of flat-plate-like In—Ga—Zn oxides. Each of the plurality of flat-plate-like In—Ga—Zn oxides has a crystal structure and includes a first layer, a second layer, and a third layer. The first layer includes a gallium atom, a zinc atom, and an oxygen atom. The second layer includes an indium atom and an oxygen atom. The third layer includes a gallium atom, a zinc atom, and an oxygen atom. A flat plane of each of the plurality of flat-plate-like In—Ga—Zn oxides is substantially perpendicular to a normal vector of the surface.

(2)

Another embodiment of the present invention is the oxide of (1) including a plurality of flat-plate-like In—Ga—Zn oxides. The plurality of flat-plate-like In—Ga—Zn oxides include a first flat-plate-like In—Ga—Zn oxide, a second flat-plate-like In—Ga—Zn oxide, and a third flat-plate-like In—Ga—Zn oxide. The first flat-plate-like In—Ga—Zn oxide has a crystal structure. The first flat-plate-like In—Ga—Zn oxide is provided between the second flat-plate-like In—Ga—Zn oxide and the third flat-plate-like In—Ga—Zn oxide. A flat plane of the first flat-plate-like In—Ga—Zn oxide is not substantially perpendicular to a normal vector of the surface.

(3)

Another embodiment of the present invention is the oxide of (1) or (2) in which a composition formula of each of the plurality of flat-plate-like In—Ga—Zn oxides is $InGaZnO_4$.

(4)

Another embodiment of the present invention is a semiconductor device including a semiconductor including the crystalline oxide of any one of (1) to (3), an insulator, and a conductor. The insulator includes a region in contact with the semiconductor, and the conductor includes a region where the conductor and the semiconductor are overlapped with each other with the insulator provided therebetween.

(5)

Another embodiment of the present invention is a module including the semiconductor device of (4) and a printed circuit board.

(6)

Another embodiment of the present invention is an electronic device including the semiconductor device of (4) or the module of (5), a speaker, an operation key, or a battery.

It is possible to provide a method for forming a crystalline oxide that can be used as a semiconductor of a transistor or the like. In particular, it is possible to provide a method for forming a crystalline oxide having few defects such as grain boundaries.

It is possible to provide a semiconductor device using a crystalline oxide semiconductor. It is possible to provide a novel semiconductor device. It is possible to provide a module including a semiconductor device using a crystalline oxide semiconductor. It is possible to provide a semiconductor device using a crystalline oxide semiconductor or an electronic device including a module including a semiconductor device using a crystalline oxide semiconductor.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

In the accompanying drawings:

FIGS. 3A to 3C are Cs-corrected high-resolution cross-sectional TEM images and the like of a CAAC-OS;

FIGS. 4A to 4C are Cs-corrected high-resolution cross-sectional TEM images and the like of a CAAC-OS;

FIGS. 11A and 11B show Cs-corrected high-resolution cross-sectional TEM images of a CAAC-OS and an nc-OS;

FIGS. 31A and 31B illustrate a structure of InGaZnO$_4$ and the like after collision of atoms;

FIGS. 32A and 32B show trajectories of atoms after collision of atoms;

FIGS. 55A1 to 55A3, FIGS. 55B1 and 55B2, and FIGS. 55C1 and 55C2 each illustrate an electronic device of one embodiment of the present invention.

BEST MODE FOR CARRYING OUT THE INVENTION

Figure 1A:
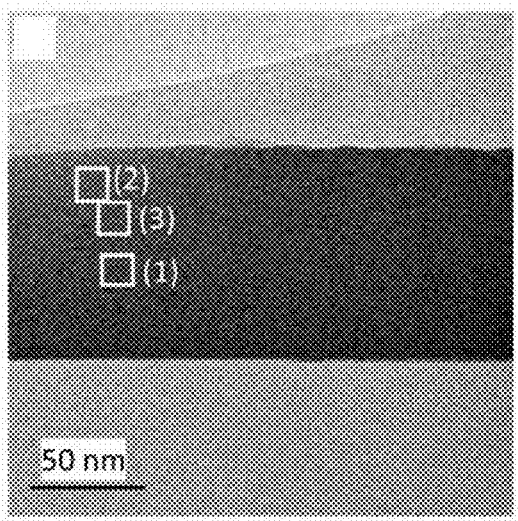
FIGS. 1A to 1D are Cs-corrected high-resolution cross-sectional TEM images and the like of a CAAC-OS.

Embodiments of the present invention will be described in detail with reference to the drawings. However, the present invention is not limited to the description below, and it is easily understood by those skilled in the art that modes and details disclosed herein can be modified in various ways. Furthermore, the present invention is not construed as being limited to description of the embodiments. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in diagrams may be exaggerated for clarity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for the sake of convenience and do not denote the order of steps or the stacking order of layers. Therefore, for example, the term "first" can be replaced with the term "second", "third", or the like as appropriate. In addition, the ordinal numbers in this specification and the like are not necessarily the same as the ordinal numbers used to specify one embodiment of the present invention.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Furthermore, a "semiconductor" includes characteristics of a "conductor" in some cases when the conductivity is sufficiently high, for example. Furthermore, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of a semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased, for example. When the semiconductor is an oxide semiconductor, examples of an impurity which changes the characteristics of the semiconductor include Group 1 elements, Group 2 elements, Group 14 elements, Group 15 elements, and transition metals other than the main components; specifically, there are hydrogen (including water), lithium, sodium, silicon, boron, phosphorus, carbon, and nitrogen, for example. When the semiconductor is an oxide semiconductor, oxygen vacancies may be formed by entry of impurities such as hydrogen, for example. Furthermore, when the semiconductor is silicon, examples of an impurity which changes the characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

A channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions do not necessarily have the same value. In other words, a channel width of one transistor is not fixed to one value in some cases. Therefore, in this specification, a channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is higher than the proportion of a channel region formed in a top surface of the semiconductor in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be alternately referred to as the description "one of end portions of A is positioned on an outer side than one of end portions of B".

<CAAC-OS and nc-OS>

A c-axis aligned crystalline oxide semiconductor (CAAC-OS), which is a crystalline oxide semiconductor of this embodiment, will be described below with reference to drawings. The CAAC-OS is an oxide semiconductor which has c-axis alignment while the directions of a-axes and b-axes are irregularly oriented and in which c-axes are aligned in a direction parallel to a normal vector of a formation surface or a normal vector of a top surface.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

An image obtained by transmission electron microscopy (TEM) using a spherical aberration corrector function (also referred to as a TEM image) of a cross-section of an In—Ga—Zn oxide which is a CAAC-OS is observed. Note that a combined analysis image of a bright-field image obtained by TEM analysis and a diffraction pattern is referred to as a high-resolution TEM image. The high-resolution TEM image obtained with a spherical aberration corrector function is particularly referred to as a Cs-corrected high-resolution TEM image. Note that the Cs-corrected high-resolution TEM image can be obtained with, for example, an atomic resolution analytical electron microscope JEM-ARM200F manufactured by JEOL Ltd.

Figure 1B:
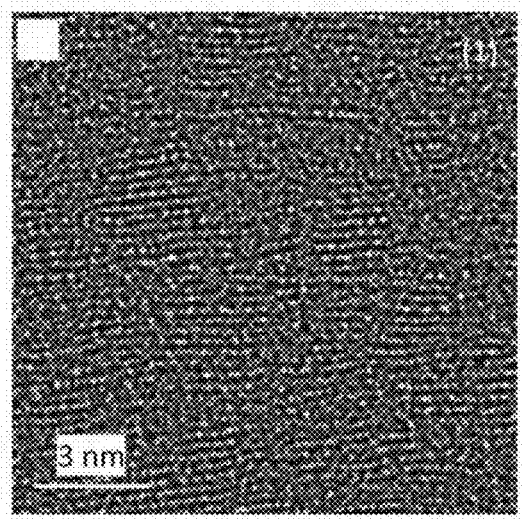
Figure 1C:
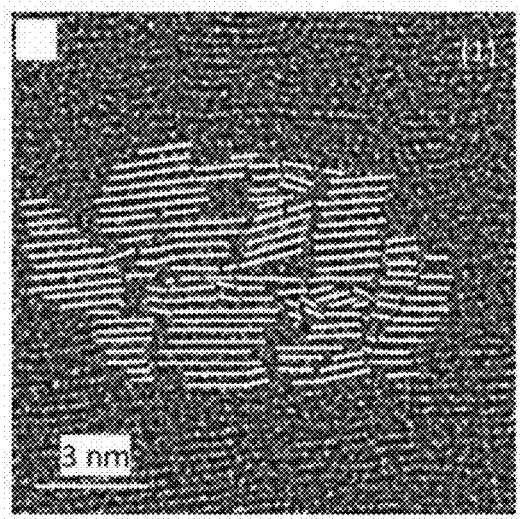

FIG. 1A is a Cs-corrected high-resolution cross-sectional TEM image of a CAAC-OS. FIG. 1B is an enlarged Cs-corrected high-resolution cross-sectional TEM image of a surrounded portion (1) in FIG. 1A. FIG. 1C is a Cs-corrected high-resolution cross-sectional TEM image in which regularity of atomic arrangement in FIG. 1B is denoted by an auxiliary line.

Figure 1D:
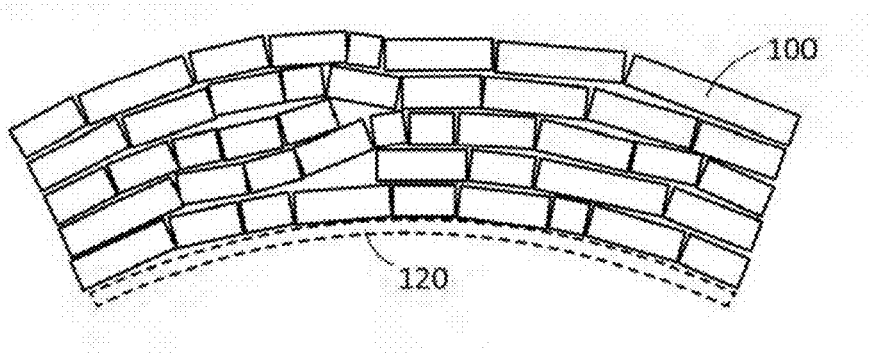

FIG. 1C shows that the CAAC-OS has a layered atomic arrangement. That is, the CAAC-OS has a structure in which flat-plate-like In—Ga—Zn oxides are stacked. In this specification, such a flat-plate-like In—Ga—Zn oxide is referred to as a pellet. A pellet in FIG. 1C has a size of 1 nm to 3 nm (typically approximately 2 nm). FIG. 1D is a schematic view of the CAAC-OS showing a state where pellets 100 are stacked over a substrate 120 having a convex surface.

Figure 2A:
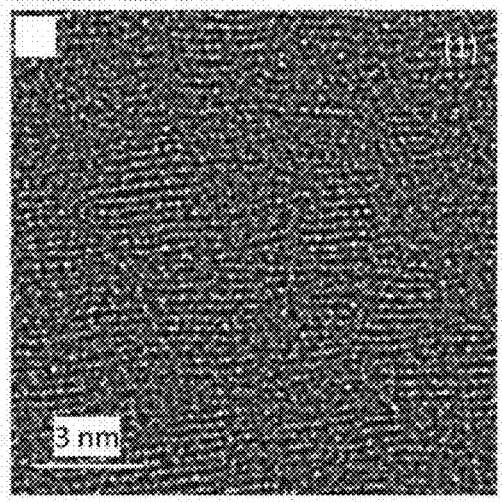
FIGS. 2A to 2C are Cs-corrected high-resolution cross-sectional TEM images and the like of a CAAC-OS.
Figure 2B:
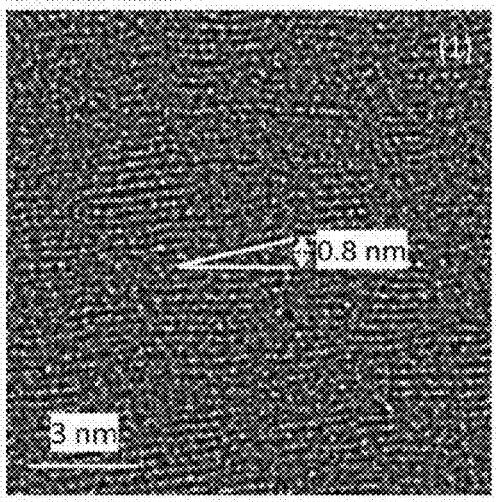
Figure 2C:
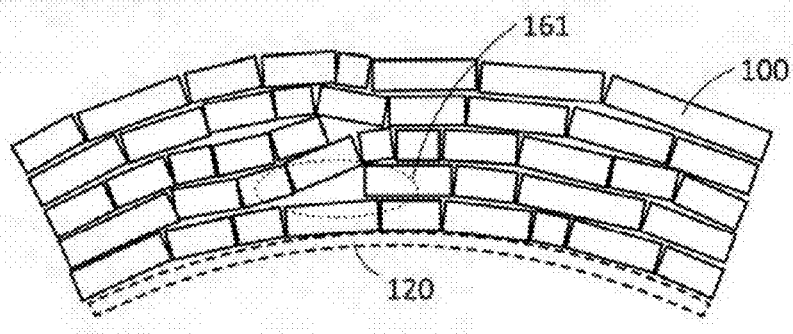

FIG. 2A is an enlarged Cs-corrected high-resolution cross-sectional TEM image of the surrounded portion (1) in FIG. 1A. FIG. 2B is a Cs-corrected high-resolution cross-sectional TEM image in which regularity of atomic arrangement in FIG. 2A is denoted by an auxiliary line. FIG. 2C is a schematic cross-sectional view of the CAAC-OS over the substrate 120 having a convex surface.

The characteristic atomic arrangement in FIG. 2B in which a tilted pellet is stacked over a pellet corresponds to a region 161 in FIG. 2C. FIG. 2B shows that the size of a pellet is approximately 3 nm, and the size of a space caused by tilt of the pellets is approximately 0.8 nm.

FIG. 3A is a Cs-corrected high-resolution cross-sectional TEM image in which part of a surrounded portion (2) in FIG. 1A is enlarged. FIG. 3B is a Cs-corrected high-resolution cross-sectional TEM image in which regularity of atomic arrangement in FIG. 3A is denoted by an auxiliary line. FIG. 3C is a schematic cross-sectional view of the CAAC-OS over the substrate 120 having a convex surface.

The characteristic atomic arrangement in FIG. 3B in which a pellet is overlapped with another pellet with a space therebetween corresponds to a region 162 in FIG. 3C. FIG. 3B shows that the size of a pellet is approximately 2 nm, and the size of a space is approximately 1.2 nm.

FIG. 4A is an enlarged Cs-corrected high-resolution cross-sectional TEM image of a region outside the visual field of FIG. 1A. FIG. 4B is a Cs-corrected high-resolution cross-sectional TEM image in which regularity of atomic arrangement in FIG. 4A is denoted by an auxiliary line. FIG. 4C is a schematic cross-sectional view of the CAAC-OS over the substrate 120 having a convex surface.

The characteristic atomic arrangement in FIG. 4B in which a tilted pellet is stacked over a pellet corresponds to the region 161 in FIG. 4C. FIG. 4B shows that the size of a pellet is approximately 3 nm, and the size of a space caused by tilt of the pellets is approximately 0.8 nm. That is, the atomic arrangement of the pellet in FIG. 4B is similar to the atomic arrangement of the pellet in FIG. 2B.

Figure 5A:
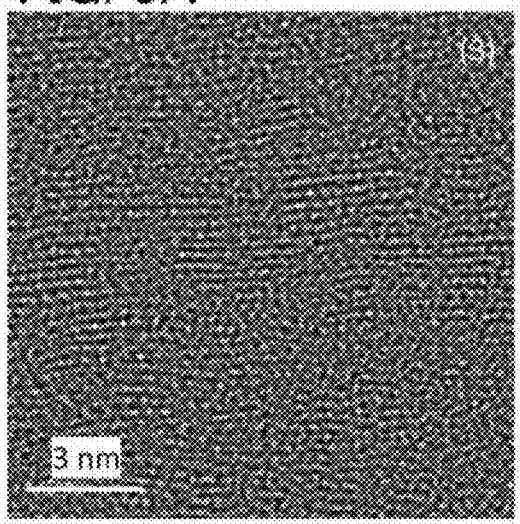
FIGS. 5A to 5C are Cs-corrected high-resolution cross-sectional TEM images and the like of a CAAC-OS.
Figure 5B:
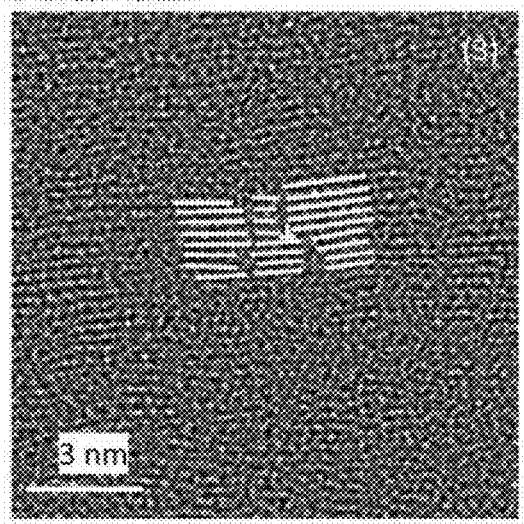
Figure 5C:
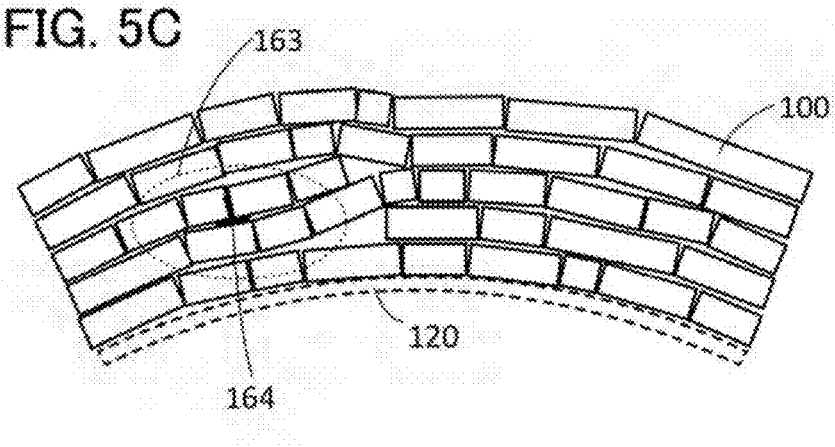

FIG. 5A is an enlarged Cs-corrected high-resolution cross-sectional TEM image of a surrounded portion (3) in FIG. 1A. FIG. 5B is a Cs-corrected high-resolution cross-sectional TEM image in which regularity of atomic arrangement in FIG. 5A is denoted by an auxiliary line. FIG. 5C is a schematic cross-sectional view of the CAAC-OS over the substrate 120 having a convex surface.

The characteristic atomic arrangement in FIG. 5B in which a space with an atomic-level size (also referred to as an atomic void) is provided in overlap of pellets corresponds to a region 163 in FIG. 5C. FIG. 5B shows that there is an atomic void 164 in FIG. 5C between pellets.

Figure 6A:
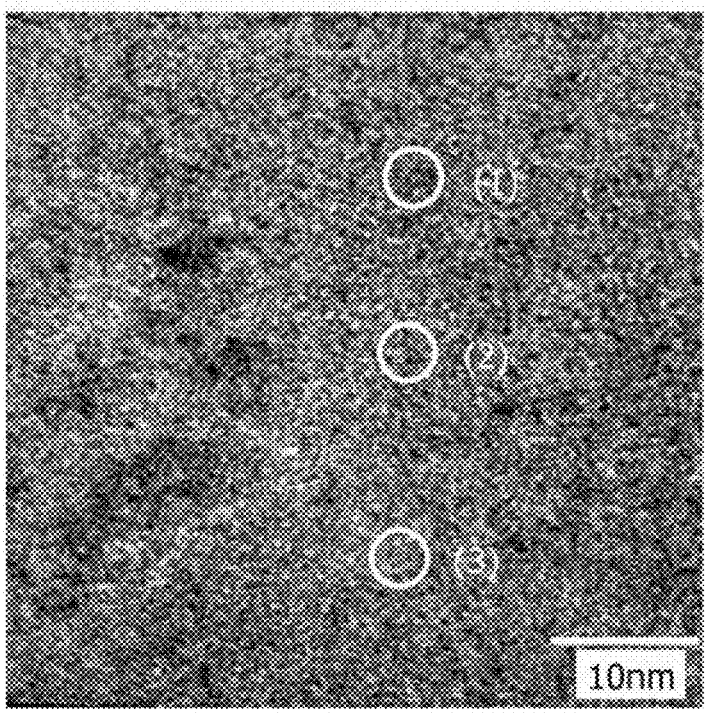
FIG. 6A is a high-resolution plan-view TEM image of a CAAC-OS and FIGS. 6B to 6D are transmission electron diffraction patterns of regions in FIG. 6A.
Figure 6B:
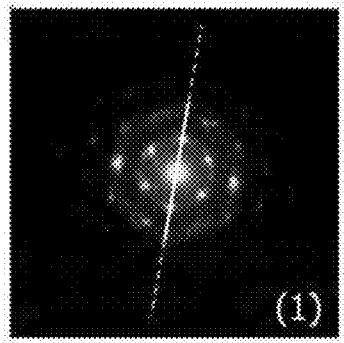
Figure 6C:
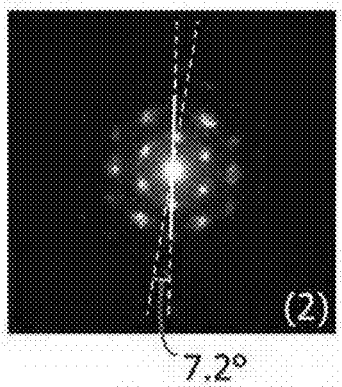
Figure 6D:
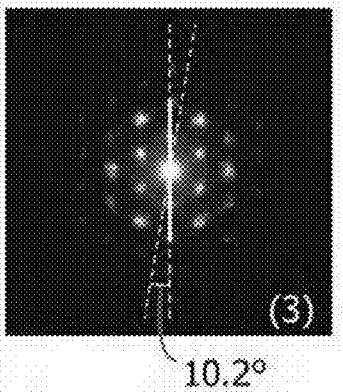

Next, to find how crystal regions are connected in a plane direction in the CAAC-OS, transmission electron diffraction patterns in regions (1), (2), and (3) of a high-resolution plan-view TEM image in FIG. 6A are obtained and shown in FIGS. 6B, 6C, and 6D, respectively. Note that an electron beam with a probe diameter of 1 nm is used to measure the transmission electron diffraction patterns. Note that electron diffraction using an electron beam having a probe diameter of smaller than or equal to 50 nm is also referred to as nanobeam electron diffraction.

From the transmission electron diffraction patterns, it is found that the CAAC-OS has a crystal lattice with six-fold symmetry. Thus, it is also confirmed from the transmission electron diffraction patterns in the regions of the high-resolution plan-view TEM image that the CAAC-OS has c-axis alignment. Furthermore, it is confirmed that the CAAC-OS has extremely high crystallinity locally.

As in FIGS. 6A to 6D, when attention is focused on the transmission electron diffraction patterns in the regions (1), (2), and (3), the angle of the a-axis (indicated by a white solid line) gradually changes in each of the diffraction patterns. Specifically, when the angle of the a-axis in (1) is 0°, the angle of the a-axis in (2) is changed by 7.2° with respect to the c-axis. Similarly, when the angle of the a-axis in (1) is 0°, the angle of the a-axis in (3) is changed by 10.2° with respect to the c-axis. Thus, the CAAC-OS has a continuous structure in which different crystal regions are connected while maintaining c-axis alignment.

Figure 7A:
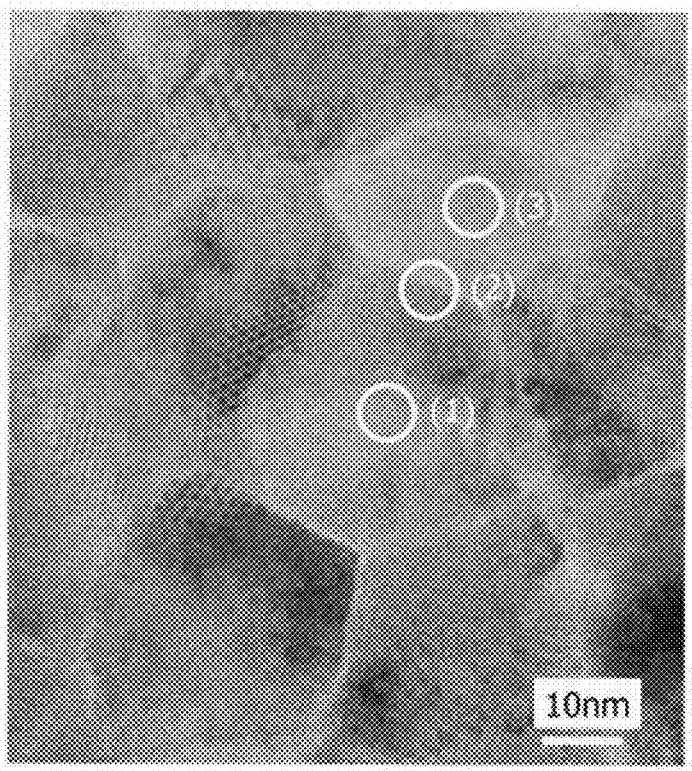
FIG. 7A is a high-resolution plan-view TEM image of a polycrystalline OS and FIGS. 7B to 7D are transmission electron diffraction patterns of regions in FIG. 7A.

Note that according to a plan-view TEM image of an In—Ga—Zn oxide film crystallized by a laser beam, a clear grain boundary can be seen as shown in FIG. 7A. Thus, the In—Ga—Zn oxide film crystallized by a laser beam is a polycrystalline oxide semiconductor (polycrystalline OS).

Figure 7B:
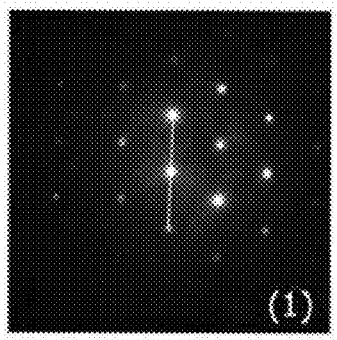
Figure 7C:
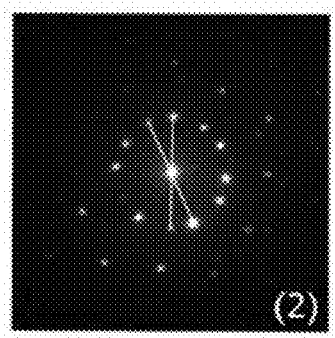
Figure 7D:
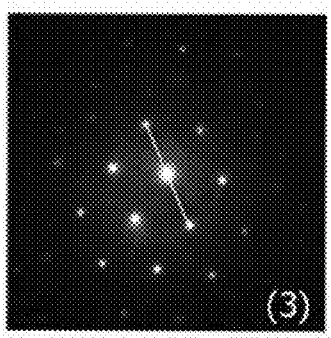

Next, to find how crystal regions are connected in a plane direction in the polycrystalline OS, transmission electron diffraction patterns in regions (1), (2), and (3) of the plan-view TEM image in FIG. 7A are obtained and shown in FIGS. 7B, 7C, and 7D, respectively. Note that an electron beam with a probe diameter of 1 nm is used to measure the transmission electron diffraction patterns.

As in FIGS. 7A to 7D, when attention is focused on the transmission electron diffraction patterns in the regions (1), (2), and (3), the region (2) has a diffraction pattern in which the diffraction patterns in the regions (1) and (3) overlap with each other. Accordingly, the grain boundary in the polycrystalline OS can be confirmed from the electron diffraction patterns.

Figure 8A:
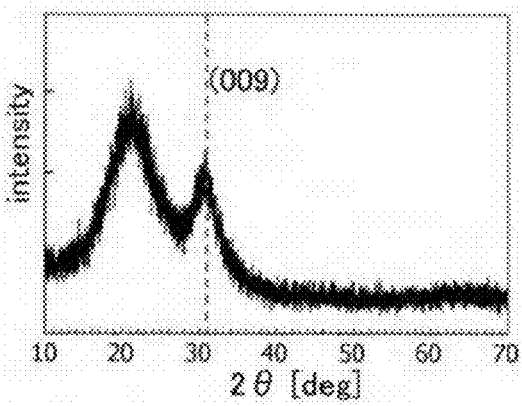
FIGS. 8A to 8C show analysis results of a CAAC-OS by an X-ray diffraction apparatus.

A CAAC-OS is subjected to structural analysis with an X-ray diffraction (XRD) apparatus. For example, when the CAAC-OS including an $InGaZnO_4$ crystal is analyzed by an out-of-plane method, a peak appears when the diffraction angle ($2\theta$) is around 31° (see FIG. 8A). Since this peak is derived from the (009) plane of the $InGaZnO_4$ crystal, it can also be confirmed from the structural analysis using XRD that crystals in the CAAC-OS have c-axis alignment and that the c-axes are aligned in a direction substantially perpendicular to the formation surface or the top surface of the CAAC-OS.

Figure 8B:
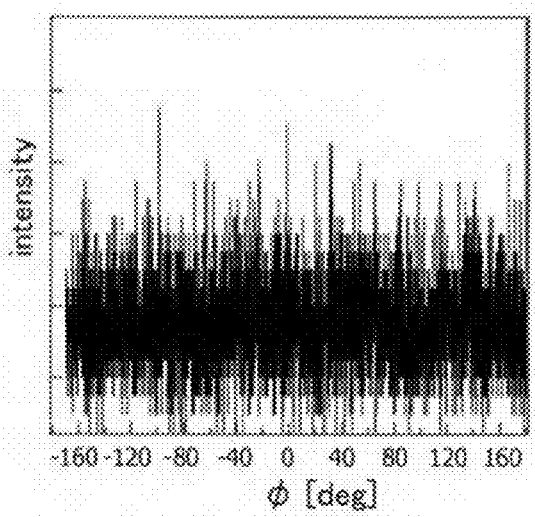
Figure 8C:
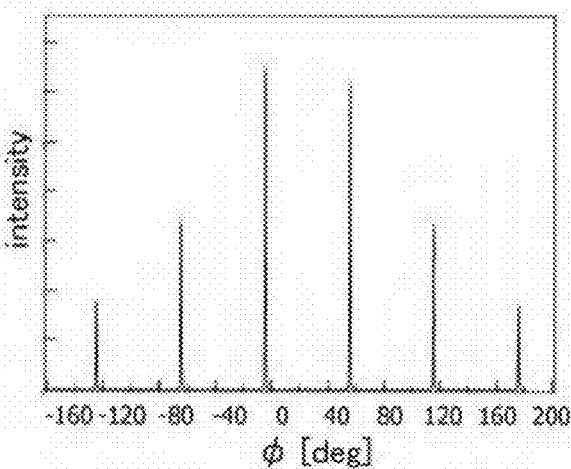

On the other hand, in analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), a peak is not clearly observed (see FIG. 8B). In contrast, in the case of a single crystal oxide semiconductor of InGaZnO$_4$, when φ scan is performed with 2θ fixed at around 56°, six peaks which are derived from crystal planes equivalent to the (110) plane are observed (see FIG. 8C). Accordingly, the structural analysis using XRD shows that the directions of a-axes and b-axes are irregularly oriented in the CAAC-OS.

Figure 9:
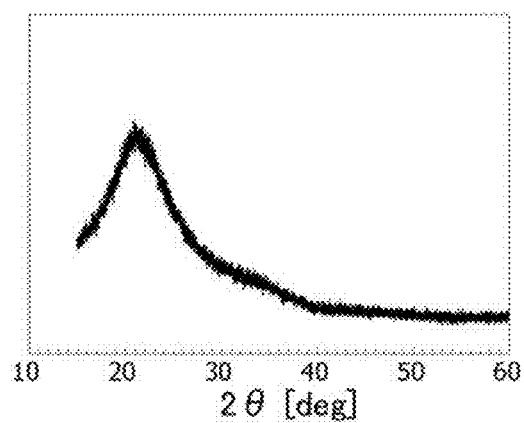
FIG. 9 shows analysis results of an nc-OS by an X-ray diffraction apparatus.

An oxide semiconductor including a nanocrystal (nc) with a size greater than or equal to 1 nm and less than or equal to 10 nm, or a size greater than or equal to 1 nm and less than or equal to 3 nm is referred to as a nanocrystalline oxide semiconductor (nc-OS). In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray beam having a diameter larger than the size of a crystal part, a peak which shows a crystal plane does not appear (see FIG. 9).

Figure 10A:
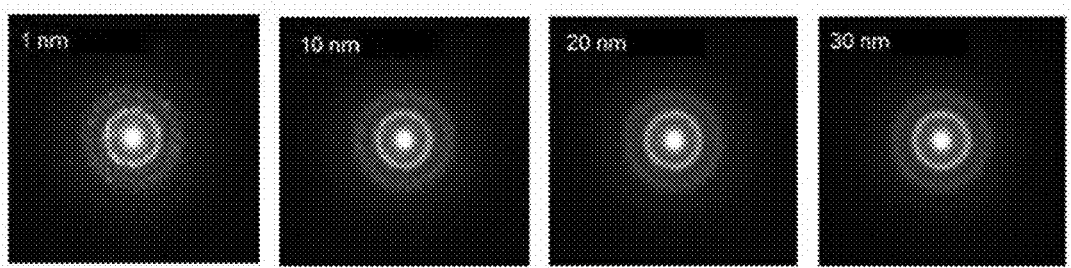
FIGS. 10A and 10B show electron diffraction patterns of an nc-OS.
Figure 10B:
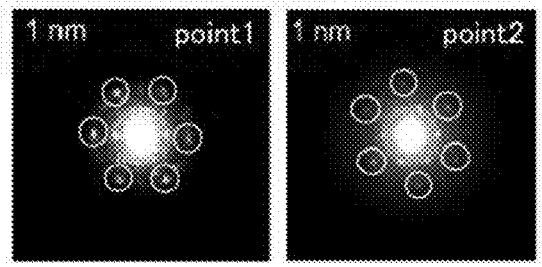

Furthermore, a halo pattern is shown in an electron diffraction pattern (also referred to as a selected-area electron diffraction pattern) of the nc-OS obtained by using an electron beam having a probe diameter (e.g., larger than or equal to 50 nm) larger than the diameter of a crystal part. Meanwhile, spots are shown in a nanobeam electron diffraction pattern of the nc-OS obtained by using an electron beam having a probe diameter close to, or smaller than the diameter of a crystal part. For example, as shown in FIG. 10A, in a nanobeam electron diffraction pattern of the nc-OS with a thickness of approximately 50 nm with a probe diameter of 30 nm, 20 nm, 10 nm, or 1 nm, regions with high luminance in a circular (ring) pattern are shown. Furthermore, when the probe diameter is decreased, the regions in a ring pattern are formed of a plurality of spots.

shown in FIG. 10B, transmission electron diffraction patterns having spots indicating crystallinity were obtained. FIG. 10B shows that, in the nc-OS, a diffraction pattern exhibiting crystallinity is obtained, but orientation along a crystal plane in a particular direction is not observed.

Accordingly, there is a high possibility that nanocrystals in the nc-OS are the pellets shown in the CAAC-OS.

Here, in the CAAC-OS and the nc-OS, Cs-corrected high-resolution cross-sectional TEM images are analyzed in more detail to examine the crystal orientation.

FIG. 11A show Cs-corrected high-resolution cross-sectional TEM images of the CAAC-OS. FIG. 11B show Cs-corrected high-resolution cross-sectional TEM images of the nc-OS. Note that the same portion is observed in the left diagram and the right diagram. In the right diagram, a pellet is denoted by an auxiliary line.

Figure 12A:
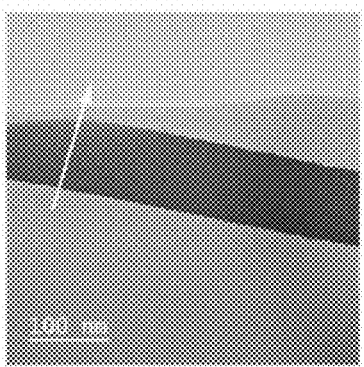
FIGS. 12A and 12B are Cs-corrected high-resolution cross-sectional TEM images of a CAAC-OS.
Figure 12B:
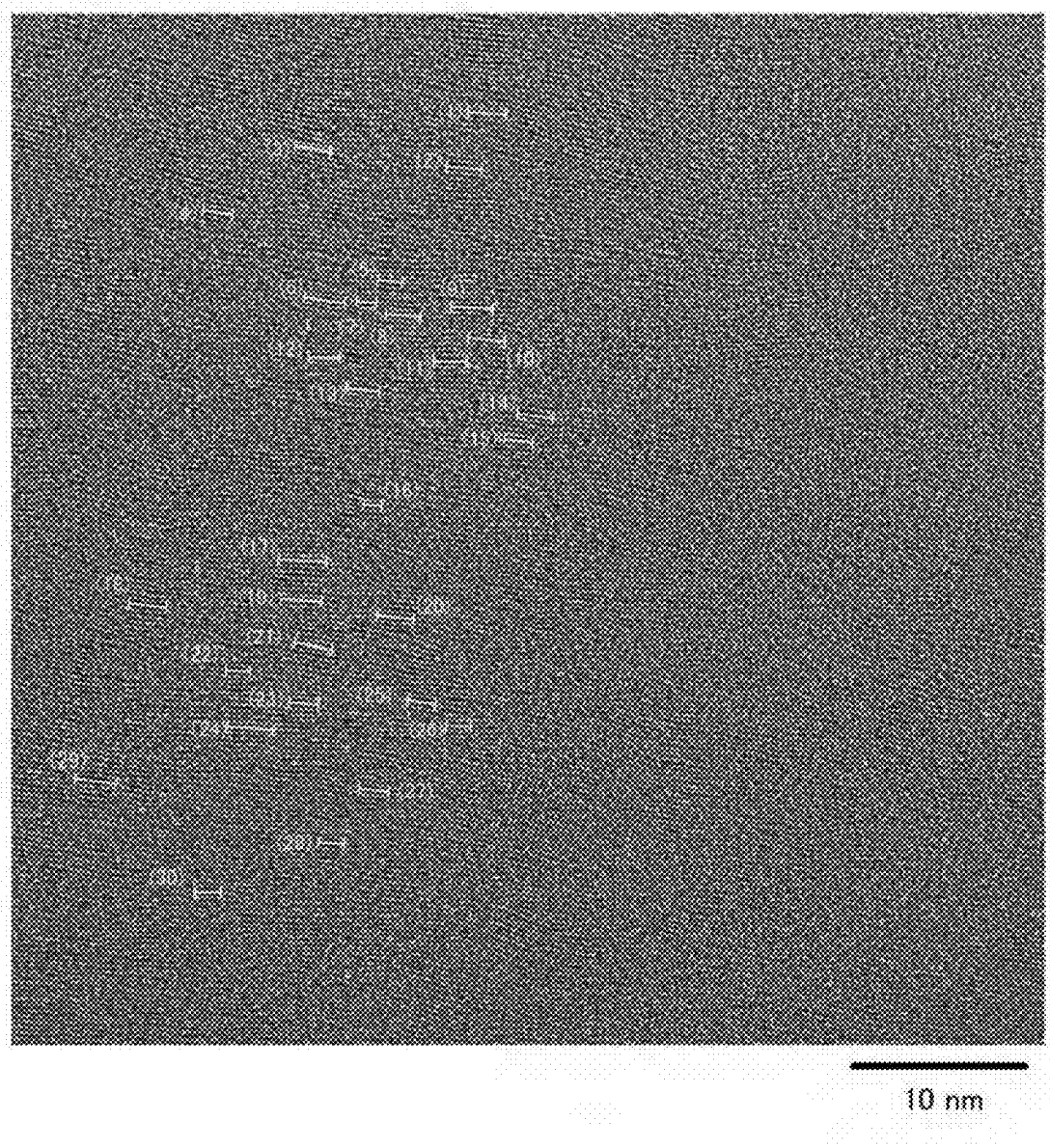
Figure 16A:
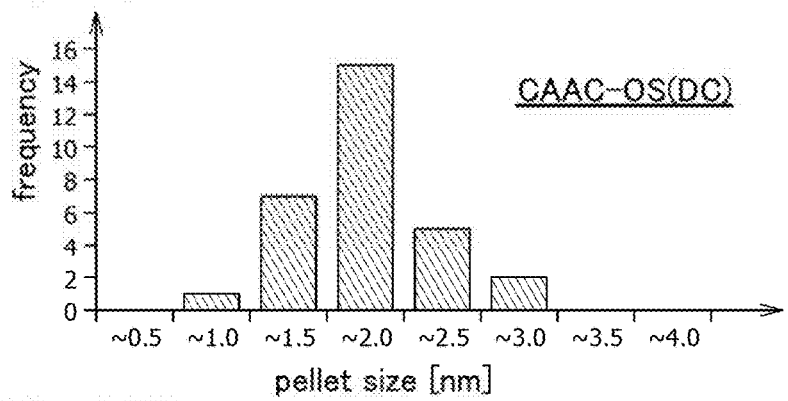
FIGS. 16A to 16D show pellet sizes observed by Cs-corrected high-resolution cross-sectional TEM images of a CAAC-OS and an nc-OS and the frequencies thereof.

FIG. 12A is a cross-sectional TEM image of the CAAC-OS deposited by a DC sputtering method. FIG. 12B is a Cs-corrected high-resolution cross-sectional TEM image in which part of the TEM image in FIG. 12A is enlarged. In FIG. 12B, the number of pellets is counted and the size and direction thereof are shown in a frequency distribution (see FIG. 16A).

Figure 13A:
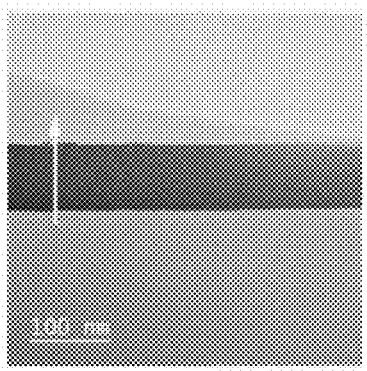
FIGS. 13A and 13B are Cs-corrected high-resolution cross-sectional TEM images of a CAAC-OS.
Figure 13B:
Figure 16B:
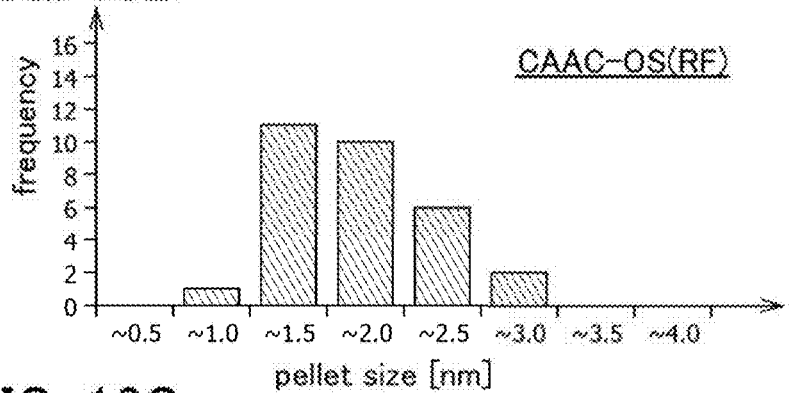

FIG. 13A is a cross-sectional TEM image of the CAAC-OS deposited by an RF sputtering method. FIG. 13B is a Cs-corrected high-resolution cross-sectional TEM image in which part of the TEM image in FIG. 13A is enlarged. In FIG. 13B, the number of pellets is counted and the size and direction thereof are shown in a frequency distribution (see FIG. 16B).

Figure 14A:
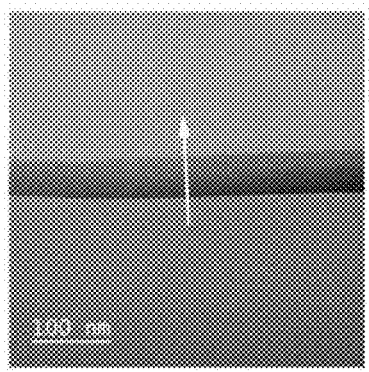
FIGS. 14A and 14B are Cs-corrected high-resolution cross-sectional TEM images of an nc-OS.
Figure 14B:
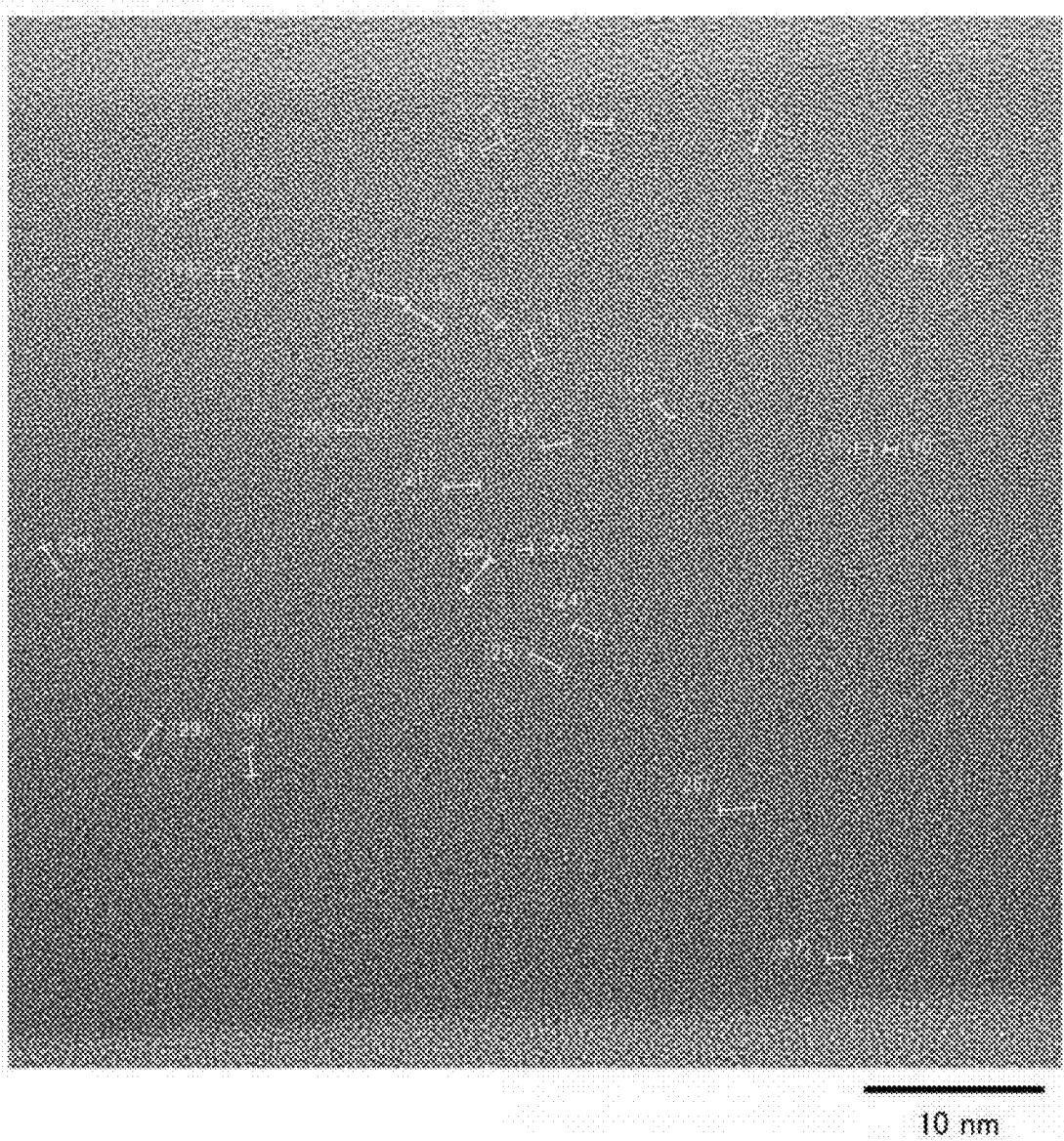
Figure 16C:
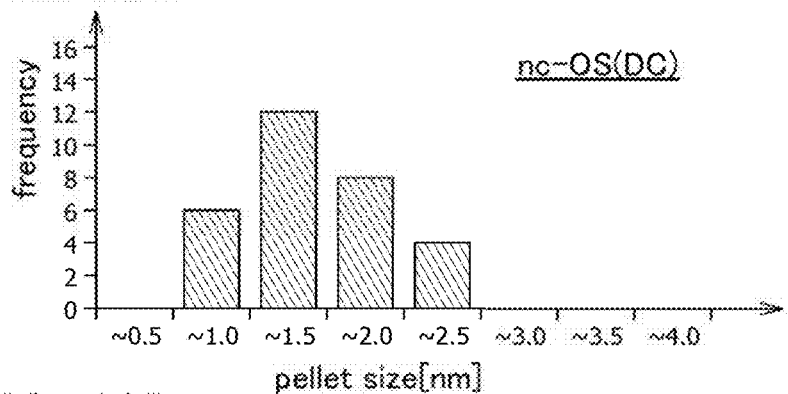

FIG. 14A is a cross-sectional TEM image of the nc-OS deposited by a DC sputtering method. FIG. 14B is a Cs-corrected high-resolution cross-sectional TEM image in which part of the TEM image in FIG. 14A is enlarged. In FIG. 14B, the number of pellets is counted and the size and direction thereof are shown in a frequency distribution (see FIG. 16C).

Figure 15A:
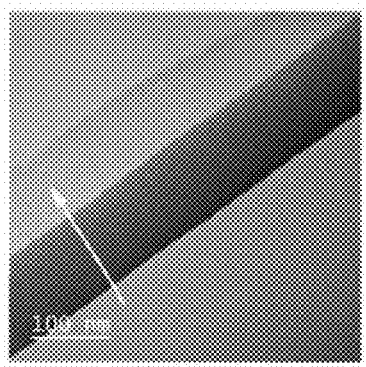
FIGS. 15A and 15B are Cs-corrected high-resolution cross-sectional TEM images of an nc-OS.
Figure 15B:
Figure 16D:
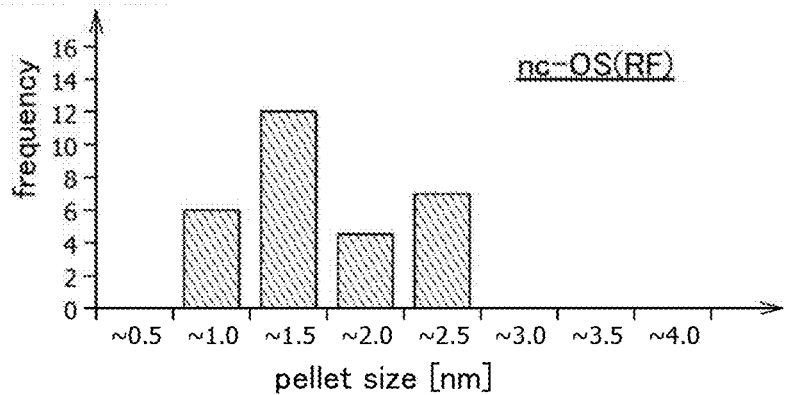

FIG. 15A is a cross-sectional TEM image of the nc-OS deposited by an RF sputtering method. FIG. 15B is a Cs-corrected high-resolution cross-sectional TEM image in which part of the TEM image in FIG. 15A is enlarged. In FIG. 15B, the number of pellets is counted and the size and direction thereof are shown in a frequency distribution (see FIG. 16D).

The results in FIGS. 16A to 16D are shown in the following table.

TABLE 1

| IGZO | | Pellet Size | | | | Pellet Direction [%] | | |
|---|---|---|---|---|---|---|---|---|
| | | Average Value [nm] | Standard Deviation σ [nm] | Maximum Value [nm] | Minimum Value [nm] | | | |
| | State | | | | | 0°-30° | 30°-60° | 60°-90° |
| DC | CAAC | 1.74 | 0.39 | 2.6 | 0.97 | 100 | 0 | 0 |
| RF | CAAC | 1.73 | 0.42 | 2.69 | 1 | 100 | 0 | 0 |
| | | ∨ | | | | ⋎ | ∧ | ∧ |
| DC | nc | 1.44 | 0.41 | 2.21 | 0.65 | 63 | 27 | 10 |
| RF | nc | 1.47 | 0.52 | 2.42 | 0.63 | 7 | 53 | 40 |

To analyze the structure in more detail, the nc-OS film was thinned to obtain a sample with a thickness of several nanometers (approximately 5 nm). Then, an electron beam with a probe diameter of 1 nm entered the sample to obtain transmission electron diffraction patterns. As a result, as Each pellet of the CAAC-OS tends to be larger than that of the nc-OS. There is little difference in the sizes of the pellets between the case where a DC sputtering method is employed and the case where an RF sputtering method is employed. Meanwhile, the direction of the pellet in the nc-OS is more perpendicular to a sample surface in the RF sputtering method than that in the DC sputtering method.

Figure 17:
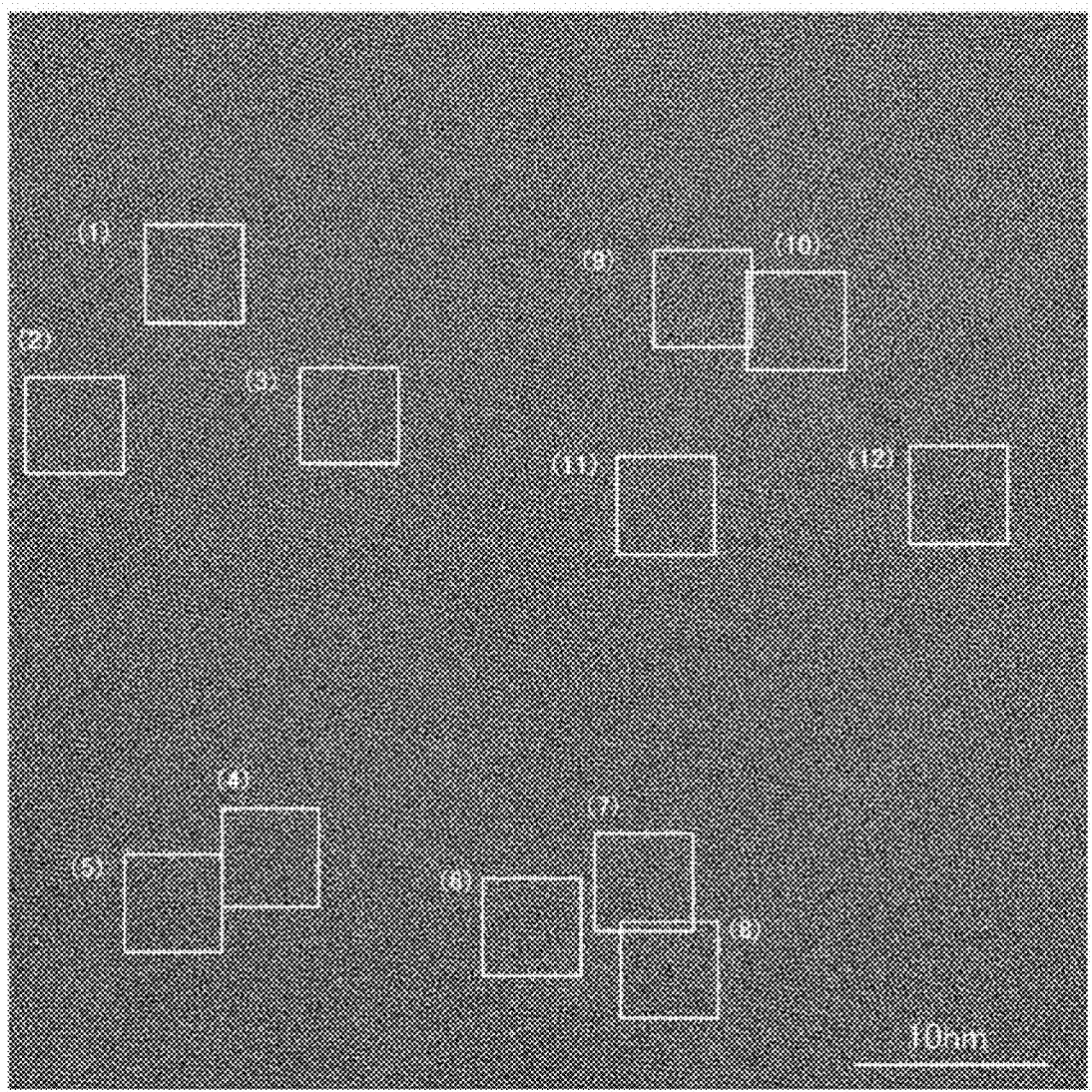
FIG. 17 is a Cs-corrected high-resolution plan-view TEM image of a CAAC-OS.
Figure 18:
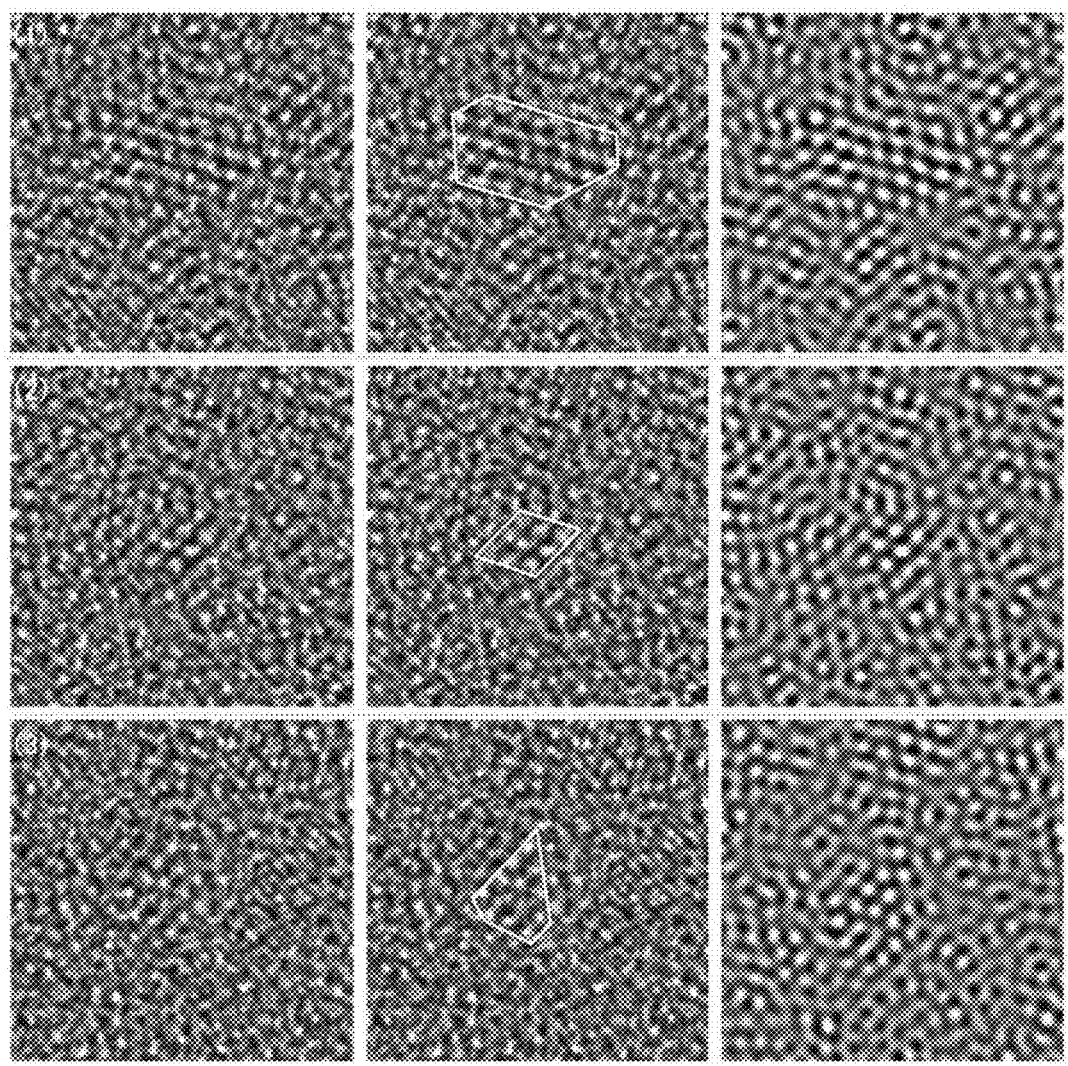
FIG. 18 shows Cs-corrected high-resolution plan-view TEM images of a CAAC-OS and inverse Fourier transform images thereof.
Figure 19:
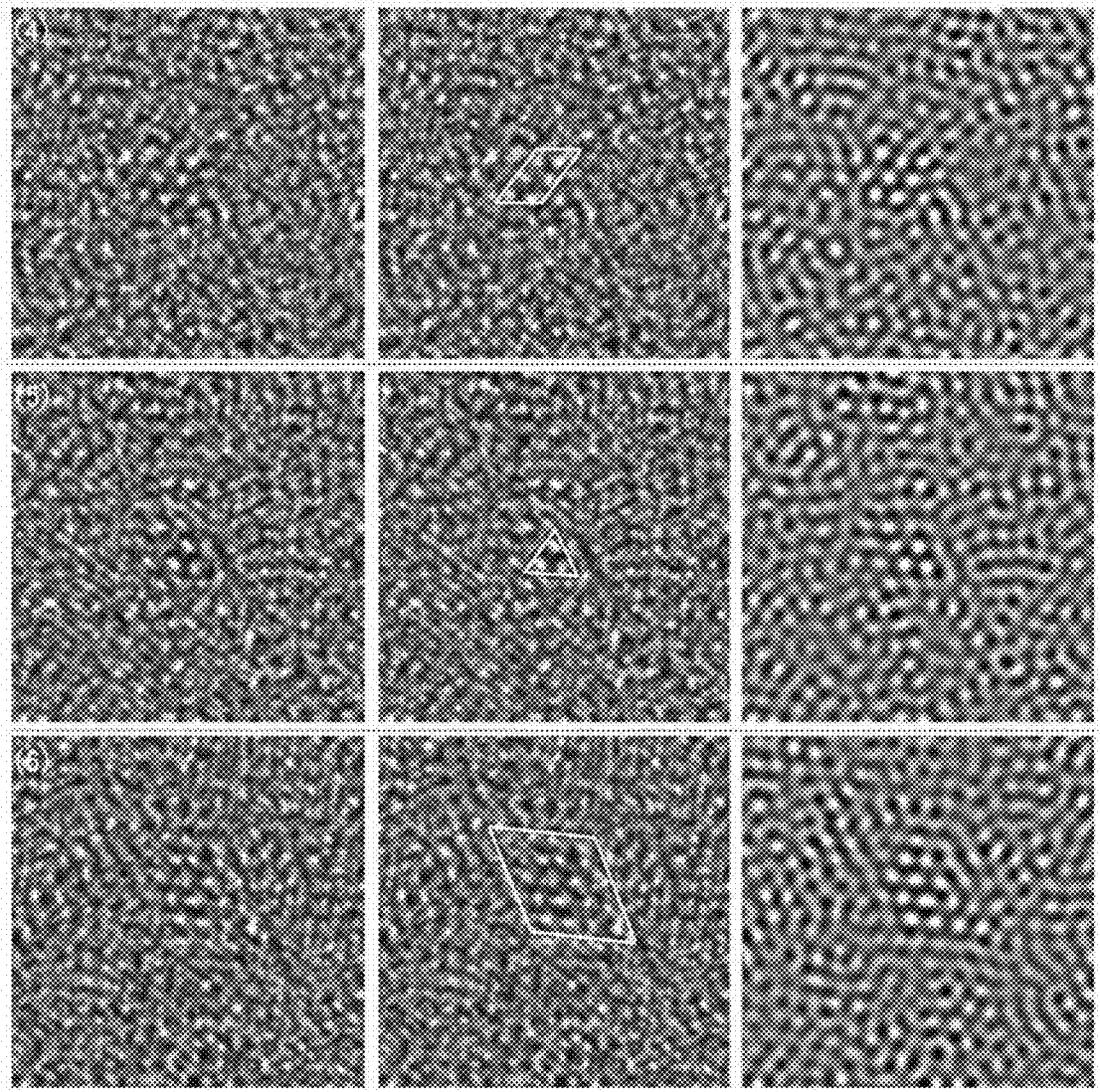
FIG. 19 shows Cs-corrected high-resolution plan-view TEM images of a CAAC-OS and inverse Fourier transform images thereof.
Figure 20:
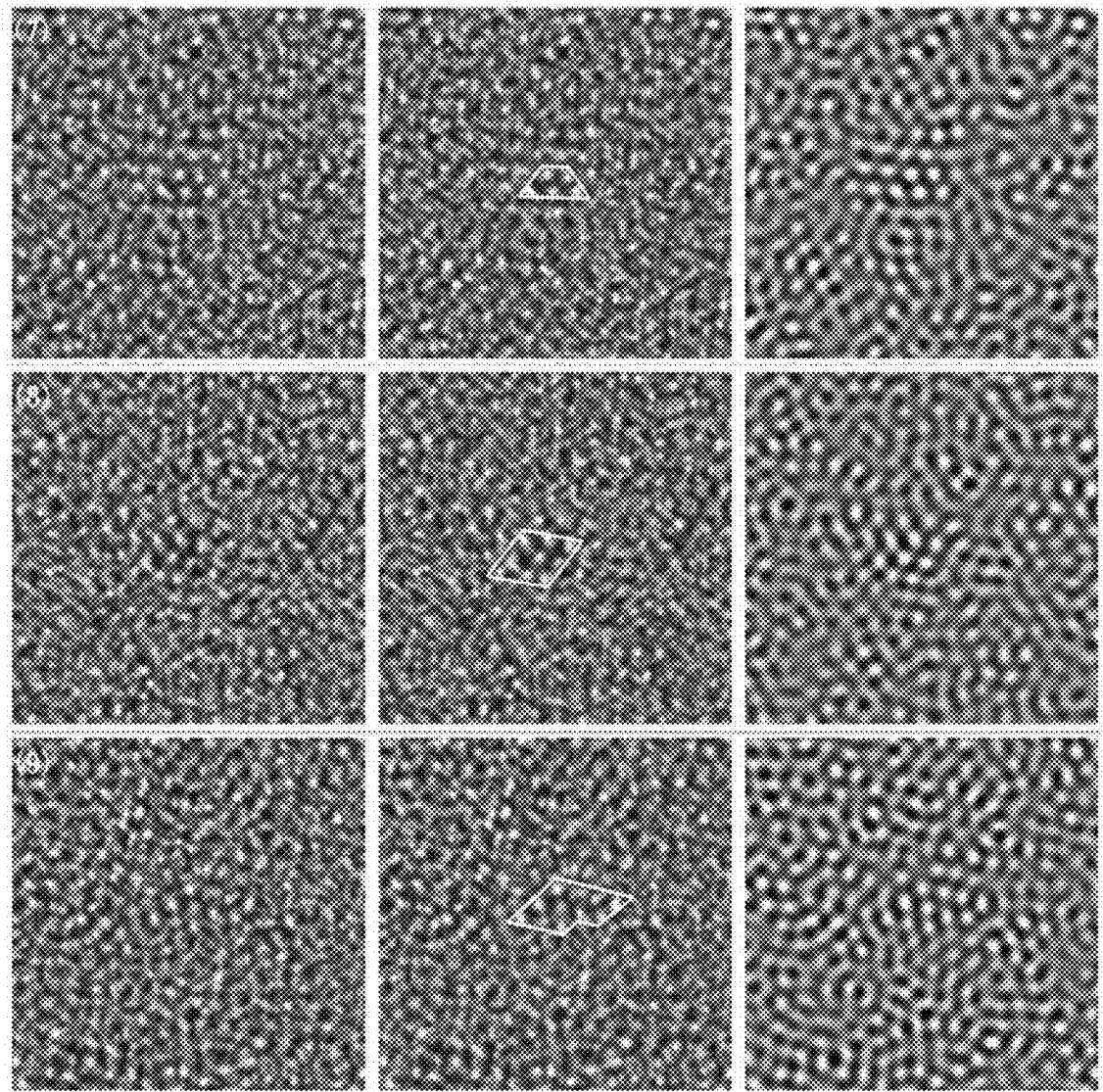
FIG. 20 shows Cs-corrected high-resolution plan-view TEM images of a CAAC-OS and inverse Fourier transform images thereof.
Figure 21:
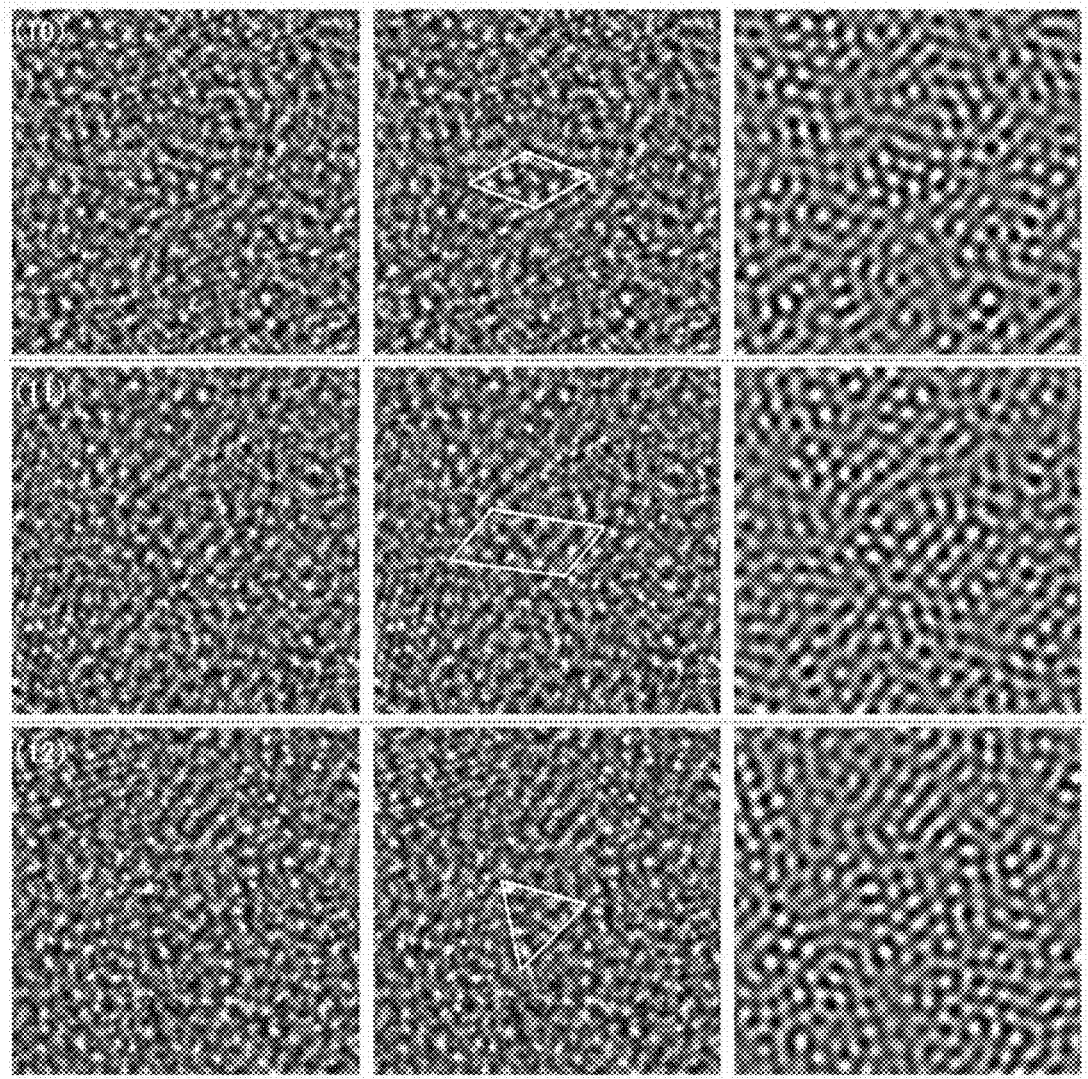
FIG. 21 shows Cs-corrected high-resolution plan-view TEM images of a CAAC-OS and inverse Fourier transform images thereof.

Next, the shapes of pellets in regions of a Cs-corrected high-resolution plan-view TEM image of the CAAC-OS in FIG. 17 are evaluated.

The results are shown in FIG. 18, FIG. 19, FIG. 20, and FIG. 21. The left diagrams in FIGS. 18 to 21 are enlarged uncorrected diagrams. The middle diagrams in FIGS. 18 to 21 are enlarged diagrams in which pellets are denoted by auxiliary lines. The right diagrams in FIGS. 18 to 21 are enlarged diagrams obtained in such a manner that the left diagrams are Fourier-transformed, subjected to mask processing so that periodic components remain, and then inversely Fourier-transformed.

FIG. 18, FIG. 19, FIG. 20, and FIG. 21 indicate that the flat planes of the pellets have triangle shapes, quadrangular shapes (e.g., parallelograms, trapezoids, or diamonds), pentagonal shapes, hexagonal shapes, or the like.

Therefore, when the CAAC-OS and the nc-OS are analyzed in detail, it is difficult to make the description of the CAAC-OS and the nc-OS using a deposition model such that "a minute grain or extremely minute grain generated by sputtering a target with argon or the like is randomly stacked over a substrate where a film is formed as an amorphous structure or an amorphous-like structure".

<Deposition Model>

Examples of deposition models of a CAAC-OS and an nc-OS are described below.

Figure 22:
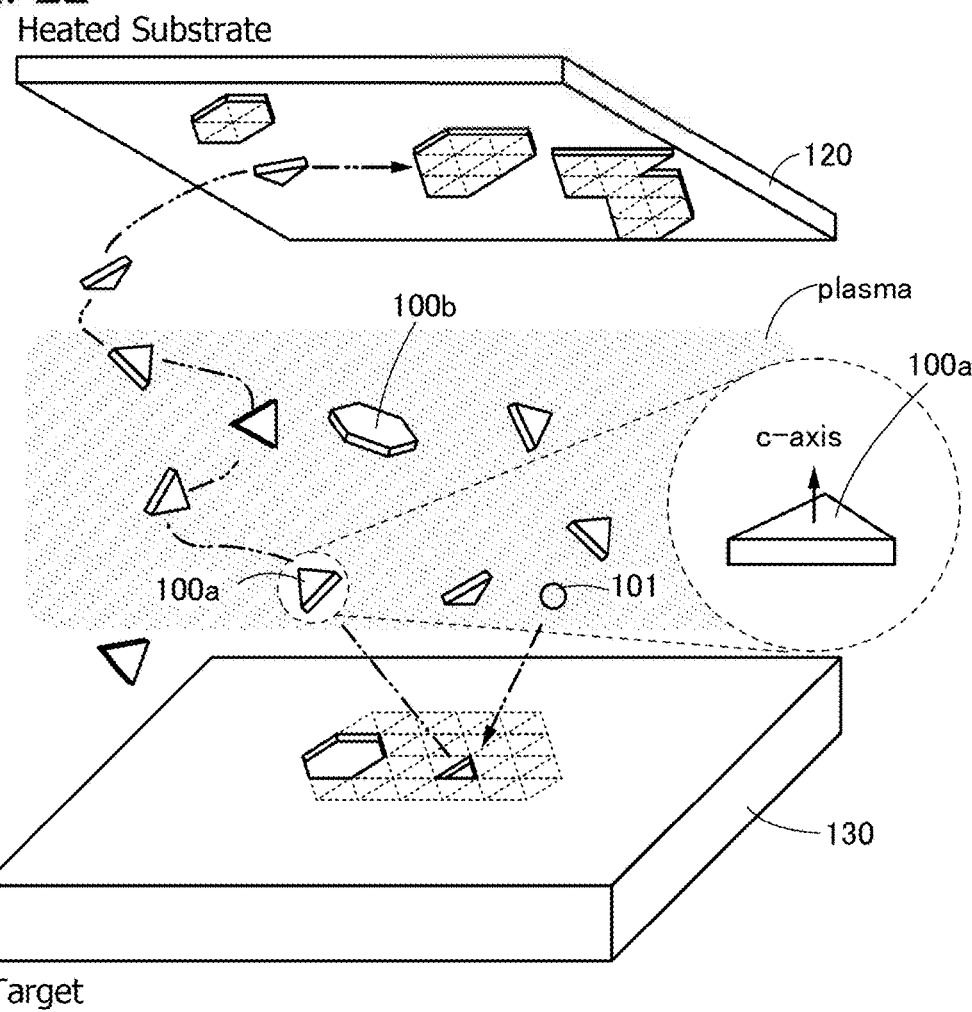
FIG. 22 is a schematic view showing a deposition model of a CAAC-OS and illustrates a pellet.

FIG. 22 is a schematic diagram of a deposition chamber illustrating a state where a CAAC-OS is deposited by a sputtering method.

A target 130 is attached to a backing plate. Under the target 130 and the backing plate, a plurality of magnets are placed. The plurality of magnets generate a magnetic field over the target 130. A sputtering method in which the disposition speed is increased by utilizing a magnetic field of magnets is referred to as a magnetron sputtering method.

The target 130 has a polycrystalline structure in which a cleavage plane exists in at least one crystal grain. Note that the details of the cleavage plane are described later.

The substrate 120 is placed to face the target 130, and the distance d (also referred to as a target-substrate distance (T–S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 130, and plasma is observed. Note that the magnetic field over the target 130 forms a high-density plasma region. In the high-density plasma region, the deposition gas is ionized, so that an ion 101 is generated. Examples of the ion 101 include an oxygen cation (O') and an argon cation ($Ar^+$).

The ion 101 is accelerated toward the target 130 side by an electric field, and collides with the target 130 eventually. At this time, a pellet 100a and a pellet 100b which are flat-plate-like or pellet-like sputtered particles are separated and sputtered from the cleavage plane. Note that structures of the pellet 100a and the pellet 100b may be distorted by an impact of collision of the ion 101.

The pellet 100a is a flat-plate-like or pellet-like sputtered particle having a triangle plane, e.g., a regular triangle plane. The pellet 100b is a flat-plate-like or pellet-like sputtered particle having a hexagon plane, e.g., a regular hexagon plane. Note that a flat-plate-like or pellet-like sputtered particle such as the pellet 100a and the pellet 100b is collectively called a pellet 100. The shape of a flat plane of the pellet 100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 100 is determined depending on the kind of deposition gas and the like. The thicknesses of the pellets 100 are preferably uniform; the reasons thereof are described later. In addition, the sputtered particle preferably has a pellet shape with a small thickness as compared to a dice shape with a large thickness.

Figure 25A:
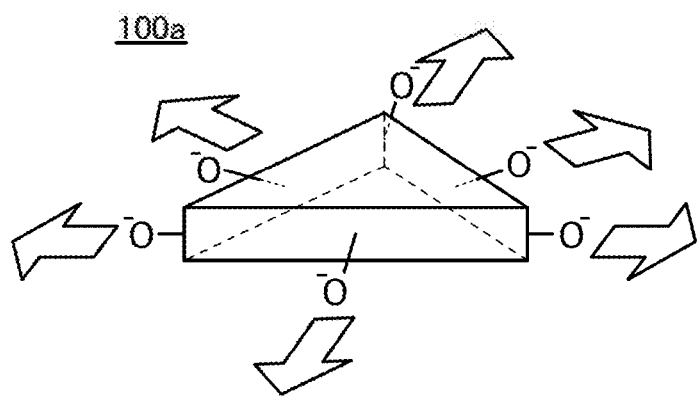
FIGS. 25A to 25C illustrate a pellet.
Figure 25B:
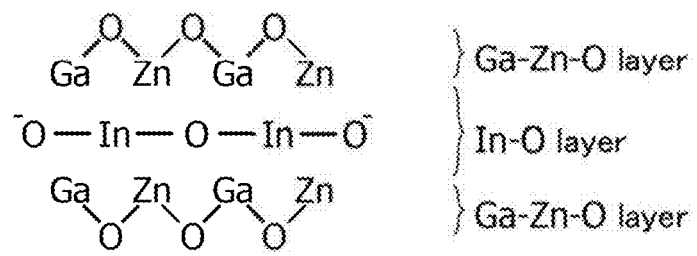
Figure 25C:
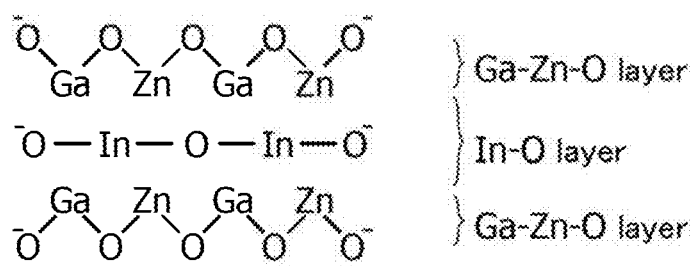

The pellet 100 receives a charge when passing through the plasma, so that side surfaces thereof are negatively or positively charged in some cases. The pellet 100 includes oxygen atoms on its side surfaces, and the oxygen atoms may be negatively charged. For example, a case in which the pellet 100a includes, on side surfaces, oxygen atoms that are negatively charged is illustrated in FIG. 25A. As in this view, when the side surfaces are charged in the same polarity, charges repel each other, and accordingly, the pellet 100a can maintain a flat-plate shape. In the case where a CAAC-OS is an In—Ga—Zn oxide, there is a possibility that an oxygen atom bonded to an indium atom is negatively charged as illustrated in FIG. 25B. There is another possibility that an oxygen atom bonded to an indium atom, a gallium atom, or a zinc atom is negatively charged as illustrated in FIG. 25C.

Figure 26:
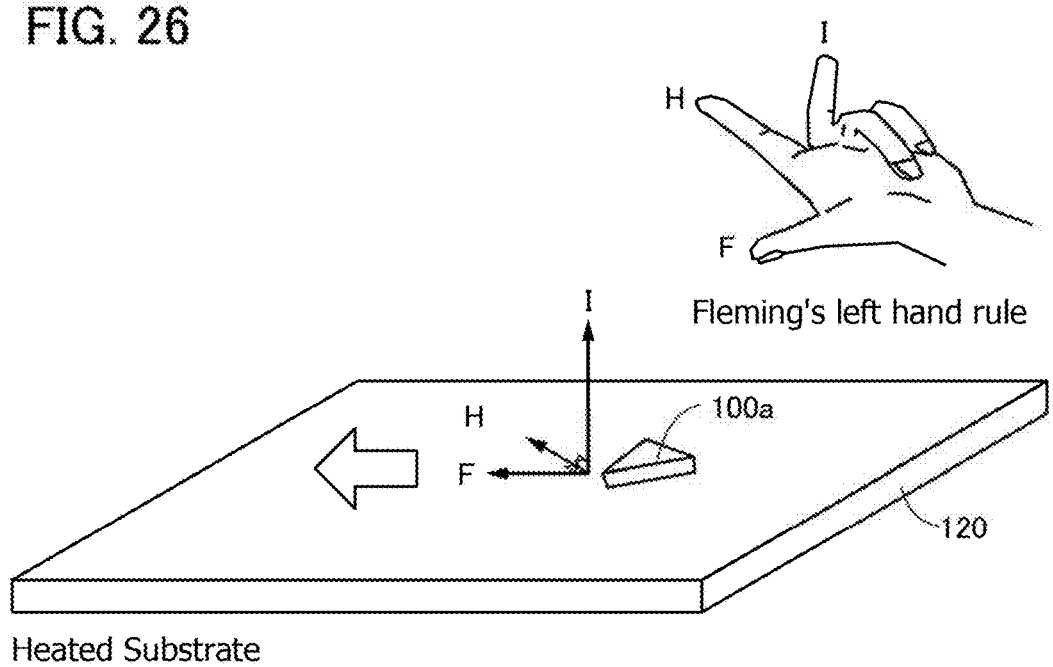
FIG. 26 illustrates force applied to a pellet on a formation surface.

As illustrated in FIG. 22, the pellet 100 flies like a kite in plasma and flutters up to the substrate 120, for example. Since the pellets 100 are charged, when the pellet 100 gets close to a region where another pellet 100 has already been deposited, repulsion is generated. Here, above the substrate 120, a magnetic field is generated in a direction parallel to a top surface of the substrate 120. A potential difference is given between the substrate 120 and the target 130, and accordingly, current flows from the substrate 120 toward the target 130. Thus, the pellet 100 is given a force (Lorentz force) on a surface of the substrate 120 by an effect of the magnetic field and the current (see FIG. 26). This is explainable with Fleming's left-hand rule. In order to increase a force applied to the pellet 100, it is preferable to provide, on the top surface, a region where the magnetic field in a direction parallel to the top surface of the substrate 120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 120 is 1.5 times or higher, preferably twice or higher, further preferably 3 times or higher, still further preferably 5 times or higher as high as the magnetic field in a direction perpendicular to the top surface of the substrate 120.

Figure 27A:
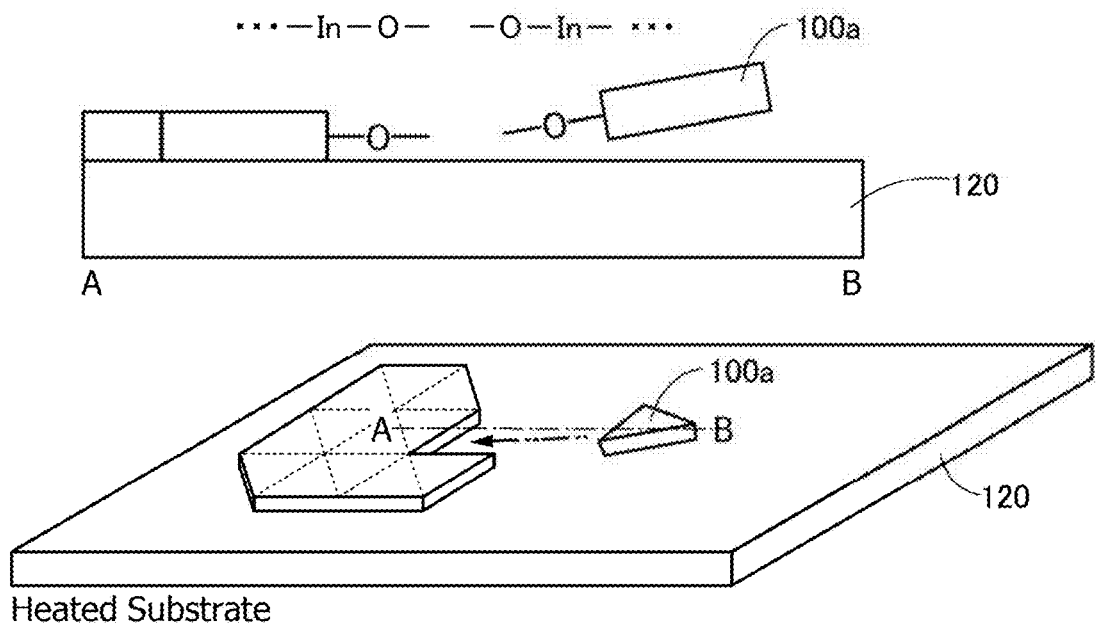
FIGS. 27A and 27B illustrate movement of a pellet on a formation surface.
Figure 27B:
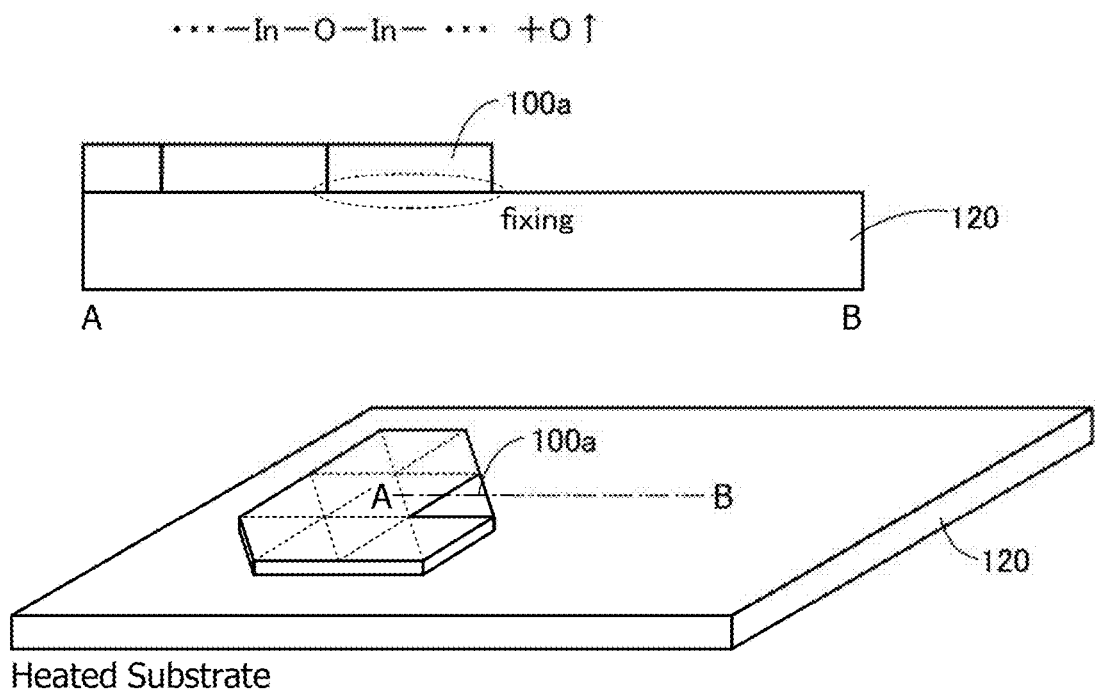

Furthermore, the substrate 120 is heated, and resistance such as friction between the pellet 100 and the substrate 120 is low. As a result, as illustrated in FIG. 27A, the pellet 100 glides above the surface of the substrate 120. The glide of the pellet 100 is caused in a state where the flat plane faces the substrate 120. Then, as illustrated in FIG. 27B, when the pellet 100 reaches the side surface of another pellet 100 that has been already deposited, the side surfaces of the pellets 100 are bonded. At this time, the oxygen atom on the side surface of the pellet 100 is released. With the released oxygen atom, oxygen vacancies in a CAAC-OS are filled in some cases; thus, the CAAC-OS has a low density of defect states.

Furthermore, the pellet 100 is heated over the substrate 120, whereby atoms are rearranged, and the structure distortion caused by the collision of the ion 101 can be reduced. The pellet 100 whose structure distortion is reduced is substantially a single crystal. Even when the pellets 100 are heated after being bonded, expansion and contraction of the pellet 100 itself hardly occur, which is caused by turning the pellet 100 to be substantially a single crystal. Thus, formation of defects such as a grain boundary due to expansion of a space between the pellets 100 can be prevented, and accordingly, generation of crevasses can be prevented. Furthermore, the space is filled with elastic metal atoms and the like, whereby the elastic metal atoms and the like connect the pellets 100 which are not aligned with each other as a highway.

It is considered that as shown in such a model, the pellets 100 are deposited over the substrate 120. Thus, a CAAC-OS can be deposited even when a surface over which a film is formed (film formation surface) does not have a crystal structure, which is different from film deposition by epitaxial growth. For example, even when a top surface (film formation surface) of the substrate 120 has an amorphous structure, a CAAC-OS can be formed.

Furthermore, it is found that in formation of the CAAC-OS, the pellets 100 are arranged in accordance with a shape of the top surface of the substrate 120 that is the film formation surface even when the film formation surface has unevenness. For example, in the case where the top surface of the substrate 120 is flat at the atomic level, the pellets 100 are arranged so that flat planes parallel to the a-b plane face downwards; thus, a layer with a uniform thickness, flatness, and high crystallinity is formed. By stacking n layers (n is a natural number), the CAAC-OS can be obtained.

In the case where the top surface of the substrate 120 has unevenness, a CAAC-OS in which n layers (n is a natural number) in each of which the pellets 100 are arranged along the convex surface are stacked is formed. Since the substrate 120 has unevenness, a gap is easily generated between the pellets 100 in the CAAC-OS in some cases. Note that owing to intermolecular force, the pellets 100 are arranged so that a gap between the pellets is as small as possible even over the unevenness surface. Therefore, even when the film formation surface has unevenness, a CAAC-OS with high crystallinity can be formed.

Accordingly, a CAAC-OS does not need laser crystallization, and deposition can be uniformly performed even in the case of a large-sized glass substrate.

Since the CAAC-OS is deposited according to such a model, the sputtered particles preferably have a pellet shape with a small thickness. Note that in the case where the sputtered particles have a dice shape with a large thickness, planes of the particles facing the substrate 120 are not the same and thus, the thickness and the orientation of the crystals cannot be uniform in some cases.

According to the above-described deposition model, a CAAC-OS having high crystallinity can be formed even over a formation surface having an amorphous structure.

Figure 23:
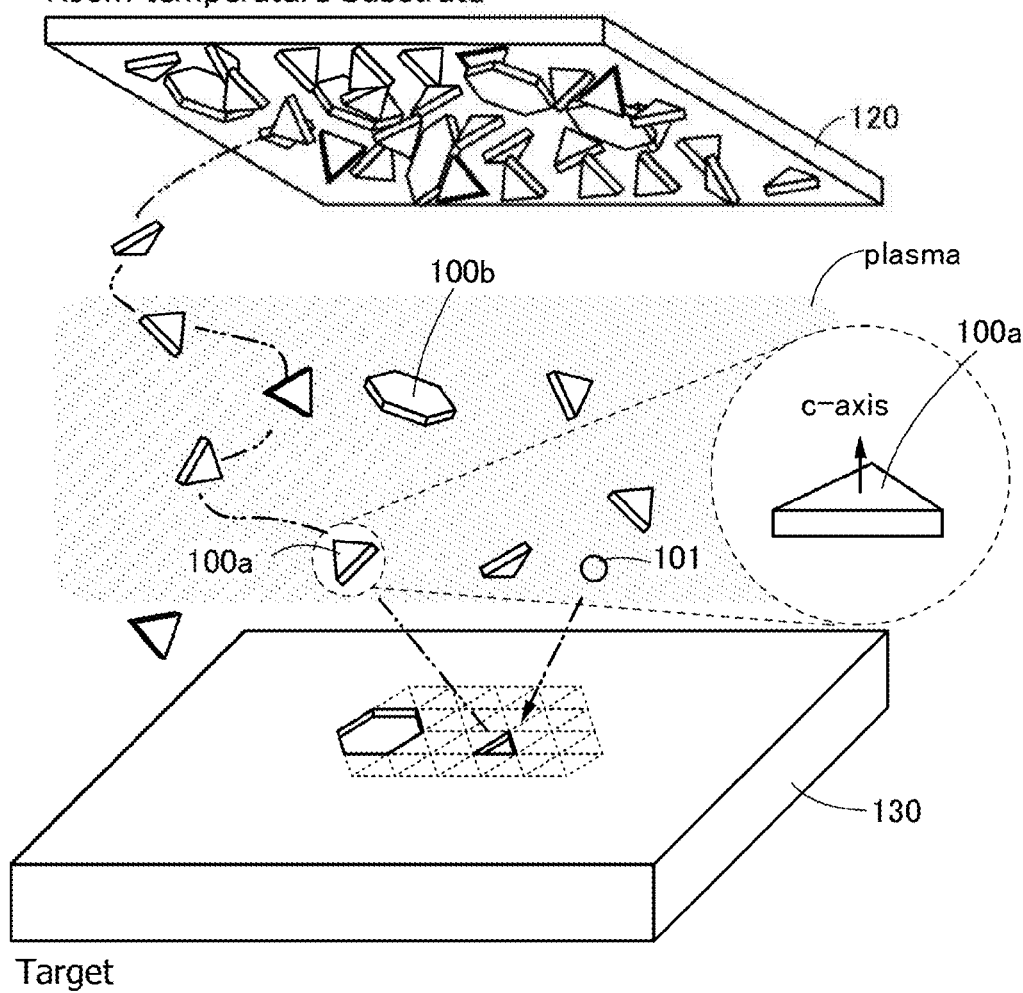
FIG. 23 is a schematic view showing a deposition model of an nc-OS and illustrates a pellet.

An nc-OS can be understood with a deposition model illustrated in FIG. 23. Note that a difference between FIG. 23 and FIG. 22 lies only in whether the substrate 120 is heated.

Thus, the substrate 120 is not heated, and resistance such as friction between the pellet 100 and the substrate 120 is high. As a result, the pellets 100 cannot glide on the surface of the substrate 120 and are stacked randomly, so that an nc-OS can be obtained.

Figure 24:
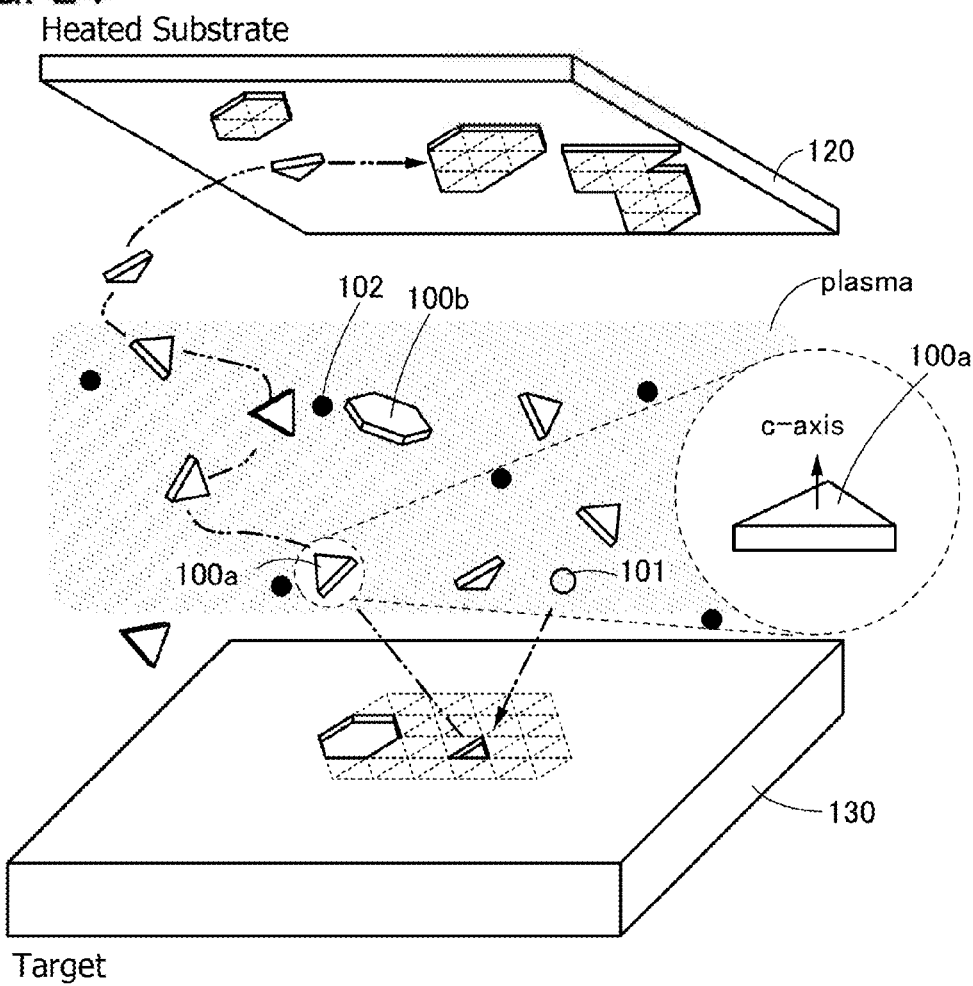
FIG. 24 is a schematic view showing a deposition model of a CAAC-OS and illustrates a pellet.

Furthermore, as illustrated in FIG. 24, formation of a CAAC-OS can be described with a deposition model including a zinc oxide particle 102 besides the pellet 100.

The zinc oxide particle 102 reaches the substrate 120 before the pellet 100 does because the zinc oxide particle 102 is smaller than the pellet 100 in mass. On the surface of the substrate 120, crystal growth of the zinc oxide particle 102 preferentially occurs in a horizontal direction, so that a thin zinc oxide layer is formed. The zinc oxide layer has c-axis alignment. Note that c-axes of crystals in the zinc oxide layer are aligned in a direction parallel to a normal vector of the substrate 120. The zinc oxide layer serves as a seed layer that makes a CAAC-OS grow and thus has a function of increasing crystallinity of the CAAC-OS. The thickness of the zinc oxide layer is 0.1 nm to 5 nm, mostly 1 nm to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

<Structural Analysis of CAAC-OS>

A CAAC-OS has a plurality of structures in some cases.

In the case where the CAAC-OS has a plurality of structures, the structures can be analyzed using nanobeam electron diffraction in some cases.

Figure 28A:
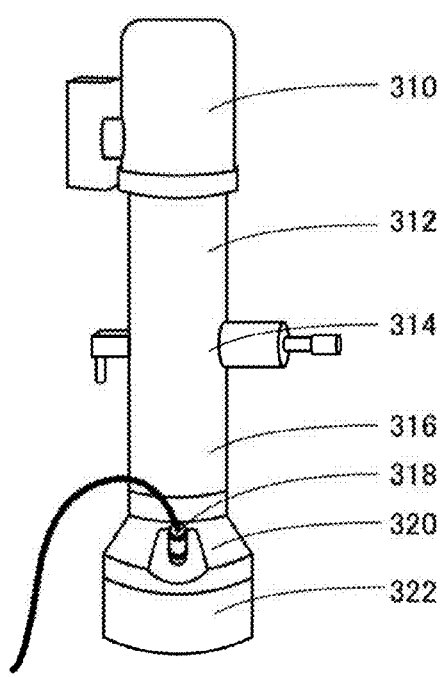
FIGS. 28A to 28C illustrate an example of a transmission electron diffraction measurement apparatus and an example of a structure analysis of an oxide semiconductor by transmission electron diffraction measurement.

FIG. 28A illustrates a transmission electron diffraction measurement apparatus which includes an electron gun chamber 310, an optical system 312 below the electron gun chamber 310, a sample chamber 314 below the optical system 312, an optical system 316 below the sample chamber 314, an observation chamber 320 below the optical system 316, a camera 318 installed in the observation chamber 320, and a film chamber 322 below the observation chamber 320. The camera 318 is provided to face toward the inside of the observation chamber 320. Note that the film chamber 322 is not necessarily provided.

Figure 28B:
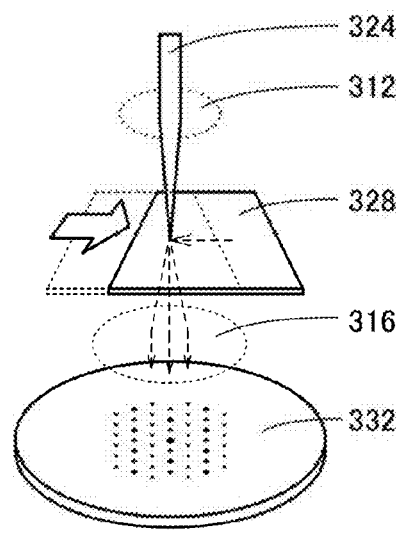

FIG. 28B illustrates an internal structure of the transmission electron diffraction measurement apparatus illustrated in FIG. 28A. In the transmission electron diffraction measurement apparatus, a substance 328 which is positioned in the sample chamber 314 is irradiated with electrons emitted from an electron gun installed in the electron gun chamber 310 through the optical system 312. Electrons passing through the substance 328 enter a fluorescent screen 332 provided in the observation chamber 320 through the optical system 316. On the fluorescent screen 332, a pattern corresponding to the intensity of the incident electron appears, which allows measurement of a transmission electron diffraction pattern.

The camera 318 is installed so as to face the fluorescent screen 332 and can take a picture of a pattern appearing in the fluorescent screen 332. An angle formed by a straight line which passes through the center of a lens of the camera 318 and the center of the fluorescent screen 332 and a straight line which is perpendicular to a top surface of the fluorescent screen 332 is, for example, 15° or more and 80° or less, 30° or more and 75° or less, or 45° or more and 70° or less. As the angle is reduced, distortion of the transmission electron diffraction pattern taken by the camera 318 becomes larger. Note that if the angle is obtained in advance, the distortion of an obtained transmission electron diffraction pattern can be corrected. Note that the film chamber 322 may be provided with the camera 318. For example, the camera 318 may be set in the film chamber 322 so as to be opposite to the incident direction of electrons 324. In this case, a transmission electron diffraction pattern with less distortion can be taken from the rear surface of the fluorescent screen 332.

A holder for fixing the substance 328 that is a sample is provided in the sample chamber 314. The holder transmits electrons passing through the substance 328. The holder may have, for example, a function of moving the substance 328 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 328.

Then, a method for measuring a transmission electron diffraction pattern of a substance by the transmission electron diffraction measurement apparatus described above is described.

For example, changes in the structure of a substance can be observed by changing the irradiation position of the electrons 324 that are a nanobeam in the substance (or by scanning) as illustrated in FIG. 28B. At this time, when the substance 328 is a CAAC-OS, a diffraction pattern such as one in FIG. 6B, FIG. 6C, or FIG. 6D is observed. When the substance 328 is an nc-OS, a diffraction pattern such as the leftmost one in FIG. 10A is observed.

Even when the substance 328 is a CAAC-OS, a diffraction pattern similar to that of an nc-OS or the like is partly observed in some cases. Therefore, whether or not a CAAC-OS is favorable can be determined by the proportion of a region where a diffraction pattern of a CAAC-OS is observed in a predetermined area (also referred to as proportion of CAAC). In the case of a high quality CAAC-OS, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS is observed is referred to as the proportion of non-CAAC.

For example, transmission electron diffraction patterns are obtained by scanning a top surface of a sample including a CAAC-OS deposited at the temperature of a substrate top surface of 170° C., 200° C., 220° C., or 250° C. Here, the proportion of CAAC is obtained in such a manner that diffraction patterns are observed by scanning for approximately 60 seconds at a rate of approximately 5 nm/second and the obtained diffraction patterns are converted into still images every 0.5 seconds. Note that as an electron beam, a nanometer-size electron beam with a probe diameter of 1 nm is used. Two samples were prepared for each condition, and the above measurement was performed on the samples.

Figure 28C:
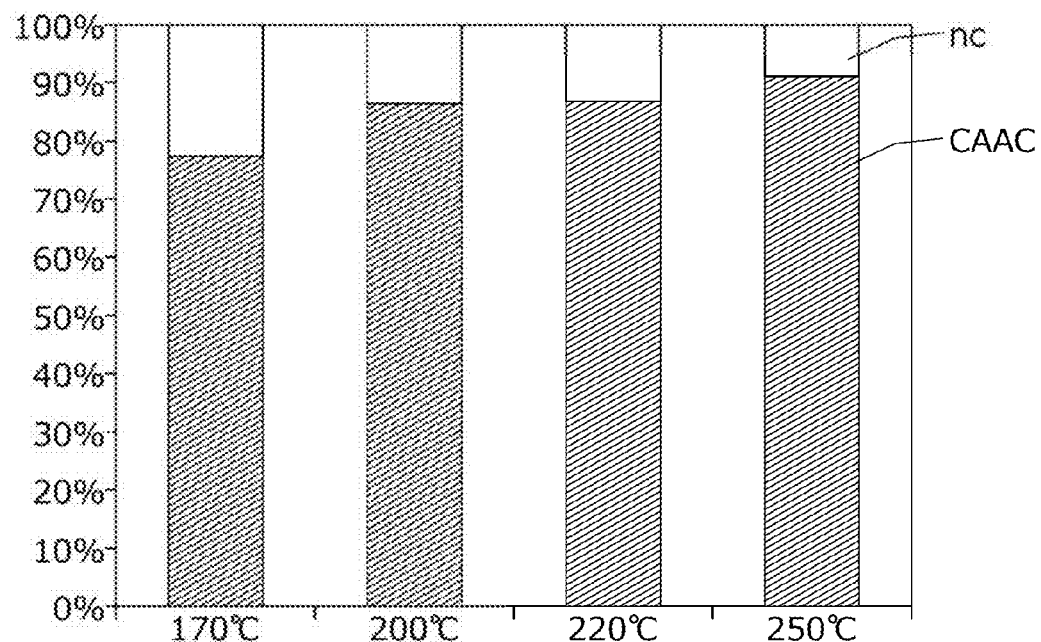

FIG. 28C shows the proportion of CAAC in each sample. The proportion of CAAC of the CAAC-OS deposited at the temperature of the substrate top surface of 170° C. is 77.4% (the proportion of nc is 22.6%). The proportion of CAAC of the CAAC-OS deposited at the temperature of the substrate top surface of 200° C. is 86.3% (the proportion of nc is 13.7%). The proportion of CAAC of the CAAC-OS deposited at the temperature of the substrate top surface of 220° C. is 86.7% (the proportion of nc is 13.3%). The proportion of CAAC of the CAAC-OS deposited at the temperature of the substrate top surface of 250° C. is 90.5% (the proportion of nc is 9.5%). That is, as the temperature of the substrate top surface is higher, the proportion of CAAC becomes higher. In other words, as the temperature of the substrate top surface is higher, the proportion of nc becomes lower. Also from this point, deposition models of the CAAC-OS and the nc-OS separately fabricated depending on the substrate temperature are reasonable.

With such a measurement method, the structure of an oxide semiconductor having a plurality of structures can be analyzed in some cases.

<Cleavage Plane>

A cleavage plane that has been mentioned in the deposition model of the CAAC-OS will be described below.

Figure 29A:
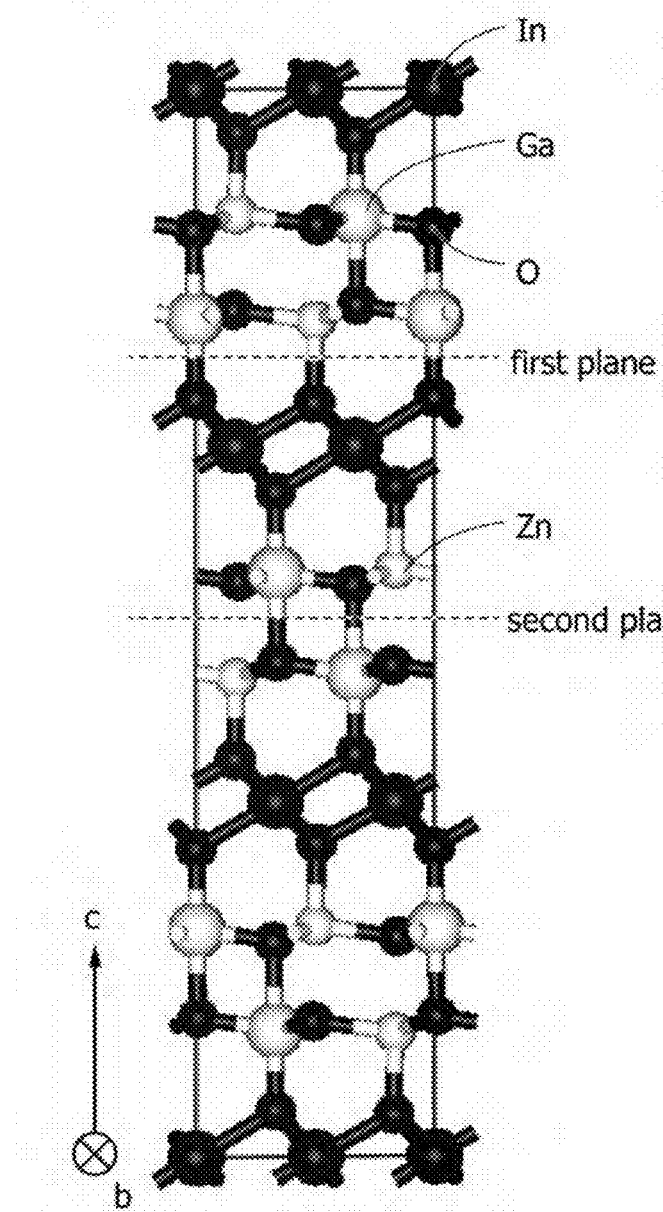
FIGS. 29A and 29B illustrate an InGaZnO$_4$ crystal.
Figure 29B:
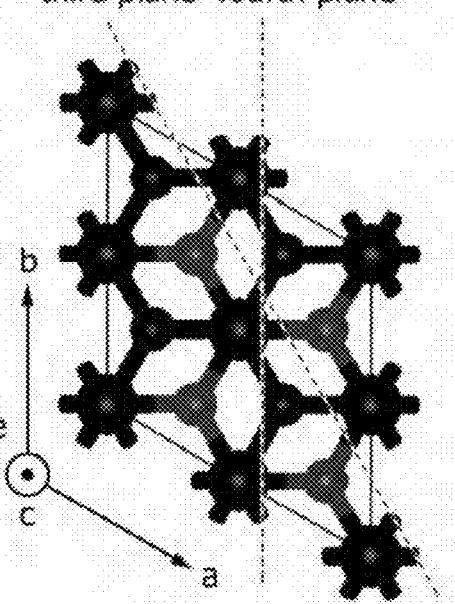

First, a cleavage plane of a target is described with reference to FIGS. 29A and 29B. FIGS. 29A and 29B show a structure of an $InGaZnO_4$ crystal. Note that FIG. 29A shows a structure in the case where the $InGaZnO_4$ crystal is observed from a direction parallel to the b-axis when the c-axis is in an upward direction. Furthermore, FIG. 29B shows a structure in the case where the $InGaZnO_4$ crystal is observed from a direction parallel to the c-axis.

Energy needed for cleavage at each of crystal planes of the $InGaZnO_4$ crystal is calculated by the first principles calculation. Note that a pseudopotential and density functional theory program (CASTEP) using the plane wave basis are used for the calculation. Note that an ultrasoft type pseudopotential is used as the pseudopotential. GGA/PBE was used as the functional. Cut-off energy is 400 eV.

Energy of a structure in an initial state is obtained after structural optimization including a cell size is performed. Furthermore, energy of a structure after the cleavage at each plane is obtained after structural optimization of atomic arrangement is performed in a state where the cell size is fixed.

On the basis of the structure of the $InGaZnO_4$ crystal shown in FIGS. 29A and 29B, a structure cleaved at any one of the first plane, the second plane, the third plane, and the fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 29A). The second plane is a crystal plane between a Ga—Zn—O layer and a Ga—Zn—O layer and is parallel to the (001) plane (or the a-b plane) (see FIG. 29A). The third plane is a crystal plane parallel to the (110) plane (see FIG. 29B). The fourth plane is a crystal plane parallel to the (100) plane (or the b-c plane) (see FIG. 29B).

Under the above conditions, the energy of the structure after the cleavage at each plane is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane was 2.60 $J/m^2$, that of the second plane was 0.68 $J/m^2$, that of the third plane was 2.18 $J/m^2$, and that of the fourth plane was 2.12 $J/m^2$ (see Table 2).

TABLE 2

| | Cleavage Energy [$J/m^2$] |
|---|---|
| First Plane | 2.60 |
| Second Plane | 0.68 |

TABLE 2-continued

| | Cleavage Energy [J/m$^2$] |
|---|---|
| Third Plane | 2.18 |
| Fourth Plane | 2.12 |

From the calculations, in the structure of the InGaZnO$_4$ crystal shown in FIGS. 29A and 29B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the second plane between a Ga—Zn—O layer and a Ga—Zn—O layer is the cleavage plane, the InGaZnO$_4$ crystals shown in FIG. 29A can be separated at two planes equivalent to the second plane. Therefore, in the case where an ion or the like is made to collide with a target, a wafer-like unit (we call this a pellet) which is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

Furthermore, the third plane (a crystal plane parallel to the (110) plane) and the fourth plane (a crystal plane parallel to the (100) plane (or the b-c plane)) have lower cleavage energy than the first plane (a crystal plane which is between a Ga—Zn—O layer and an In—O layer and is parallel to the (001) plane (or the a-b plane)); thus, the flat-plane shape of the pellet is thought to be likely a triangle or a hexagon.

Figure 30A:
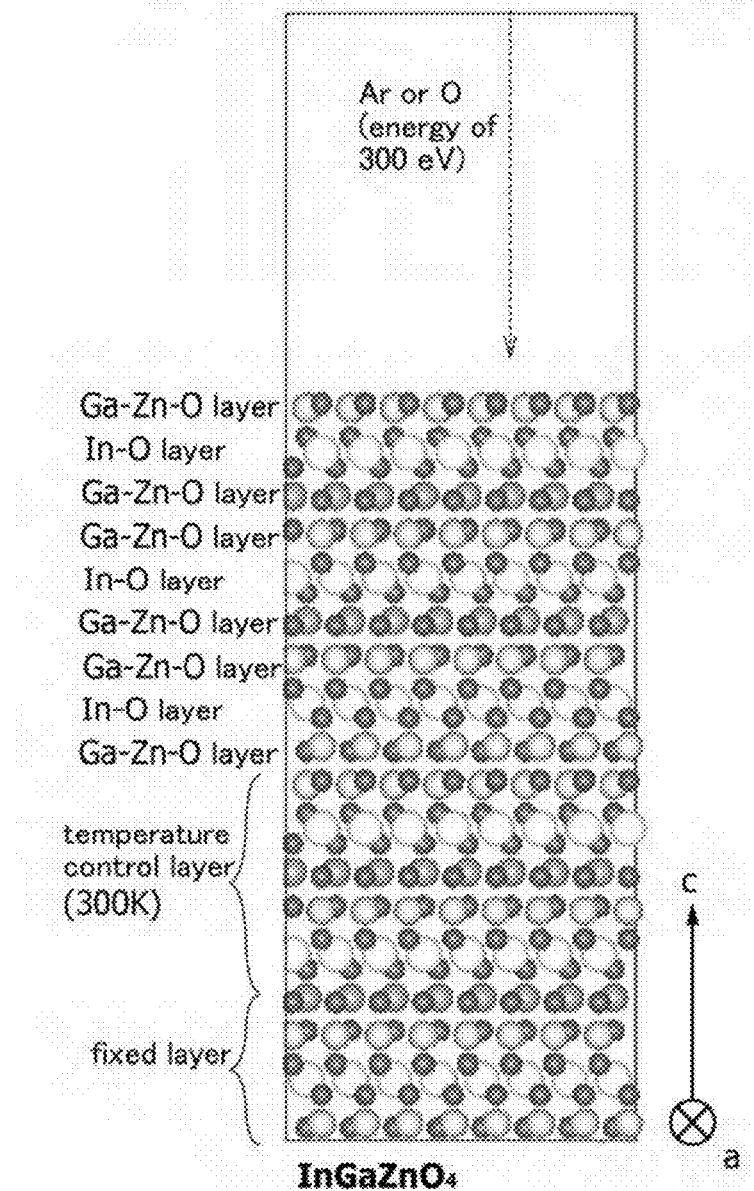
FIGS. 30A and 30B illustrate a structure of InGaZnO$_4$ and the like before collision of atoms.
Figure 30B:
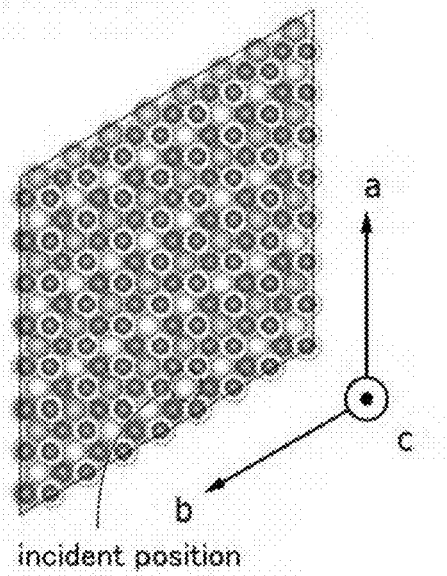

Next, through classical molecular dynamics calculation, on the assumption of an InGaZnO$_4$ crystal having a homologous structure as a target, a cleavage plane in the case where sputtering is performed on the target by using argon (Ar) or oxygen (O) was evaluated. FIG. 30A shows a cross-sectional structure of an InGaZnO$_4$ crystal (2688 atoms) used for the calculation, and FIG. 30B shows a top structure thereof. Note that a fixed layer in FIG. 30A is a layer which prevents the positions of the atoms from moving. A temperature control layer in FIG. 30A is a layer whose temperature is constantly set to a fixed temperature (300 K).

For the classical molecular dynamics calculation, Materials Explorer 5.0 manufactured by Fujitsu Limited is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

FIG. 31A shows an atomic arrangement when 99.9 picoseconds have passed after argon enters the cell including the InGaZnO$_4$ crystal shown in FIGS. 30A and 30B. FIG. 31B shows an atomic arrangement when 99.9 picoseconds have passed after oxygen enters the cell. Note that in FIGS. 31A and 31B, part of the fixed layer in FIG. 30A is omitted.

According to FIG. 31A, in a period from entry of argon into the cell to when 99.9 picoseconds have passed, a crack is formed from the cleavage plane corresponding to the second plane shown in FIG. 29A. Thus, in the case where argon collides with the InGaZnO$_4$ crystal and the uppermost surface is the second plane (the zero-th), a large crack is found to be formed in the second plane (the second).

On the other hand, according to FIG. 31B, in a period from entry of oxygen into the cell to when 99.9 picoseconds have passed, a crack is found to be formed from the cleavage plane corresponding to the second plane shown in FIG. 29A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the top surface of the target, the InGaZnO$_4$ crystal is cleaved along the second plane, and a flat-plate-like particle (hereinafter referred to as a pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide was studied.

FIG. 32A shows trajectories of the atoms from 0 picosecond to 0.3 picoseconds after argon enters the cell including the InGaZnO$_4$ crystal shown in FIGS. 30A and 30B. Accordingly, FIG. 32A corresponds to a period from FIGS. 30A and 30B to FIG. 31A.

From FIG. 32A, when argon collides with gallium (Ga) of the first layer (Ga—Zn—O layer), the gallium collides with zinc (Zn) of the third layer (Ga—Zn—O layer) and then, the zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 30A.

FIG. 32B shows trajectories of the atoms from 0 picosecond to 0.3 picoseconds after oxygen enters the cell including the InGaZnO$_4$ crystal shown in FIGS. 30A and 30B. Accordingly, FIG. 32B corresponds to a period from FIGS. 30A and 30B to FIG. 31A.

On the other hand, from FIG. 32B, when oxygen collides with gallium (Ga) of the first layer (Ga—Zn—O layer), the gallium collides with zinc (Zn) of the third layer (Ga—Zn—O layer) and then, the zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 30A.

This calculation also shows that the InGaZnO$_4$ crystal with which an atom (ion) collides is separated from the cleavage plane.

In addition, difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]

$$E = \tfrac{1}{2} m_A v_A^2 + \tfrac{1}{2} m_{Ga} v_{Ga}^2 \tag{1}$$

[Formula 2]

$$m_A v_A + m_{Ga} v_{Ga} = m_A v'_A + m_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]

$$v'_A - v'_{Ga} = -(v_A - v_{Ga}) \quad (3)$$

From the formulae (1), (2), and (3), on the assumption that $v_{Ga}$ is 0, the speed of gallium $v'_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E} \quad (4)$$

In the formula (4), mass of argon or oxygen is substituted into $m_A$, whereby the speeds after collision of the atoms are compared. In the case where the argon and the oxygen have the same energy before collision, the speed of gallium in the case where argon collides with the gallium is found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, a crack is thought to be formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. A model in FIG. 22 in which sputtered pellets are deposited to form a CAAC-OS makes sense.

The CAAC-OS formed in this manner has substantially the same density as a single crystal OS. For example, the density of the single crystal OS of InGaZnO$_4$ having a homologous structure is 6.36 g/cm$^3$, and the density of the CAAC-OS having substantially the same atomic ratio is approximately 6.3 g/cm$^3$.

Figure 33A:
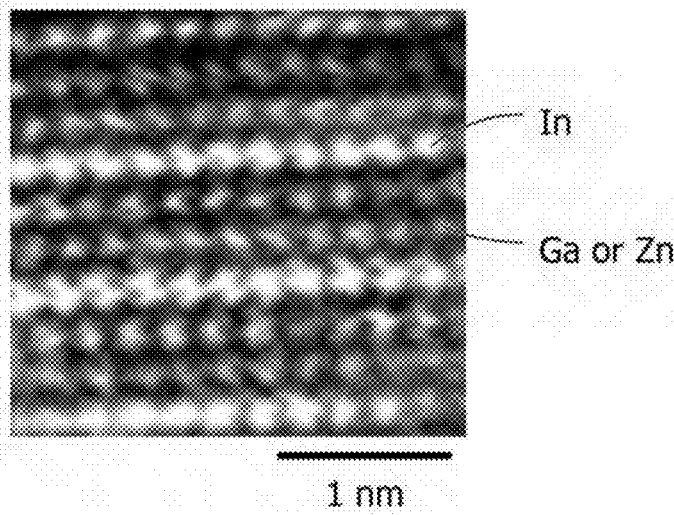
FIGS. 33A and 33B are cross-sectional HAADF-STEM images of a CAAC-OS film and a target.
Figure 33B:
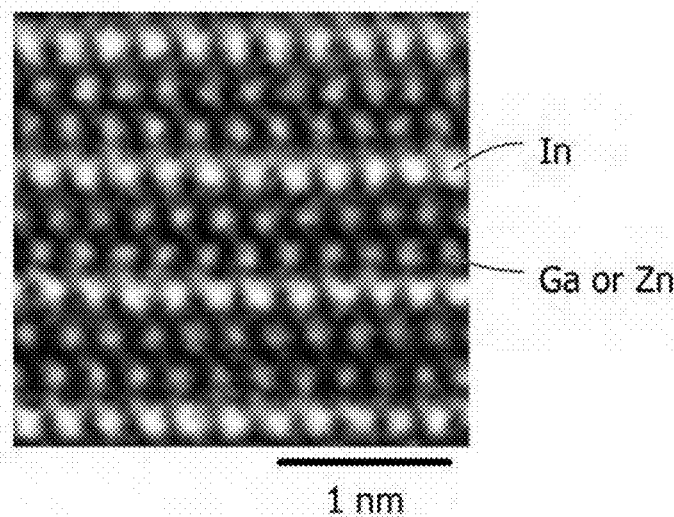

FIGS. 33A and 33B show atomic arrangements of cross sections of an In—Ga—Zn oxide (see FIG. 33A) that is a CAAC-OS deposited by a sputtering method and a target thereof (see FIG. 33B). For observation of atomic arrangement, high-angle annular dark field scanning transmission electron microscopy (HAADF-STEM) is used. The contrast of the image of each of the atoms in the HAADF-STEM is proportional to the square of its atomic number. Therefore, Zn (atomic number: 30) and Ga (atomic number: 31), which have close atomic numbers, are difficult to distinguish. A Hitachi scanning transmission electron microscope HD-2700 is used for the HAADF-STEM.

When FIG. 33A and FIG. 33B are compared, it is found that the CAAC-OS and the target each have a homologous structure and arrangements of atoms in the CAAC-OS correspond to those in the target.

<Deposition Apparatus>

A deposition apparatus with which the above-described CAAC-OS can be deposited is described below.

First, a structure of a deposition apparatus which allows the entry of few impurities into a film at the time of the deposition is described with reference to FIG. 34 and FIGS. 35A to 35C.

Figure 34:
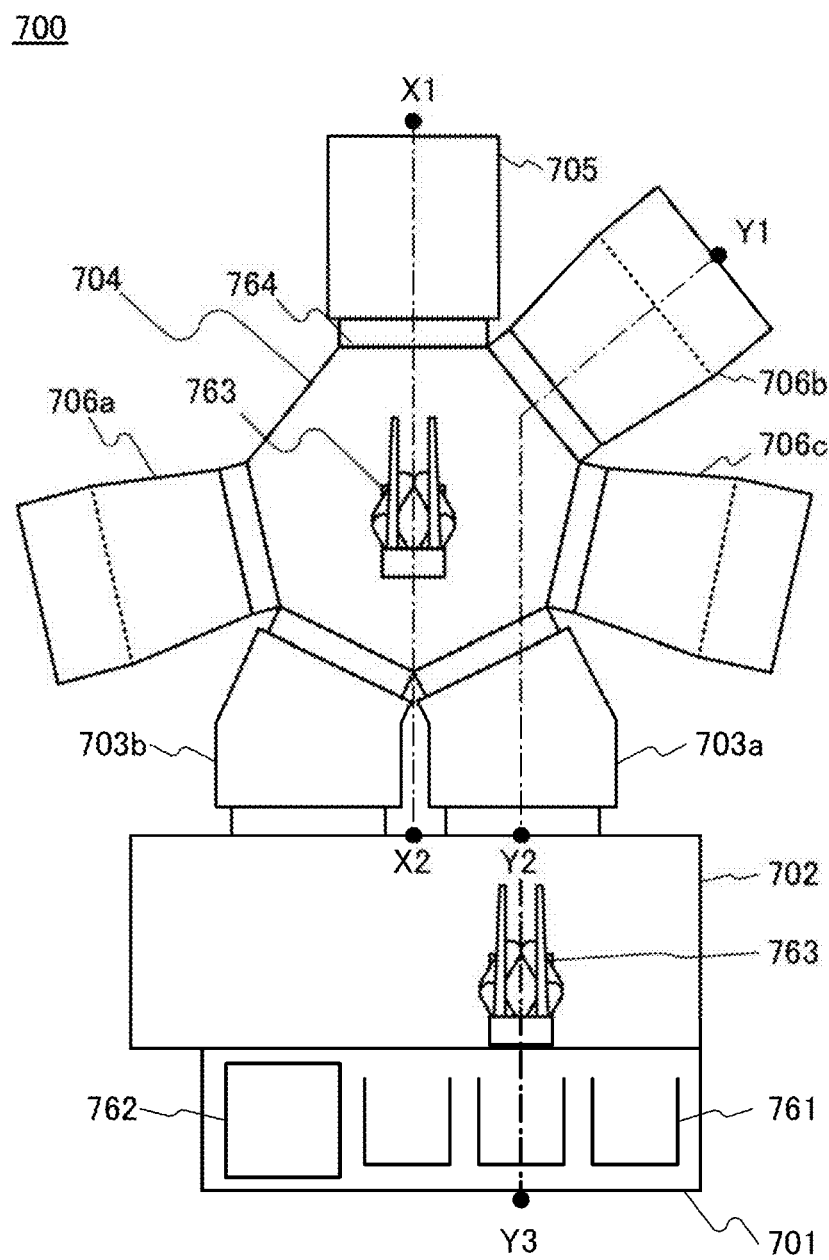
FIG. 34 is a top view illustrating an example of a deposition apparatus.

FIG. 34 is a top view schematically illustrating a single wafer multi-chamber deposition apparatus 700. The deposition apparatus 700 includes an atmosphere-side substrate supply chamber 701 including a cassette port 761 for holding a substrate and an alignment port 762 for performing alignment of a substrate, an atmosphere-side substrate transfer chamber 702 through which a substrate is transferred from the atmosphere-side substrate supply chamber 701, a load lock chamber 703a where a substrate is carried and the pressure inside the chamber is switched from atmospheric pressure to reduced pressure or from reduced pressure to atmospheric pressure, an unload lock chamber 703b where a substrate is carried out and the pressure inside the chamber is switched from reduced pressure to atmospheric pressure or from atmospheric pressure to reduced pressure, a transfer chamber 704 through which a substrate is transferred in a vacuum, a substrate heating chamber 705 where a substrate is heated, and deposition chambers 706a, 706b, and 706c in each of which a target is placed for deposition.

Note that a plurality of cassette ports 761 may be provided as illustrated in FIG. 34 (in FIG. 34, three cassette ports 761 are provided).

The atmosphere-side substrate transfer chamber 702 is connected to the load lock chamber 703a and the unload lock chamber 703b, the load lock chamber 703a and the unload lock chamber 703b are connected to the transfer chamber 704, and the transfer chamber 704 is connected to the substrate heating chamber 705 and the deposition chambers 706a, 706b, and 706c.

Gate valves 764 are provided for connecting portions between chambers so that each chamber except the atmosphere-side substrate supply chamber 701 and the atmosphere-side substrate transfer chamber 702 can be independently kept under vacuum. Moreover, the atmosphere-side substrate transfer chamber 702 and the transfer chamber 704 each include a transfer robot 763, with which a glass substrate can be transferred.

Furthermore, it is preferable that the substrate heating chamber 705 also serve as a plasma treatment chamber. In the deposition apparatus 700, it is possible to transfer a substrate without exposure to the air between treatment and treatment; therefore, adsorption of impurities on a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 35A:
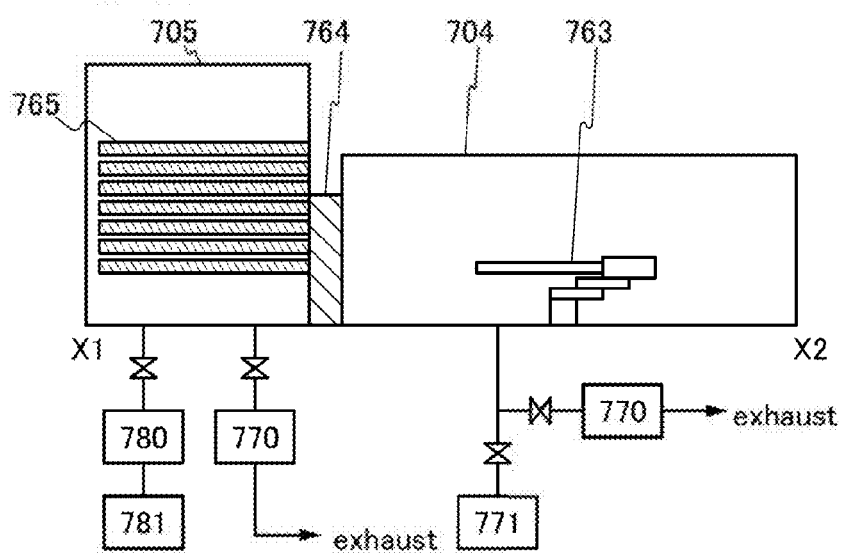
FIGS. 35A to 35C illustrate an example of a structure of a deposition apparatus.
Figure 35B:
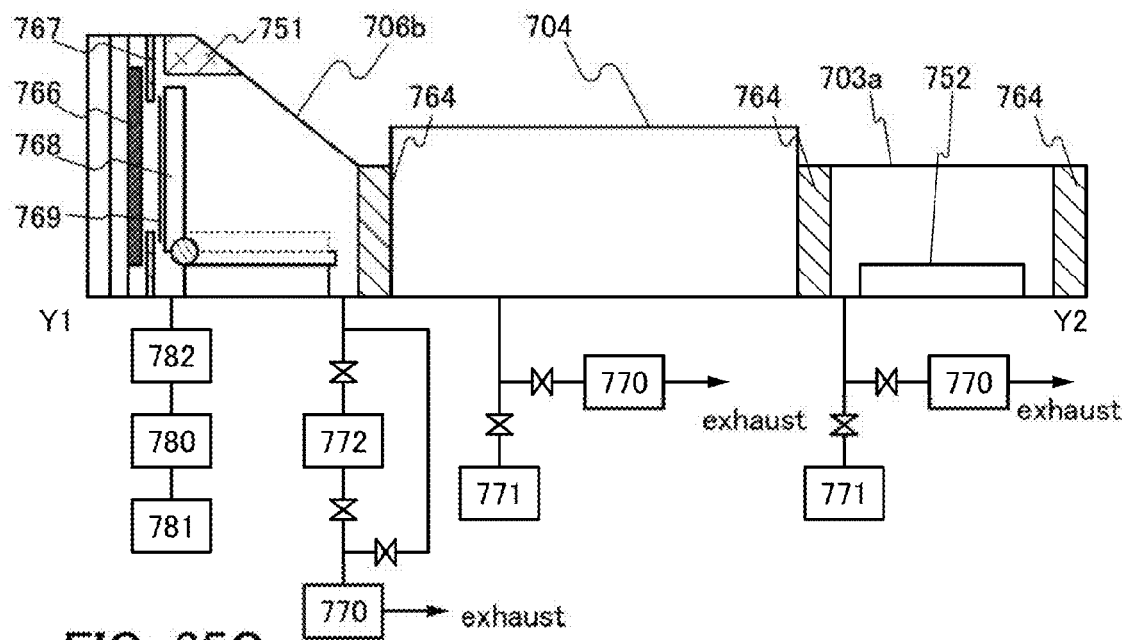
Figure 35C:
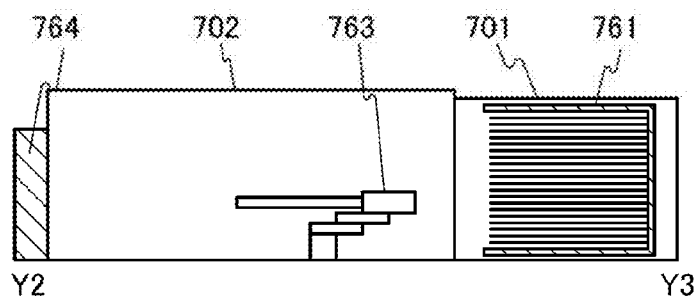

Next, FIG. 35A, FIG. 35B, and FIG. 35C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 700 illustrated in FIG. 34.

FIG. 35A is a cross section of the substrate heating chamber 705 and the transfer chamber 704, and the substrate heating chamber 705 includes a plurality of heating stages 765 which can hold a substrate. Note that although the number of heating stages 765 illustrated in FIG. 35A is seven, it is not limited thereto and may be greater than or equal to one and less than seven, or greater than or equal to eight. It is preferable to increase the number of the heating stages 765 because a plurality of substrates can be subjected to heat treatment at the same time, which leads to an increase in productivity. Furthermore, the substrate heating chamber 705 is connected to a vacuum pump 770 through a valve. As the vacuum pump 770, a dry pump and a mechanical booster pump can be used, for example.

As heating mechanism which can be used for the substrate heating chamber 705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 705 is connected to a refiner 781 through a mass flow controller 780. Note that although the mass flow controller 780 and the refiner 781 can be provided for each of a plurality of kinds of gases, only one mass flow controller 780 and one refiner 781 are provided for easy understanding. As the gas introduced to the substrate heating chamber 705, a gas whose dew point is −80° C. or lower, preferably −100° C. or lower can be used; for example, an oxygen gas, a nitrogen gas, and a rare gas (e.g., an argon gas) are used.

The transfer chamber 704 includes the transfer robot 763. The transfer robot 763 includes a plurality of movable portions and an arm for holding a substrate and can transfer a substrate to each chamber. Furthermore, the transfer chamber 704 is connected to the vacuum pump 770 and a cryopump 771 through valves. With such a structure, evacuation can be performed using the vacuum pump 770 when the pressure inside the transfer chamber 704 is in the range of atmospheric pressure to low or medium vacuum (approximately 0.1 Pa to several hundred Pa) and then, by switching the valves, evacuation can be performed using the cryopump 771 when the pressure inside the transfer chamber 704 is in the range of middle vacuum to high or ultra-high vacuum (0.1 Pa to $1 \times 10^{-7}$ Pa).

Alternatively, two or more cryopumps 771 may be connected in parallel to the transfer chamber 704. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 35B is a cross section of the deposition chamber 706b, the transfer chamber 704, and the load lock chamber 703a.

Here, the details of the deposition chamber (sputtering chamber) are described with reference to FIG. 35B. The deposition chamber 706b illustrated in FIG. 35B includes a target 766, an attachment protection plate 767, and a substrate stage 768. Note that here, a substrate 769 is provided on the substrate stage 768. Although not illustrated, the substrate stage 768 may include a substrate holding mechanism which holds the substrate 769, a rear heater which heats the substrate 769 from the back surface, or the like.

Note that the substrate stage 768 is held substantially vertically to a floor during deposition and is held substantially parallel to the floor when the substrate is delivered. In FIG. 35B, the position where the substrate stage 768 is held when the substrate is delivered is denoted by a dashed line. With such a structure, the probability that dust or a particle which might be mixed into a film during the deposition is attached to the substrate 769 can be suppressed as compared with the case where the substrate stage 768 is held parallel to the floor. However, there is a possibility that the substrate 769 falls when the substrate stage 768 is held vertically) (90° to the floor; therefore, the angle of the substrate stage 768 to the floor is preferably wider than or equal to 80° and narrower than 90°.

The attachment protection plate 767 can suppress deposition of a particle which is sputtered from the target 766 on a region where deposition is not needed. Moreover, the attachment protection plate 767 is preferably processed to prevent accumulated sputtered particles from being separated. For example, blasting treatment which increases surface roughness may be performed, or roughness may be formed on the surface of the attachment protection plate 767.

The deposition chamber 706b is connected to the mass flow controller 780 through a gas heating system 782, and the gas heating system 782 is connected to the refiner 781 through the mass flow controller 780. With the gas heating system 782, a gas which is introduced to the deposition chamber 706b can be heated to a temperature higher than or equal to 40° C. and lower than or equal to 400° C., preferably higher than or equal to 50° C. and lower than or equal to 200° C. Note that although the gas heating system 782, the mass flow controller 780, and the refiner 781 can be provided for each of a plurality of kinds of gases, only one gas heating system 782, one mass flow controller 780, and one refiner 781 are provided for easy understanding. As the gas introduced to the deposition chamber 706b, a gas whose dew point is −80° C. or lower, preferably −100° C. or lower can be used; for example, an oxygen gas, a nitrogen gas, and a rare gas (e.g., an argon gas) are used.

A facing-target-type sputtering apparatus may be provided in the deposition chamber 706b. In a facing-target-type sputtering apparatus, plasma is confined between targets; therefore, plasma damage to a substrate can be reduced. Furthermore, step coverage can be improved because an incident angle of a sputtered particle to the substrate can be made smaller depending on the inclination of the target.

Note that a parallel-plate-type sputtering apparatus or an ion beam sputtering apparatus may be provided in the deposition chamber 706b.

In the case where the refiner is provided near a gas inlet, the length of a pipe between the refiner and the deposition chamber 706b is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. Furthermore, a high-performance ultra-compact metal gasket joint (UPG joint) may be used as a joint of the pipe. A structure where all the materials of the pipe are metals is preferable because the effect of the generated released gas or the external leakage can be reduced as compared with a structure where resin or the like is used.

The deposition chamber 706b is connected to a turbo molecular pump 772 and the vacuum pump 770 through valves.

In addition, the deposition chamber 706b is provided with a cryotrap 751.

The cryotrap 751 is a mechanism which can adsorb a molecule (or an atom) having a relatively high melting point, such as water. The turbo molecular pump 772 is capable of stably removing a large-sized molecule (or atom), needs low frequency of maintenance, and thus enables high productivity, whereas it has a low capability in removing hydrogen and water. Hence, the cryotrap 751 is connected to the deposition chamber 706b so as to have a high capability in removing water or the like. The temperature of a refrigerator of the cryotrap 751 is set to be lower than or equal to 100 K, preferably lower than or equal to 80 K. In the case where the cryotrap 751 includes a plurality of refrigerators, it is preferable to set the temperature of each refrigerator at a different temperature because efficient evacuation is possible. For example, the temperature of a first-stage refrigerator may be set to be lower than or equal to 100 K and the temperature of a second-stage refrigerator may be set to be lower than or equal to 20 K.

Note that the evacuation method of the deposition chamber 706b is not limited to the above, and a structure similar to that in the evacuation method described in the transfer chamber 704 (the evacuation method using the cryopump and the vacuum pump) may be employed. Needless to say, the evacuation method of the transfer chamber 704 may have a structure similar to that of the deposition chamber 706b (the evacuation method using the turbo molecular pump and the vacuum pump).

Note that in each of the transfer chamber 704, the substrate heating chamber 705, and the deposition chamber 706b which are described above, the back pressure (total pressure) and the partial pressure of each gas molecule (atom) are preferably set as follows. In particular, the back pressure and the partial pressure of each gas molecule (atom) in the deposition chamber 706b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, more preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, more preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, more preferably less than or equal to $3 \times 10^{-6}$ Pa. Furthermore, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, more preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 704, the substrate heating chamber 705, and the deposition chamber 706b which are described above preferably have a small amount of external leakage or internal leakage.

For example, in each of the transfer chamber 704, the substrate heating chamber 705, and the deposition chamber 706b which are described above, the leakage rate is less than or equal to $3 \times 10^{-6}$ Pa·m³/s, preferably less than or equal to $1 \times 10^{-6}$ Pa·m³/s. The leakage rate of a gas molecule (atom) having a mass-to-charge ratio (m/z) of 18 is less than or equal to $1 \times 10^{-7}$ Pa·m³/s, preferably less than or equal to $3 \times 10^{-8}$ Pa·m³/s. The leakage rate of a gas molecule (atom) having a mass-to-charge ratio (m/z) of 28 is less than or equal to $1 \times 10^{-5}$ Pa·m³/s, preferably less than or equal to $1 \times 10^{-6}$ Pa·m³/s. The leakage rate of a gas molecule (atom) having a mass-to-charge ratio (m/z) of 44 is less than or equal to $3 \times 10^{-6}$ Pa·m³/s, preferably less than or equal to $1 \times 10^{-6}$ Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate is set to be less than or equal to the above value.

For example, an open/close portion of the deposition chamber 706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 700 may be covered with iron fluoride, aluminum oxide, chromium oxide, or the like.

The member of the deposition apparatus 700 is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the evacuation rate, it is important that the adsorbed substance present in the deposition chamber be desorbed as much as possible and evacuation be performed in advance with the use of a pump with high evacuation capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by evacuation, can be further increased. Note that when the inert gas which is introduced is heated to substantially the same temperature as the baking temperature of the deposition chamber, the desorption rate of the adsorbed substance can be further increased. Here, a rare gas is preferably used as an inert gas. Depending on the kind of a film to be deposited, oxygen or the like may be used instead of an inert gas. For example, in the case of depositing an oxide, the use of oxygen which is the main component of the oxide is preferable in some cases.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film to be deposited later can be reduced. Note that the dummy deposition may be performed at the same time as the baking of the deposition chamber.

Next, the details of the transfer chamber 704 and the load lock chamber 703a illustrated in FIG. 35B and the atmosphere-side substrate transfer chamber 702 and the atmosphere-side substrate supply chamber 701 illustrated in FIG. 35C are described. Note that FIG. 35C is a cross section of the atmosphere-side substrate transfer chamber 702 and the atmosphere-side substrate supply chamber 701.

For the transfer chamber 704 illustrated in FIG. 35B, the description of the transfer chamber 704 illustrated in FIG. 35A can be referred to.

The load lock chamber 703a includes a substrate delivery stage 752. When a pressure in the load lock chamber 703a becomes atmospheric pressure by being increased from reduced pressure, the substrate delivery stage 752 receives a substrate from the transfer robot 763 provided in the atmosphere-side substrate transfer chamber 702. After that, the load lock chamber 703a is evacuated into vacuum so that the pressure therein becomes reduced pressure and then the transfer robot 763 provided in the transfer chamber 704 receives the substrate from the substrate delivery stage 752.

Furthermore, the load lock chamber 703a is connected to the vacuum pump 770 and the cryopump 771 through valves. For a method for connecting evacuation systems such as the vacuum pump 770 and the cryopump 771, the description of the method for connecting the transfer chamber 704 can be referred to, and the description thereof is omitted here. Note that the unload lock chamber 703b illustrated in FIG. 34 can have a structure similar to that in the load lock chamber 703a.

The atmosphere-side substrate transfer chamber 702 includes the transfer robot 763. The transfer robot 763 can deliver a substrate from the cassette port 761 to the load lock chamber 703a or deliver a substrate from the load lock chamber 703a to the cassette port 761. Furthermore, a mechanism for suppressing entry of dust or a particle, such as high efficiency particulate air (HEPA) filter, may be provided above the atmosphere-side substrate transfer chamber 702 and the atmosphere-side substrate supply chamber 701.

The atmosphere-side substrate supply chamber 701 includes a plurality of cassette ports 761. The cassette port 761 can hold a plurality of substrates.

The surface temperature of the target is set to be lower than or equal to 100° C., preferably lower than or equal to 50° C., more preferably about room temperature (typically, 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal used for adhesion might be sputtered and might cause an increase in impurity concentration. Thus, it is preferable that the target be cooled sufficiently.

Specifically, for the backing plate, a metal having high conductivity and a high heat dissipation property (specifically copper) is used. The target can be cooled efficiently by making a sufficient amount of cooling water flow through a water channel which is formed in the backing plate.

Note that in the case where the target includes zinc, plasma damage is alleviated by the deposition in an oxygen gas atmosphere; thus, an oxide in which zinc is unlikely to be volatilized can be obtained.

Specifically, the concentration of hydrogen in the CAAC-OS, which is measured by secondary ion mass spectrometry (SIMS), can be set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

Figure 36:
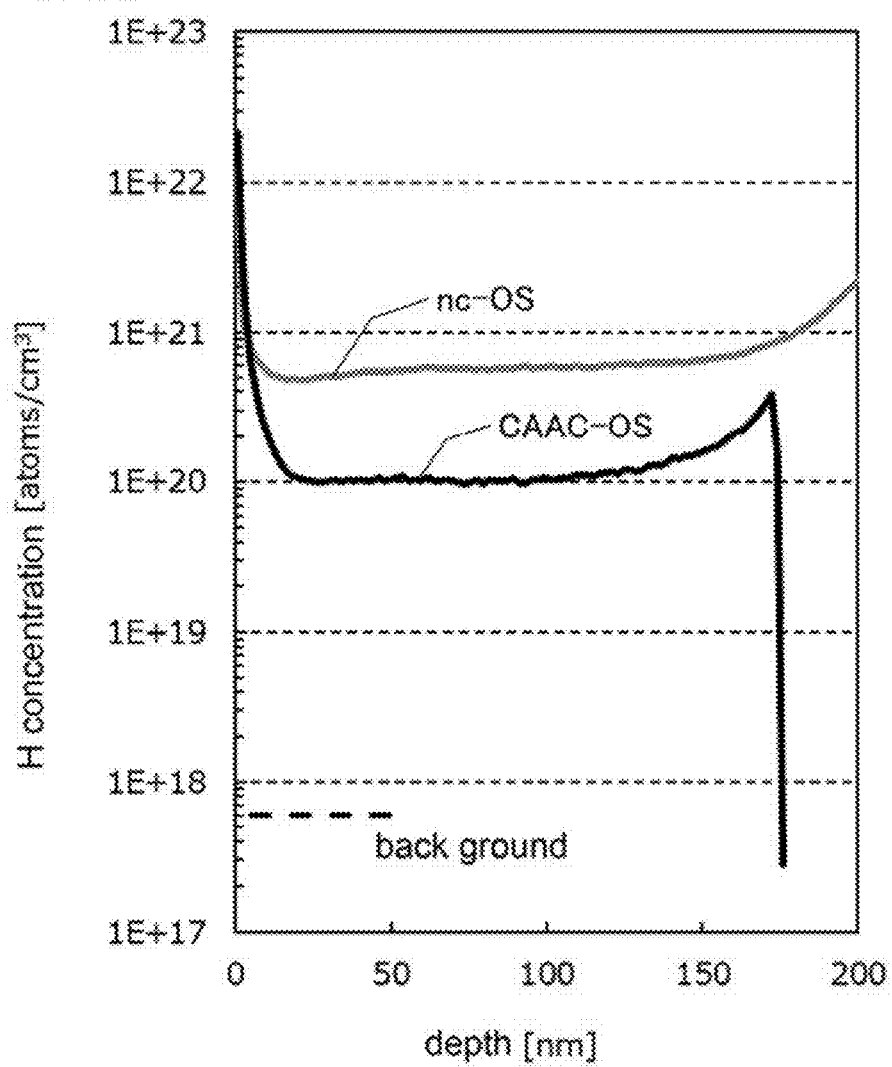
FIG. 36 shows hydrogen concentrations of a CAAC-OS and an nc-OS.

FIG. 36 is a profile of the concentrations of hydrogen in the CAAC-OS and the nc-OS in the depth direction. The CAAC-OS has a lower concentration of hydrogen than the nc-OS.

The concentration of nitrogen in the CAAC-OS, which is measured by SIMS, can be set to be lower than $5\times10^{19}$ atoms/cm$^3$, preferably lower than or equal to $1\times10^{19}$ atoms/cm$^3$, more preferably lower than or equal to $5\times10^{18}$ atoms/cm$^3$, still more preferably lower than or equal to $1\times10^{18}$ atoms/cm$^3$.

The concentration of carbon in the CAAC-OS, which is measured by SIMS, can be set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

Figure 37:
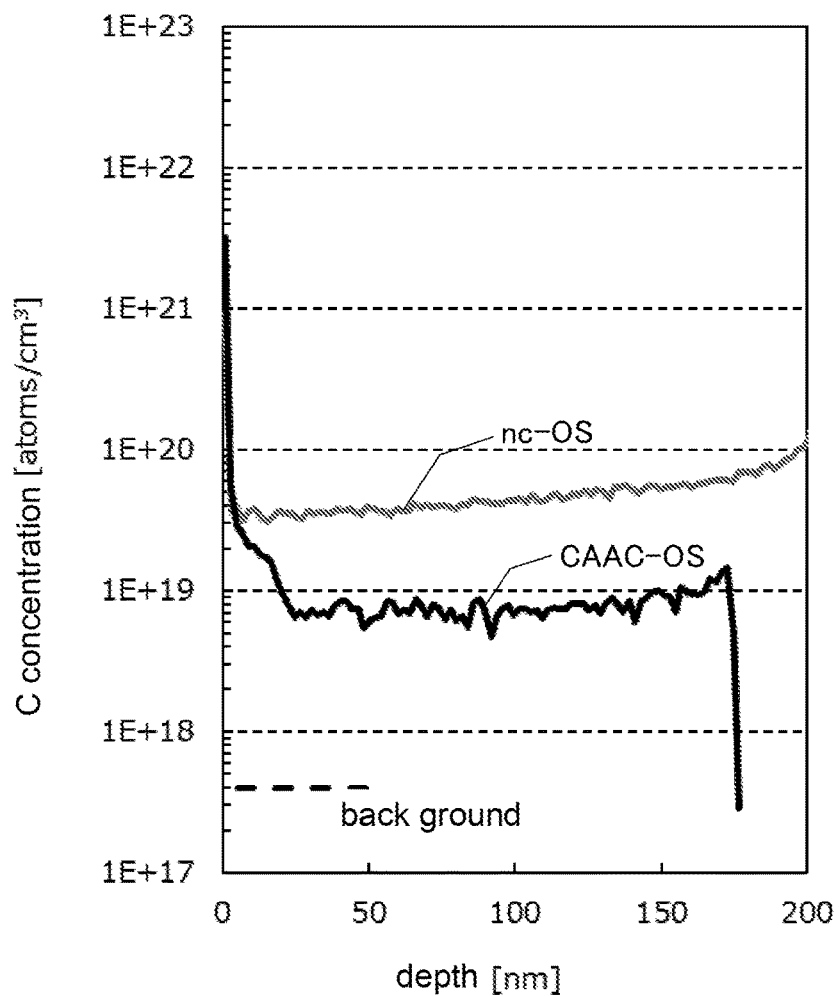
FIG. 37 shows carbon concentrations of a CAAC-OS and an nc-OS.

FIG. 37 is a profile of the concentrations of carbon in the CAAC-OS and the nc-OS in the depth direction. The CAAC-OS has a lower concentration of carbon than the nc-OS.

The amount of each of the following gas molecules (atoms) released from the CAAC-OS can be less than or equal to $1\times10^{19}$/cm$^3$, preferably less than or equal to $1\times10^{18}$/cm$^3$, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the CAAC-OS can be suppressed. Furthermore, when a film in contact with the CAAC-OS is formed with the use of the above deposition apparatus, the entry of impurities into the CAAC-OS film from the film in contact therewith can be suppressed.

<Transistor Structure>

The structures of transistors of embodiments of the present invention will be described below.

Note that the transistors of the embodiments of the present invention each preferably include the CAAC-OS or the nc-OS.

<Transistor Structure 1>

Figure 38A:
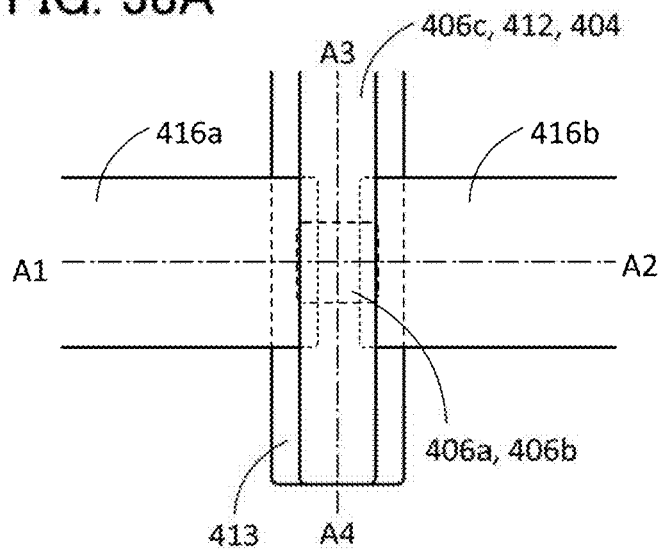
FIGS. 38A and 38B are a top view and a cross-sectional view which illustrate a transistor of one embodiment of the present invention.
Figure 38B:
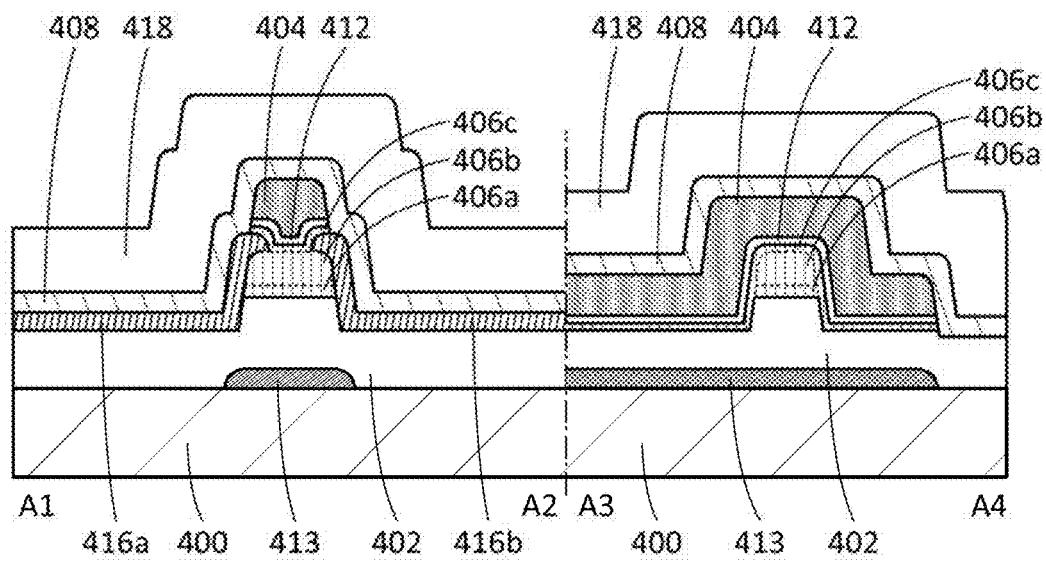

FIGS. 38A and 38B are a top view and a cross-sectional view of a transistor of one embodiment of the present invention. FIG. 38A is a top view and FIG. 38B is a cross-sectional view taken along dashed-dotted line A1-A2 and dashed-dotted line A3-A4 in FIG. 38A. Note that for simplification of the drawing, some components are not illustrated in the top view in FIG. 38A.

The transistor in FIGS. 38A and 38B includes a conductor 413 over a substrate 400, an insulator 402 having a projection over the substrate 400 and the conductor 413, a semiconductor 406a over the projection of the insulator 402, a semiconductor 406b over the semiconductor 406a, a conductor 416a and a conductor 416b which are in contact with a top surface and a side surface of the semiconductor 406b and which are arranged to be separated from each other, a semiconductor 406c over the semiconductor 406b, the conductor 416a, and the conductor 416b, an insulator 412 over the semiconductor 406c, a conductor 404 over the insulator 412, an insulator 408 over the conductor 416a, the conductor 416b, and the conductor 404, and an insulator 418 over the insulator 408. Although the conductor 413 is part of the transistor in FIGS. 38A and 38B, a transistor structure of one embodiment of the present invention is not limited thereto. For example, the conductor 413 may be a component independent of the transistor.

Note that the semiconductor 406c is in contact with at least a top surface and a side surface of the semiconductor 406b in the cross section taken along line A3-A4. Furthermore, the conductor 404 faces the top surface and the side surface of the semiconductor 406b with the semiconductor 406c and the insulator 412 provided therebetween in the cross section taken along line A3-A4. The conductor 413 faces a bottom surface of the semiconductor 406b with the insulator 402 provided therebetween. The insulator 402 does not necessarily include a projection. The semiconductor 406c, the insulator 408, or the insulator 418 is not necessarily provided.

The semiconductor 406b serves as a channel formation region of the transistor. The conductor 404 serves as a first gate electrode (also referred to as a front gate electrode) of the transistor. The conductor 413 serves as a second gate electrode (also referred to as a back gate electrode) of the transistor. The conductor 416a and the conductor 416b serve as a source electrode and a drain electrode of the transistor. The insulator 408 functions as a barrier layer. The insulator 408 has, for example, a function of blocking oxygen and/or hydrogen. Alternatively, the insulator 408 has, for example, a higher capability of blocking oxygen and/or hydrogen than the semiconductor 406a and/or the semiconductor 406c.

The insulator 402 is preferably an insulator containing excess oxygen.

The insulator containing excess oxygen means an insulator from which oxygen is released by heat treatment, for example. The silicon oxide layer containing excess oxygen means a silicon oxide layer which can release oxygen by heat treatment or the like, for example. Therefore, the insulator 402 is an insulator in which oxygen can be moved. In other words, the insulator 402 may be an insulator having an oxygen-transmitting property. For example, the insulator 402 may be an insulator having a higher oxygen-transmitting property than the semiconductor 406a.

The insulator containing excess oxygen has a function of reducing oxygen vacancies in the semiconductor 406b in some cases. Such oxygen vacancies form DOS in the semiconductor 406b and serve as hole traps or the like. In addition, hydrogen comes into the site of such oxygen vacancies and forms electrons serving as carriers. Therefore, by reducing the oxygen vacancies in the semiconductor 406b, the transistor can have stable electrical characteristics.

Here, an insulator from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ (converted into the number of oxygen atoms) in TDS analysis in the range of a surface temperature of 100° C. to 700° C. or 100° C. to 500° C.

Here, the method of measuring the amount of released oxygen using TDS analysis is described below.

The total amount of released gas from a measurement sample in TDS analysis is proportional to the integral value of the ion intensity of the released gas. Then, comparison with a reference sample is made, whereby the total amount of released gas can be calculated.

For example, the number of released oxygen molecules ($N_{O2}$) from a measurement sample can be calculated according to the following formula using the TDS results of a silicon substrate containing hydrogen at a predetermined density, which is a reference sample, and the TDS results of the measurement sample. Here, all gases having a mass-to-charge ratio of 32 which are obtained in the TDS analysis are assumed to originate from an oxygen molecule. Note that $CH_3OH$, which is a gas having the mass-to-charge ratio of 32, is not taken into consideration because it is unlikely to be present. Furthermore, an oxygen molecule including an oxygen atom having a mass number of 17 or 18 which is an isotope of an oxygen atom is also not taken into consideration because the proportion of such a molecule in the natural world is minimal.

$$N_{O2} = N_{H2}/S_{H2} \times S_{O2} \times \alpha$$

The value $N_{H2}$ is obtained by conversion of the number of hydrogen molecules desorbed from the reference sample into densities. The value $S_{H2}$ is the integral value of ion intensity in the case where the reference sample is subjected to the TDS analysis. Here, the reference value of the reference sample is set to $N_{H2}/S_{H2}$. The value $S_{O2}$ is the integral value of ion intensity when the measurement sample is analyzed by TDS. The value $\alpha$ is a coefficient affecting the ion intensity in the TDS analysis. Refer to Japanese Published Patent Application No. H6-275697 for details of the above formula. The amount of released oxygen is measured with, for example, a thermal desorption spectroscopy apparatus produced by ESCO Ltd., EMD-WA1000S/W using a silicon substrate containing hydrogen atoms at $1 \times 10^{16}$ atoms/cm$^2$ as the reference sample.

Furthermore, in the TDS analysis, oxygen is partly detected as an oxygen atom. The ratio between oxygen molecules and oxygen atoms can be calculated from the ionization rate of the oxygen molecules. Note that, since the above $\alpha$ includes the ionization rate of the oxygen molecules, the amount of the released oxygen atoms can also be estimated through the evaluation of the amount of the released oxygen molecules.

Note that $N_{O2}$ is the amount of the released oxygen molecules. The amount of released oxygen in the case of being converted into oxygen atoms is twice the amount of the released oxygen molecules.

Furthermore, the insulator from which oxygen is released by heat treatment may contain a peroxide radical. Specifically, the spin density attributed to the peroxide radical is greater than or equal to $5 \times 10^{17}$ spins/cm$^3$. Note that the insulator containing a peroxide radical may have an asymmetric signal with a g factor of approximately 2.01 in ESR.

The insulator containing excess oxygen may be formed using oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry (RBS).

As illustrated in FIG. 38B, the side surfaces of the semiconductor 406b are in contact with the conductor 416a and the conductor 416b. The semiconductor 406b can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Furthermore, by applying a lower voltage or a higher voltage than a source electrode to the conductor 413, the threshold voltage of the transistor may be shifted in the positive direction or the negative direction. For example, by shifting the threshold voltage of the transistor in the positive direction, a normally-off transistor in which the transistor is in a non-conduction state (off state) even when the gate voltage is 0 V can be achieved in some cases. The voltage applied to the conductor 413 may be a variable or a fixed voltage. When the voltage applied to the conductor 413 is a variable, a circuit for controlling the voltage may be electrically connected to the conductor 413.

Next, a semiconductor which can be used as the semiconductor 406a, the semiconductor 406b, the semiconductor 406c, or the like is described below.

The semiconductor 406b is an oxide semiconductor containing indium, for example. An oxide semiconductor can have high carrier mobility (electron mobility) by containing indium, for example. The semiconductor 406b preferably contains an element M. The element M is preferably aluminum, gallium, yttrium, tin, or the like. Other elements which can be used as the element M are boron, silicon, titanium, iron, nickel, germanium, yttrium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406b preferably contains zinc. When the oxide semiconductor contains zinc, the oxide semiconductor is easily to be crystallized, for example.

Note that the semiconductor 406b is not limited to the oxide semiconductor containing indium. The semiconductor 406b may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406b, an oxide with a wide energy gap may be used. For example, the energy gap of the semiconductor 406b is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

For example, the semiconductor 406a and the semiconductor 406c include one or more elements other than oxygen included in the semiconductor 406b. Since the semiconductor 406a and the semiconductor 406c each include one or more elements other than oxygen included in the semiconductor 406b, an interface state is less likely to be formed at the interface between the semiconductor 406a and the semiconductor 406b and the interface between the semiconductor 406b and the semiconductor 406c.

The semiconductor 406a, the semiconductor 406b, and the semiconductor 406c preferably include at least indium. In the case of using an In-M-Zn oxide as the semiconductor 406a, when the summation of In and M is assumed to be 100 atomic %, the proportions of In and M are preferably set to be less than 50 atomic % and greater than or equal to 50 atomic %, respectively, more preferably less than 25 atomic % and greater than or equal to 75 atomic %, respectively. In the case of using an In-M-Zn oxide as the semiconductor 406b, when the summation of In and M is assumed to be 100 atomic %, the proportions of In and M are preferably set to be greater than or equal to 25 atomic % and less than 75 atomic %, respectively, more preferably greater than or equal to 34 atomic % and less than 66 atomic %, respectively. In the case of using an In-M-Zn oxide as the semiconductor 406c, when the summation of In and M is assumed to be 100 atomic %, the proportions of In and M are preferably set to be less than 50 atomic % and greater than or equal to 50 atomic %, respectively, more preferably less than 25 atomic % and greater than or equal to 75 atomic %, respectively. Note that the semiconductor 406c may be an oxide that is a type the same as that of the semiconductor 406a.

As the semiconductor 406b, an oxide having an electron affinity higher than those of the semiconductors 406a and 406c is used. For example, as the semiconductor 406b, an oxide having an electron affinity higher than those of the semiconductors 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the bottom of the conduction band.

An indium gallium oxide has a small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, more preferably higher than or equal to 90%.

At this time, when a gate voltage is applied, a channel is formed in the semiconductor 406b having the highest electron affinity in the semiconductor 406a, the semiconductor 406b, and the semiconductor 406c.

Here, in some cases, there is a mixed region of the semiconductor 406a and the semiconductor 406b between the semiconductor 406a and the semiconductor 406b. Furthermore, in some cases, there is a mixed region of the semiconductor 406b and the semiconductor 406c between the semiconductor 406b and the semiconductor 406c. The mixed region has a low interface state density. For that reason, the stack of the semiconductor 406a, the semiconductor 406b, and the semiconductor 406c has a band structure where energy at each interface and in the vicinity of the interface is changed continuously (continuous junction).

At this time, electrons move mainly in the semiconductor 406b, not in the semiconductor 406a and the semiconductor 406c. As described above, when the interface state density at the interface between the semiconductor 406a and the semiconductor 406b and the interface state density at the interface between the semiconductor 406b and the semiconductor 406c are decreased, electron movement in the semiconductor 406b is less likely to be inhibited and the on-sate current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness in a channel formation region is large.

To increase the on-state current of the transistor, for example, root mean square (RMS) roughness with a measurement area of 1 μm×1 μm of a top surface or a bottom surface of the semiconductor 406b (a formation surface; here, the semiconductor 406a) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference (P–V) with the measurement area of 1 μm×1 μm is less than 10 nm, preferably less than 9 nm, more preferably less than 8 nm, still more preferably less than 7 nm. RMS roughness, Ra, and P–V can be measured using a scanning probe microscope SPA-500 manufactured by SII Nano Technology Inc.

The electron movement is also inhibited, for example, in the case where the density of defect states is high in a region where a channel is formed.

For example, in the case were the semiconductor 406b contains oxygen vacancies (also denoted by $V_o$), donor levels are formed by entry of hydrogen into sites of oxygen vacancies in some cases. A state in which hydrogen enters sites of oxygen vacancies are denoted by $V_oH$ in the following description in some cases. $V_oH$ is a factor of decreasing the on-state current of the transistor because $V_oH$ scatters electrons. Note that sites of oxygen vacancies become more stable by entry of oxygen than by entry of hydrogen. Thus, by decreasing oxygen vacancies in the semiconductor 406b, the on-state current of the transistor can be increased in some cases.

To decrease oxygen vacancies in the semiconductor 406b, for example, there is a method in which excess oxygen in the insulator 402 is moved to the semiconductor 406b through the semiconductor 406a. In this case, the semiconductor 406a is preferably a layer having an oxygen-transmitting property (a layer through which oxygen passes or is transmitted).

In the case where the transistor has an s-channel structure, a channel is formed in the whole of the semiconductor 406b. Therefore, as the semiconductor 406b has a larger thickness, a channel region becomes larger. In other words, the thicker the semiconductor 406b is, the larger the on-state current of the transistor is. For example, the semiconductor 406b has a region with a thickness of greater than or equal to 20 nm, preferably greater than or equal to 40 nm, more preferably greater than or equal to 60 nm, still more preferably greater than or equal to 100 nm. Note that the semiconductor 406b has a region with a thickness of, for example, less than or equal to 300 nm, preferably less than or equal to 200 nm, more preferably less than or equal to 150 nm because the productivity of the semiconductor device might be decreased.

Moreover, the thickness of the semiconductor 406c is preferably as small as possible to increase the on-state current of the transistor. The thickness of the semiconductor 406c is less than 10 nm, preferably less than or equal to 5 nm, more preferably less than or equal to 3 nm, for example.

Meanwhile, the semiconductor 406c has a function of blocking entry of elements other than oxygen (such as hydrogen and silicon) included in the adjacent insulator into the semiconductor 406b where a channel is formed. For this reason, it is preferable that the semiconductor 406c have a certain thickness. The thickness of the semiconductor 406c is greater than or equal to 0.3 nm, preferably greater than or equal to 1 nm, more preferably greater than or equal to 2 nm, for example. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a has a region with a thickness of, for example, greater than or equal to 10 nm, preferably greater than or equal to 20 nm, more preferably greater than or equal to 40 nm, still more preferably greater than or equal to 60 nm. When the thickness of the semiconductor 406a is made large, a distance from an interface between the adjacent insulator and the semiconductor 406a to the semiconductor 406b in which a channel is formed can be large. Since the productivity of the semiconductor device might be decreased, the semiconductor 406a has a region with a thickness of, for example, less than or equal to 200 nm, preferably less than or equal to 120 nm, more preferably less than or equal to 80 nm.

For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by secondary ion mass spectrometry (SIMS) is provided between the semiconductor 406b and the semiconductor 406a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ which is measured by SIMS is provided between the semiconductor 406b and the semiconductor 406c.

It is preferable to reduce the concentration of hydrogen in the semiconductor 406a and the semiconductor 406c in order to reduce the concentration of hydrogen in the semiconductor 406b. The semiconductor 406a and the semiconductor 406c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the semiconductor 406a and the semiconductor 406c in order to reduce the concentration of nitrogen in the semiconductor 406b. The semiconductor 406a and the semiconductor 406c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The above three-layer structure is an example. For example, a two-layer structure without the semiconductor 406a or the semiconductor 406c may be employed. A four-layer structure in which any one of the semiconductors described as examples of the semiconductor 406a, the semiconductor 406b, and the semiconductor 406c is provided below or over the semiconductor 406a or below or over the semiconductor 406c may be employed. An n-layer structure (n is an integer of 5 or more) in which any one of the semiconductors described as examples of the semiconductor 406a, the semiconductor 406b, and the semiconductor 406c is provided at two or more of the following positions: over the semiconductor 406a, below the semiconductor 406a, over the semiconductor 406c, and below the semiconductor 406c.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

The conductor 413 may be formed to have a single-layer structure or a stacked-layer structure using a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten, for example. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 402 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Note that the insulator 402 may include an insulator containing nitrogen such as silicon nitride oxide or silicon nitride.

The insulator 402 may have a function of preventing diffusion of impurities from the substrate 400. In the case where the semiconductor 406b is an oxide semiconductor, the insulator 402 can have a function of supplying oxygen to the semiconductor 406b.

Each of the conductor 416a and the conductor 416b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 412 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The conductor 404 may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator 408 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 408 may be preferably formed to have, for example, a single-layer structure or a stacked-layer structure including an insulator containing aluminum oxide, silicon nitride oxide, silicon nitride, gallium oxide, yttrium oxide, zirconium oxide, lanthanum oxide, neodymium oxide, hafnium oxide, or tantalum oxide.

The insulator 418 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 418 may be preferably formed to have a single-layer structure or a stacked-layer structure including an insulator containing silicon oxide or silicon oxynitride.

Figure 39A:
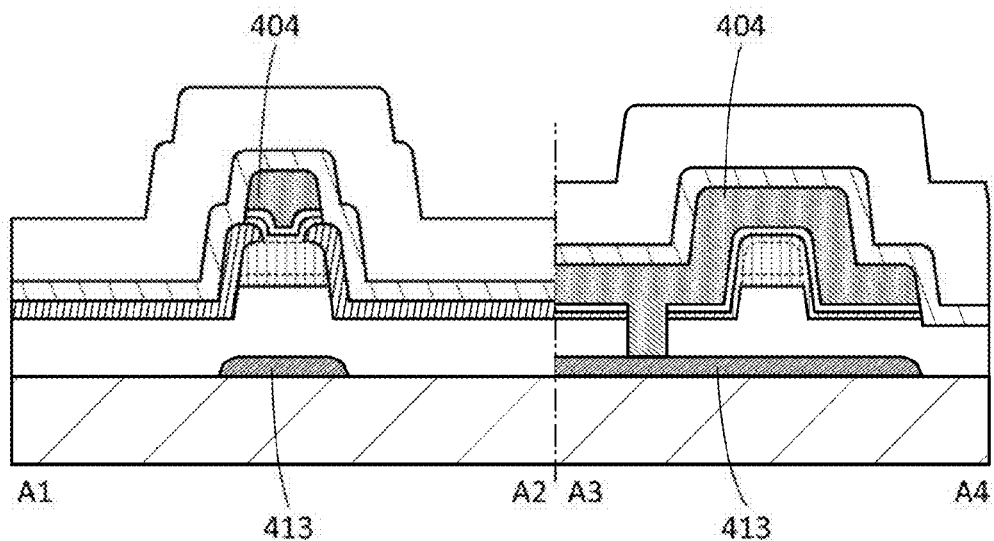
FIGS. 39A and 39B are cross-sectional views which illustrate a transistor of one embodiment of the present invention.
Figure 39B:
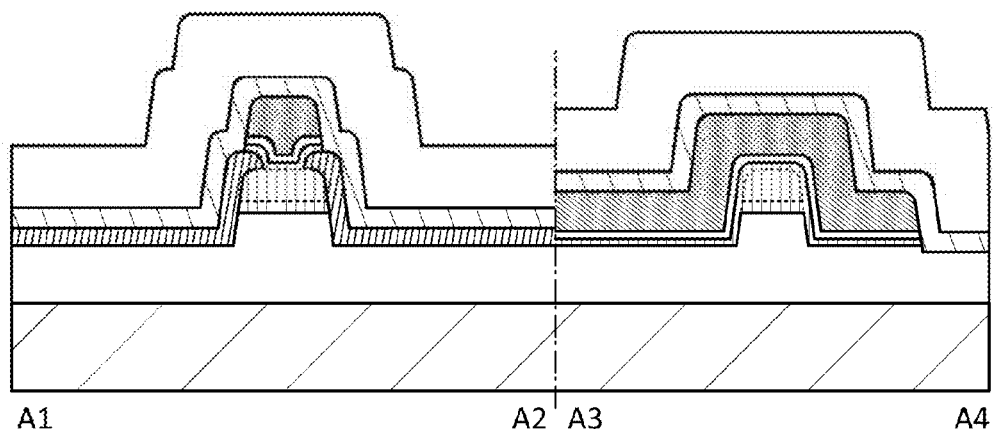

Although FIGS. 38A and 38B show an example where the conductor 404 which is a first gate electrode of a transistor is not electrically connected to the conductor 413 which is a second gate electrode, a transistor structure of one embodiment of the present invention is not limited thereto. For example, as illustrated in FIG. 39A, the conductor 404 may be electrically connected to the conductor 413. With such a structure, the conductor 404 and the conductor 413 are supplied with the same potential; thus, switching characteristics of the transistor can be improved. Alternatively, as illustrated in FIG. 39B, the conductor 413 is not necessarily provided.

Figure 40A:
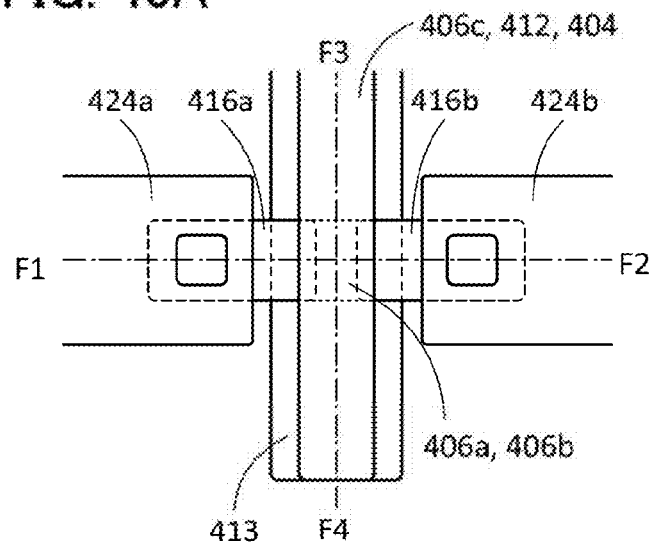
FIGS. 40A and 40B are a top view and a cross-sectional view which illustrate a transistor of one embodiment of the present invention.
Figure 40B:
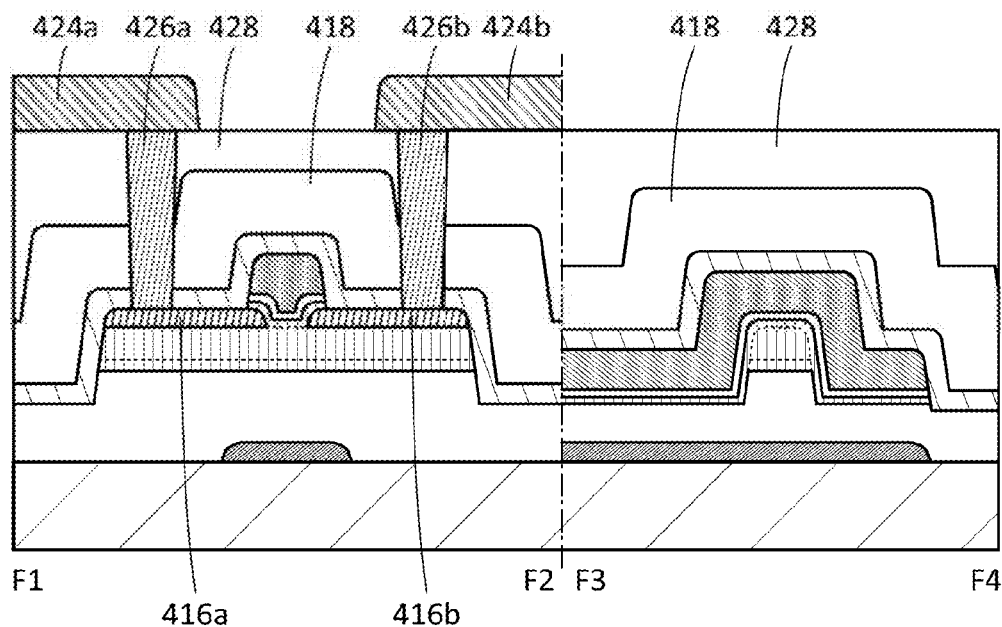

FIG. 40A is an example of a top view of a transistor. FIG. 40B is an example of a cross-sectional view taken along dashed-dotted line F1-F2 and dashed-dotted line F3-F4 in FIG. 40A. Note that some components such as an insulator are omitted in FIG. 40A for easy understanding.

Although FIGS. 38A and 38B and the like show an example where the conductor 416a and the conductor 416b which function as a source electrode and a drain electrode are in contact with a top surface and a side surface of the semiconductor 406b, a top surface of the insulator 402, and the like, a transistor structure of one embodiment of the present invention is not limited thereto. For example, as illustrated in FIGS. 40A and 40B, the conductor 416a and the conductor 416b may be in contact with only the top surface of the semiconductor 406b.

As illustrated in FIG. 40B, an insulator 428 may be provided over the insulator 418. The insulator 428 preferably has a flat top surface. The insulator 428 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Note that the insulator 428 may include an insulator containing nitrogen such as silicon nitride oxide or silicon nitride. To planarize the top surface of the insulator 428, planarization treatment may be performed by a chemical mechanical polishing (CMP) method or the like.

A resin may be used as the insulator 428. For example, a resin containing polyimide, polyamide, acrylic, silicone, or the like may be used. The use of a resin does not need planarization treatment performed on the top surface of the insulator 428 in some cases. By using a resin, a thick film can be formed in a short time; thus, the productivity can be increased.

As illustrated in FIGS. 40A and 40B, a conductor 424a and a conductor 424b may be provided over the insulator 428. The conductor 424a and the conductor 424b may function as wirings, for example. The insulator 428 may include an opening and the conductor 416a and the conductor 424a may be electrically connected to each other through the opening. The insulator 428 may have another opening and the conductor 416b and the conductor 424b may be electrically connected to each other through the opening. In this case, the conductor 426a and the conductor 426b may be provided in the respective openings.

Each of the conductor 424a and the conductor 424b may be formed to have, for example, a single-layer structure or a stacked-layer structure including a conductor containing one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

In the transistor illustrated in FIGS. 40A and 40B, the conductor 416a and the conductor 416b are not in contact with side surfaces of the semiconductor 406b. Thus, an electric field applied from the conductor 404 functioning as a first gate electrode to the side surfaces of the semiconductor 406b is less likely to be blocked by the conductor 416a and the conductor 416b. The conductor 416a and the conductor 416b are not in contact with a top surface of the insulator 402. Thus, excess oxygen (oxygen) released from the insulator 402 is not consumed to oxidize the conductor 416a and the conductor 416b. Accordingly, excess oxygen (oxygen) released from the insulator 402 can be efficiently used to reduce oxygen vacancies in the semiconductor 406b. In other words, the transistor having the structure illustrated in FIGS. 40A and 40B has excellent electrical characteristics such as a high on-state current, high field-effect mobility, a small subthreshold swing value, and high reliability.

Figure 41A:
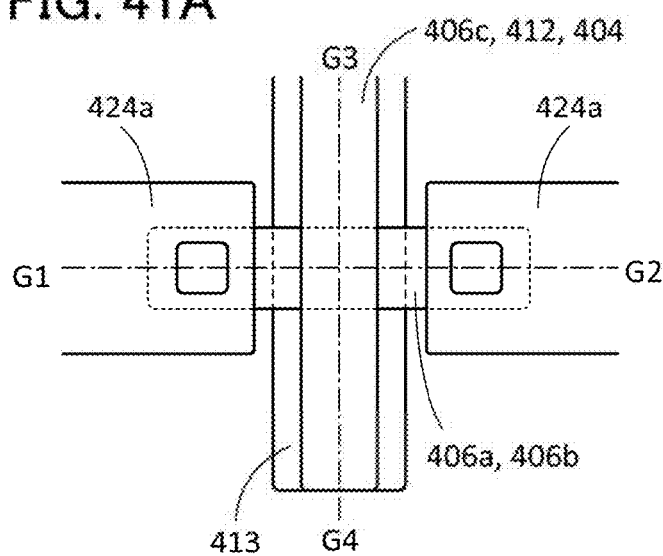
FIGS. 41A and 41B are a top view and a cross-sectional view which illustrate a transistor of one embodiment of the present invention.
Figure 41B:
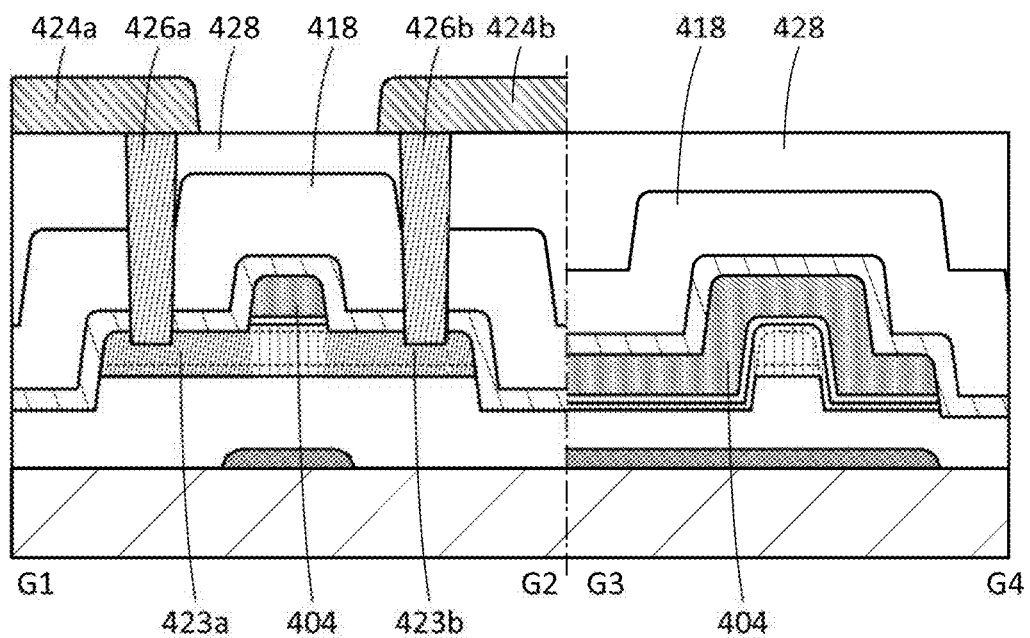

FIGS. 41A and 41B are a top view and a cross-sectional view of a transistor of one embodiment of the present invention. FIG. 41A is the top view and FIG. 41B is the cross-sectional view taken along dashed-dotted line G1-G2 and dashed-dotted line G3-G4 in FIG. 41A. Note that for simplification of the drawing, some components in the top view in FIG. 41A are not illustrated.

The transistor may have a structure in which, as illustrated in FIGS. 41A and 41B, the conductor 416a and the conductor 416b are not provided and the conductor 426a and the conductor 426b are in contact with the semiconductor 406b. In this case, the low-resistance region 423a (low-resistance region 423b) is preferably provided in a region in contact with at least the conductor 426a and the conductor 426b in the semiconductor 406b and/or the semiconductor 406a. The low-resistance region 423a and the low-resistance region 423b may be formed in such a manner that, for example, the conductor 404 and the like are used as masks and impurities are added to the semiconductor 406b and/or the semiconductor 406a. The conductor 426a and the conductor 426b may be provided in holes (portions which penetrate) or recessed portions (portions which do not penetrate) of the semiconductor 406b. When the conductor 426a and the conductor 426b are provided in holes or recessed portions of the semiconductor 406b, contact areas between the conductors 426a and 426b and the semiconductor 406b are increased; thus, the adverse effect of the contact resistance can be decreased. In other words, the on-state current of the transistor can be increased.

<Transistor Structure 2>

Figure 42A:
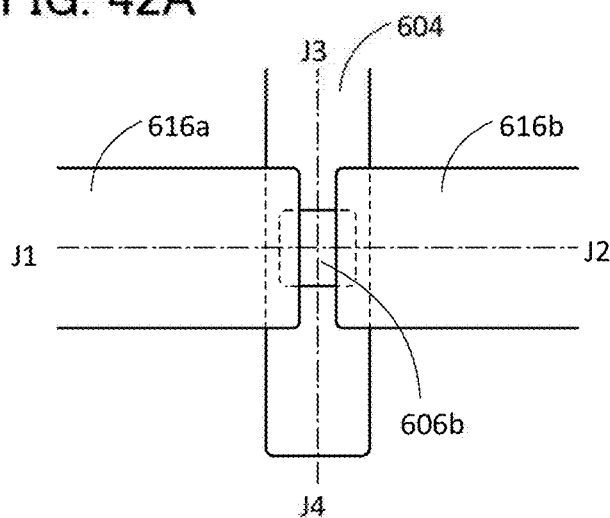
FIGS. 42A and 42B are a top view and a cross-sectional view which illustrate a transistor of one embodiment of the present invention.
Figure 42B:
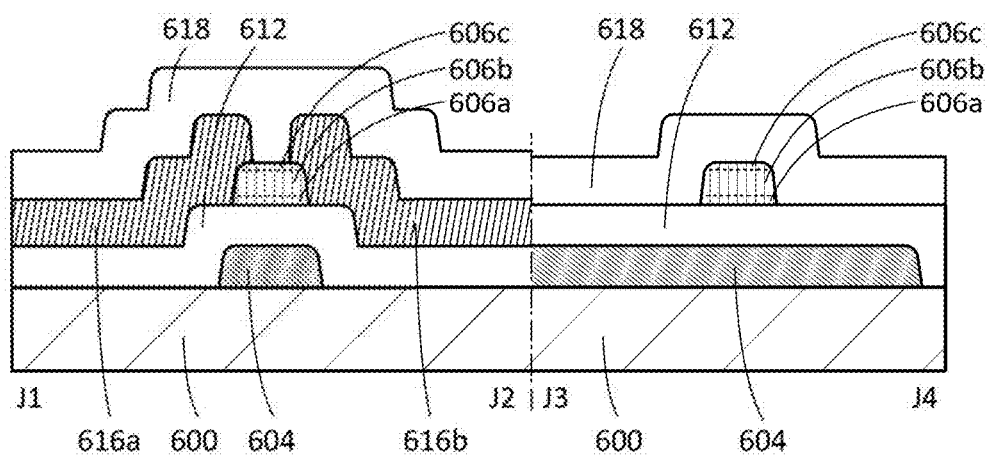

FIGS. 42A and 42B are a top view and a cross-sectional view which illustrate a transistor of one embodiment of the present invention. FIG. 42A is a top view and FIG. 42B is a cross-sectional view taken along dashed-dotted line J1-J2 and dashed-dotted line J3-J4 in FIG. 42A. Note that for simplification of the drawing, some components are not illustrated in the top view in FIG. 42A.

The transistor in FIGS. 42A and 42B includes a conductor 604 over a substrate 600, an insulator 612 over the conductor 604, a semiconductor 606a over the insulator 612, a semiconductor 606b over the semiconductor 606a, a semiconductor 606c over the semiconductor 606b, a conductor 616a and a conductor 616b which are in contact with the semiconductor 606a, the semiconductor 606b, and the semiconductor 606c and which are arranged to be separated from each other, and an insulator 618 over the semiconductor 606c, the conductor 616a, and the conductor 616b. The conductor 604 faces a bottom surface of the semiconductor 606b with the insulator 612 provided therebetween. The insulator 612 may have a projection. An insulator may be provided between the substrate 600 and the conductor 604. For the insulator, the description of the insulator 402 or the insulator 408 is referred to. The semiconductor 606a or the insulator 618 is not necessarily provided.

The semiconductor 606b serves as a channel formation region of the transistor. The conductor 604 serves as a first gate electrode (also referred to as a front gate electrode) of the transistor. The conductor 616a and the conductor 616b serve as a source electrode and a drain electrode of the transistor.

The insulator 618 is preferably an insulator containing excess oxygen.

For the substrate 600, the description of the substrate 400 is referred to. For the conductor 604, the description of the conductor 404 is referred to. For the insulator 612, the description of the insulator 412 is referred to. For the semiconductor 606a, the description of the semiconductor 406c is referred to. For the semiconductor 606b, the description of the semiconductor 406b is referred to. For the semiconductor 606c, the description of the semiconductor 406a is referred to. For the conductor 616a and the conductor 616b, the description of the conductor 416a and the conductor 416b is referred to. For the insulator 618, the description of the insulator 402 is referred to.

Over the insulator 618, a display element may be provided. For example, a pixel electrode, a liquid crystal layer, a common electrode, a light-emitting layer, an organic EL layer, an anode electrode, a cathode electrode, or the like may be provided. The display element is connected to the conductor 616a or the like, for example.

Figure 43A:
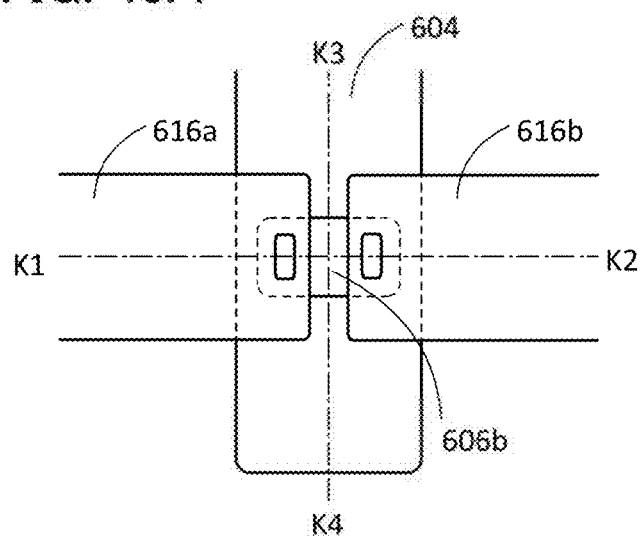
FIGS. 43A and 43B are a top view and a cross-sectional view which illustrate a transistor of one embodiment of the present invention.
Figure 43B:
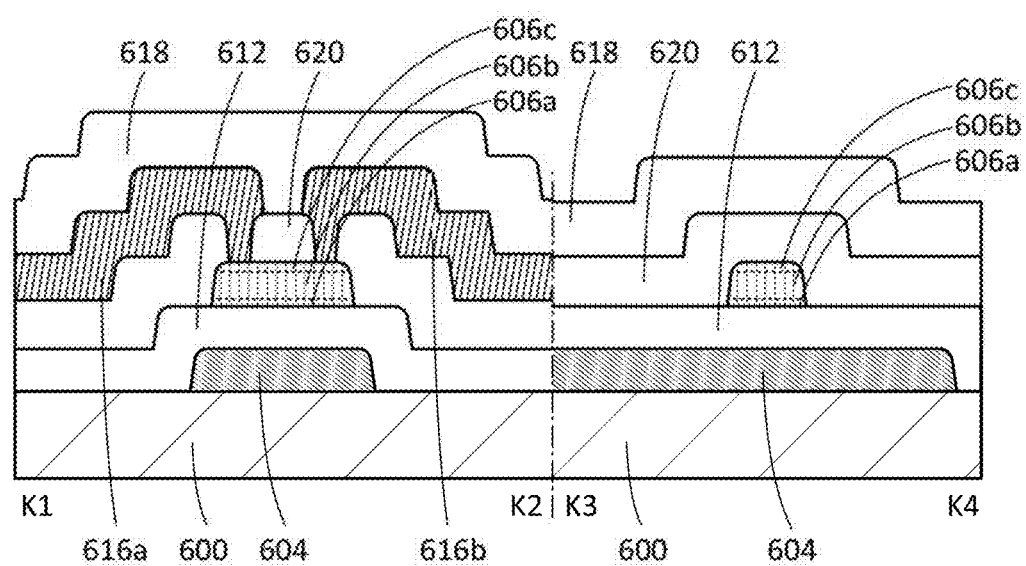

FIG. 43A is an example of a top view of a transistor. FIG. 43B is an example of a cross-sectional view taken along dashed-dotted line K1-K2 and dashed-dotted line K3-K4 in FIG. 43A. Note that some components such as an insulator are omitted in FIG. 43A for easy understanding.

Over the semiconductor, an insulator that can function as a channel protective film may be provided. For example, as illustrated in FIGS. 43A and 43B, an insulator 620 may be provided between the semiconductor 606c and the conductors 616a and 616b. In that case, the conductor 616a (conductor 616b) and the semiconductor 606c are connected to each other through an opening in the insulator 620. For the insulator 620, the description of the insulator 618 may be referred to.

Figure 44A:
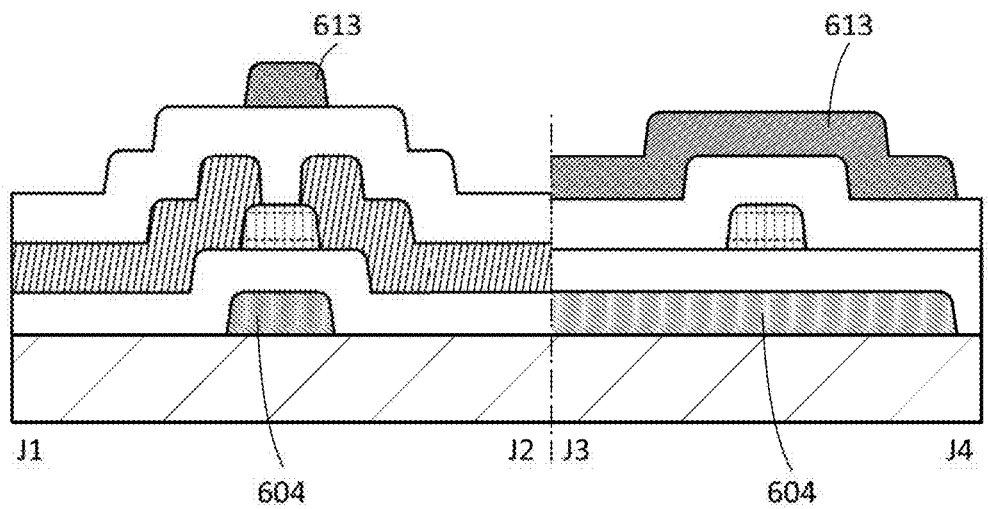
FIGS. 44A and 44B are cross-sectional views illustrating a transistor of one embodiment of the present invention.
Figure 44B:
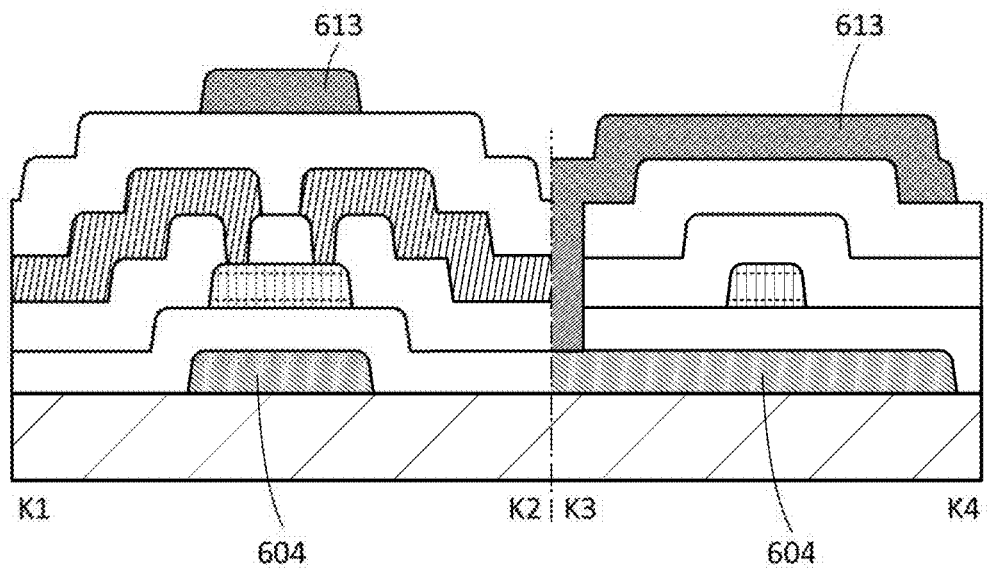

In FIG. 42B and FIG. 43B, a conductor 613 may be provided over the insulator 618. Examples in that case are shown in FIGS. 44A and 44B. For the conductor 613, the description of the conductor 413 is referred to. A potential or signal which is the same as that supplied to the conductor 604 or a potential or signal which is different from that supplied to the conductor 604 may be supplied to the conductor 613. For example, by supplying a constant potential to the conductor 613, the threshold voltage of a transistor may be controlled. In other words, the conductor 613 can function as a second gate electrode. Furthermore, an s-channel structure may be formed using the conductor 613 and the like.

<Semiconductor Device>

An example of a semiconductor device of one embodiment of the present invention is shown below.

An example of a semiconductor device including a transistor of one embodiment of the present invention is shown below.

Figure 45A:
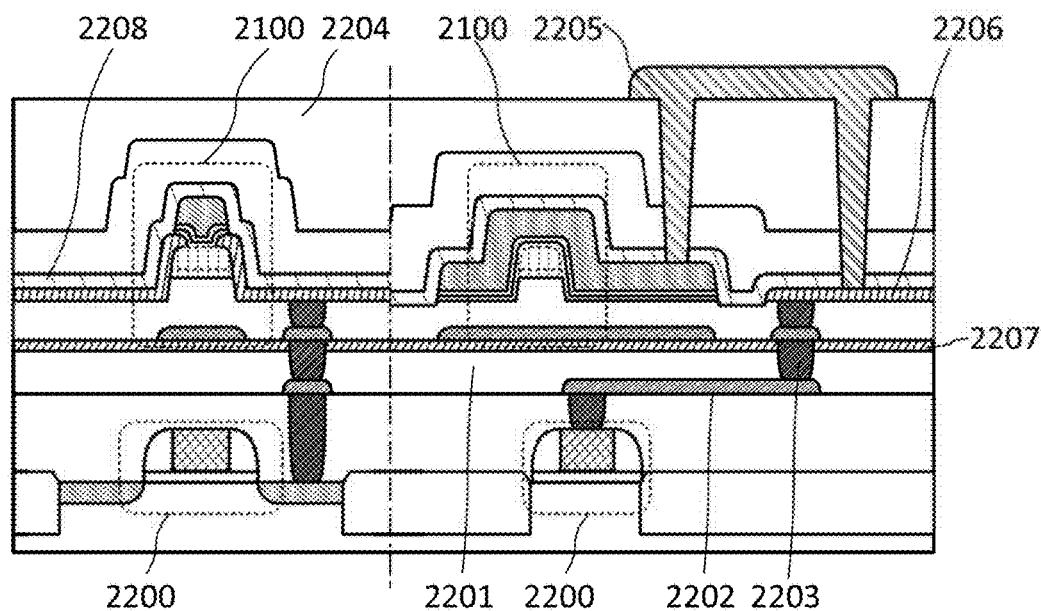
FIGS. 45A and 45B are cross-sectional views illustrating a semiconductor device of one embodiment of the present invention.

FIG. 45A is a cross-sectional view of a semiconductor device of one embodiment of the present invention. The semiconductor device illustrated in FIG. 45A includes a transistor 2200 using a first semiconductor in a lower portion and a transistor 2100 using a second semiconductor in an upper portion. FIG. 45A shows an example in which the transistor illustrated in FIGS. 38A and 38B is used as the transistor 2100 using the second semiconductor.

As the first semiconductor, a semiconductor having an energy gap different from that of the second semiconductor may be used. For example, the first semiconductor is a semiconductor other than an oxide semiconductor and the second semiconductor is an oxide semiconductor. As the first semiconductor, silicon, germanium, or the like which has a polycrystalline structure, a single crystal structure, or the like may be used. Alternatively, a semiconductor having distortion such as distorted silicon may be used. Alternatively, as the first semiconductor, gallium arsenide, aluminum gallium arsenide, indium gallium arsenide, gallium nitride, indium phosphide, silicon germanium, or the like which can be used for a high-electron-mobility transistor (HEMT) may be used. By using any of these semiconductors as the first semiconductor, the transistor 2200 capable of high speed operation can be obtained. By using an oxide semiconductor as the second semiconductor, the transistor 2100 with a low off-state current can be obtained.

Note that the transistor 2200 may be either an n-channel transistor or a p-channel transistor, and an appropriate transistor is used in accordance with a circuit. As the transistor 2100 and/or the transistor 2200, the above-described transistor or the transistor illustrated in FIG. 45A is not necessarily used in some cases.

The semiconductor device illustrated in FIG. 45A includes the transistor 2100 above the transistor 2200 with an insulator 2201 and an insulator 2207 provided therebetween. Between the transistor 2200 and the transistor 2100, a plurality of conductors 2202 which function as wirings are provided. Wirings or electrodes provided in an upper layer and a lower layer are electrically connected to each other by a plurality of conductors 2203 embedded in insulating films. Furthermore, the semiconductor device includes an insulator 2204 over the transistor 2100, a conductor 2205 over the insulator 2204, and a conductor 2206 formed in the same layer (through the same steps) as a source electrode and a drain electrode of the transistor 2100.

The insulator 2204 may be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Note that the insulator 2204 may include an insulator containing nitrogen such as silicon nitride oxide or silicon nitride.

A resin may be used as the insulator 2204. For example, a resin containing polyimide, polyamide, acrylic, silicone, or the like may be used. The use of a resin does not need planarization treatment performed on the top surface of the insulator 2204 in some cases. By using a resin, a thick film can be formed in a short time; thus, the productivity can be increased.

By stacking a plurality of transistors, a plurality of circuits can be arranged with high density.

Here, in the case where single crystal silicon is used as the first semiconductor of the transistor 2200, the hydrogen concentration in an insulator near the first semiconductor of the transistor 2200 is preferably high. The hydrogen terminates dangling bonds of silicon, so that the reliability of the transistor 2200 can be increased. On the other hand, in the case where an oxide semiconductor is used as the second semiconductor of the transistor 2100, the hydrogen concentration in an insulator near the second semiconductor of the transistor 2100 is preferably low. The hydrogen causes generation of carriers in the oxide semiconductor, which might lead to a decrease in the reliability of the transistor 2100. Therefore, in the case where the transistor 2200 using single crystal silicon and the transistor 2100 using an oxide semiconductor are stacked, providing the insulator 2207 having a function of blocking hydrogen between the transistors is effective because the reliability of the transistors can be increased.

The insulator 2207 may be, for example, formed to have a single-layer structure or a stacked-layer structure using an insulator containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

Furthermore, an insulator having a function of blocking hydrogen is preferably formed over the transistor 2100 to cover the transistor 2100 using an oxide semiconductor. As the insulator, an insulator that is similar to the insulator 2207 can be used, and in particular, an aluminum oxide film is preferably used. The aluminum oxide film has a high blocking effect of preventing penetration of both oxygen and impurities such as hydrogen and moisture. Thus, by using the aluminum oxide film as an insulator 2208 covering the transistor 2100, release of oxygen from the oxide semiconductor included in the transistor 2100 can be prevented and entry of water and hydrogen into the oxide semiconductor can be prevented.

Figure 45B:
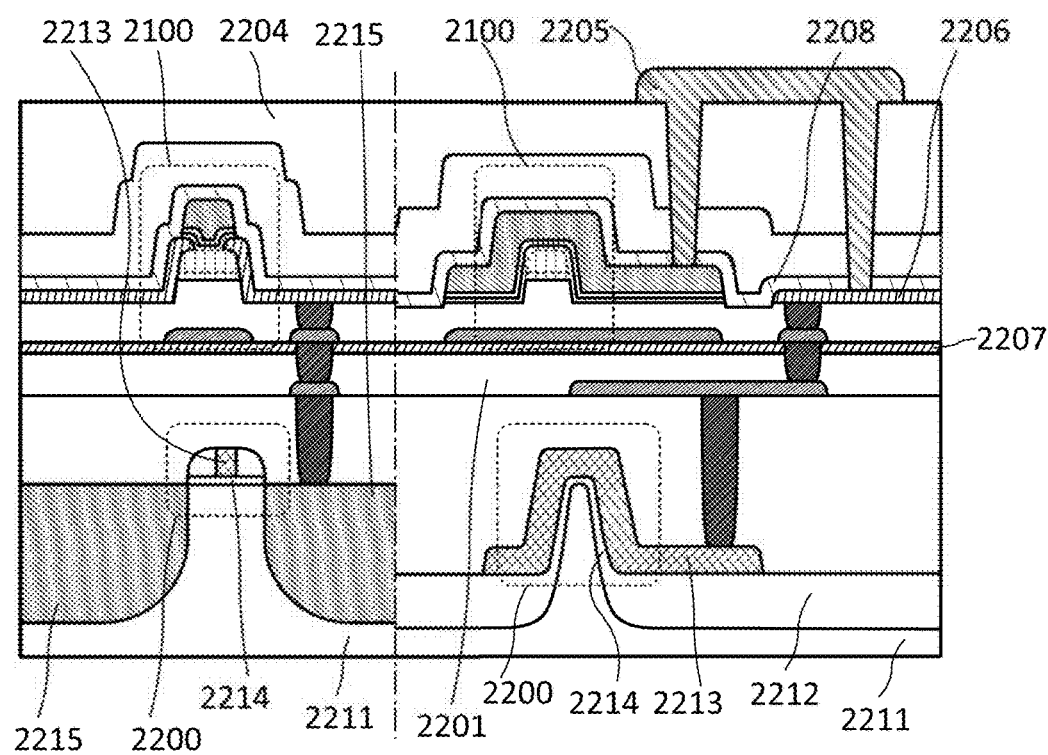

Note that the transistor 2200 can be a transistor of various types without being limited to a planar type transistor. For example, a FIN-type transistor can be used. An example of a cross-sectional view in this case is shown in FIG. 45B. An insulating layer 2212 is provided over a semiconductor substrate 2211. The semiconductor substrate 2211 includes a projection with a thin tip (also referred to a fin). Alternatively, the projection may not have the thin tip; a projection with a cuboid-like projection and a projection with a thick tip are permitted, for example. A gate insulator 2214 is provided over the projection of the semiconductor substrate 2211, and a gate electrode 2213 is provided over the gate insulator 2214. Source and drain regions 2215 are formed in the semiconductor substrate 2211. Note that here is shown an example in which the semiconductor substrate 2211 includes the projection; however, a semiconductor device of one embodiment of the present invention is not limited thereto. For example, a semiconductor region having a projection may be formed by processing an SOI substrate.

In the above circuit, electrodes of the transistor 2100 and the transistor 2200 can be connected in a variety of ways;

thus, a variety of circuits can be formed. Examples of circuit configurations which can be achieved by using a semiconductor device of one embodiment of the present invention are shown below.

Figure 46A:
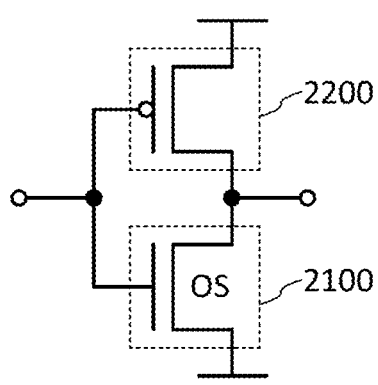
FIGS. 46A and 46B are circuit diagrams of semiconductor devices of embodiments of the present invention.

A circuit diagram in FIG. 46A shows a configuration of a so-called CMOS inverter in which the p-channel transistor 2200 and the n-channel transistor 2100 are connected to each other in series and in which gates of them are connected to each other.

Figure 46B:
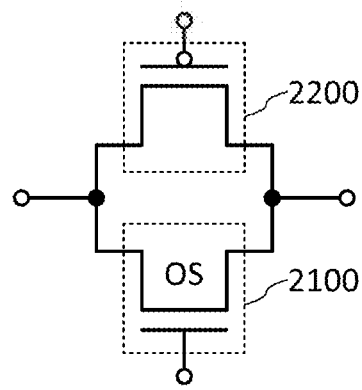

A circuit diagram in FIG. 46B shows a configuration in which sources of the transistors 2100 and 2200 are connected to each other and drains of the transistors 2100 and 2200 are connected to each other. With such a configuration, the transistors can function as a so-called CMOS analog switch.

Figure 47A:
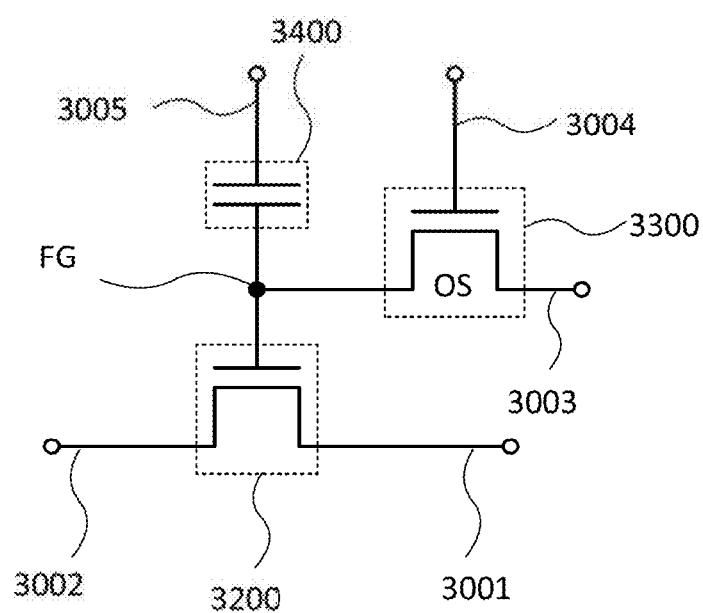
FIGS. 47A and 47B are circuit diagrams of memory devices of embodiments of the present invention.
Figure 47B:
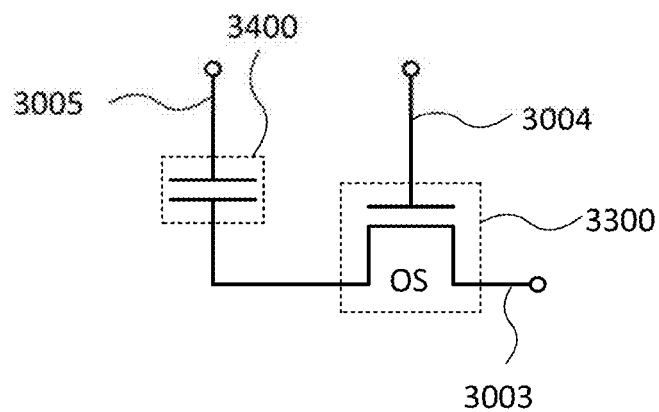

An example of a semiconductor device (memory device) which includes the transistor of one embodiment of the present invention, which can retain stored data even when not powered, and which has an unlimited number of write cycles is shown in FIGS. 47A and 47B.

The semiconductor device illustrated in FIG. 47A includes a transistor 3200 using a first semiconductor, a transistor 3300 using a second semiconductor, and a capacitor 3400. Note that any of the above-described transistors can be used as the transistor 3300.

The transistor 3300 is a transistor using an oxide semiconductor. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 47A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 47A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge is held at the node FG (retaining).

Since the off-state current of the transistor 3300 is extremely low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{t\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($V_{t\_L}$), the transistor 3200 remains off. Thus, the data retained in the node FG can be read by determining the potential of the second wiring 3002.

Note that in the case where memory cells are arrayed, it is necessary that data of a desired memory cell is read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{t\_L}$.

The semiconductor device in FIG. 47B is different from the semiconductor device in FIG. 47A in that the transistor 3200 is not provided. Also in this case, writing and retaining operation of data can be performed in a manner similar to that of the semiconductor device in FIG. 47A.

Reading of data in the semiconductor device in FIG. 47B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<RF Tag>

An RF tag including the transistor or the memory device is described below with reference to FIG. 48.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

A configuration of the RF tag will be described with reference to FIG. 48. FIG. 48 is a block diagram illustrating a configuration example of an RF tag.

Figure 48:
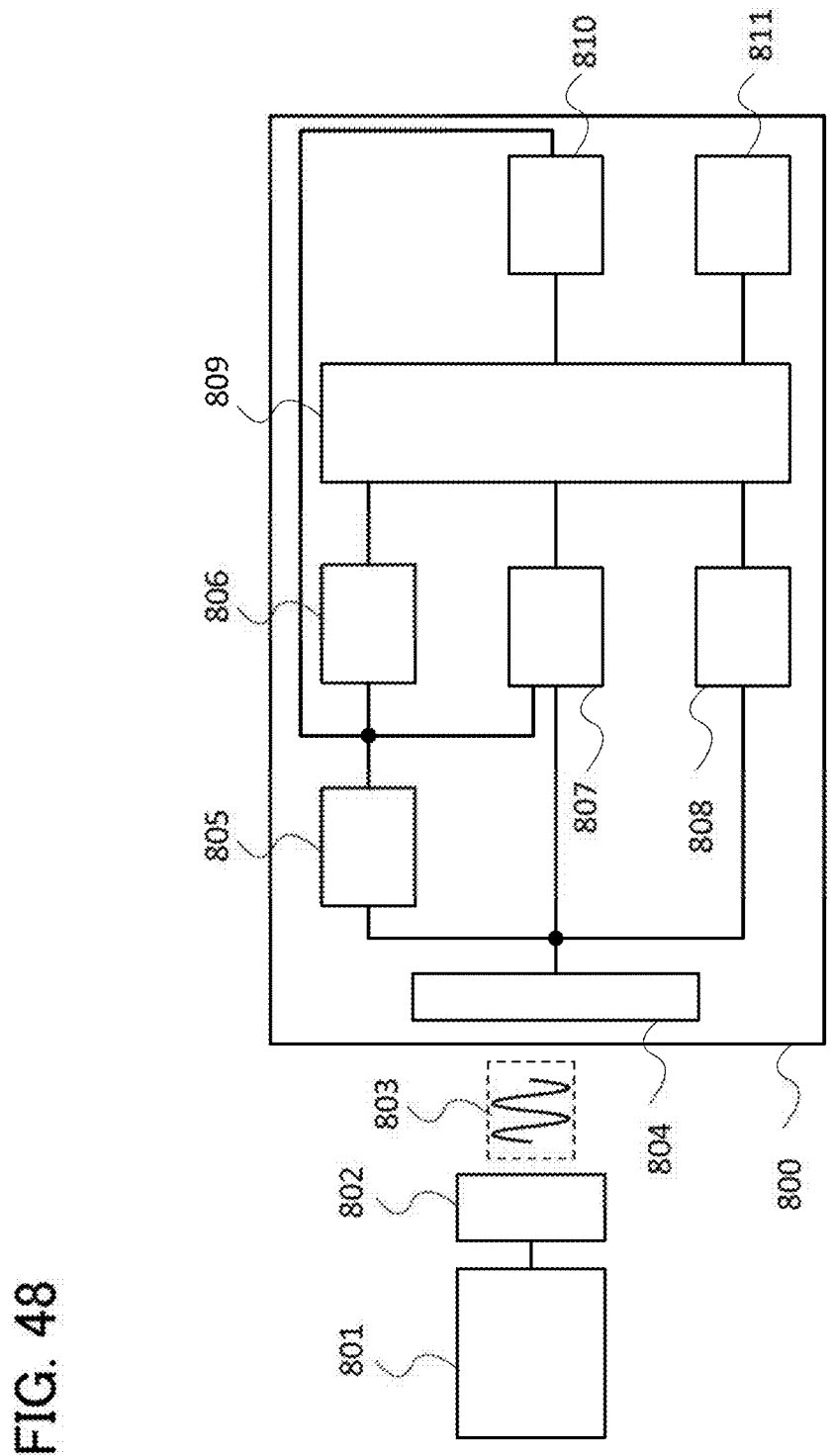
FIG. 48 is a block diagram of an RF tag of one embodiment of the present invention.
Figure 49A:
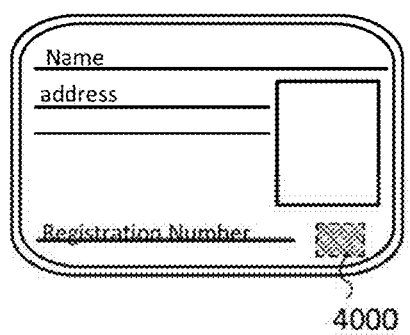
FIGS. 49A to 49F illustrate application examples of an RF tag of one embodiment of the present invention.
Figure 49B:
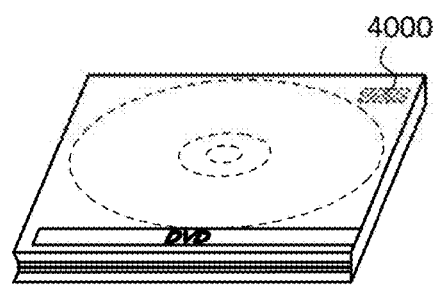
Figure 49C:
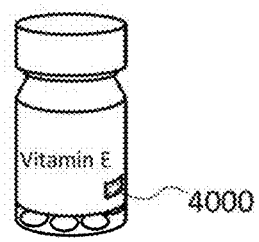
Figure 49D:
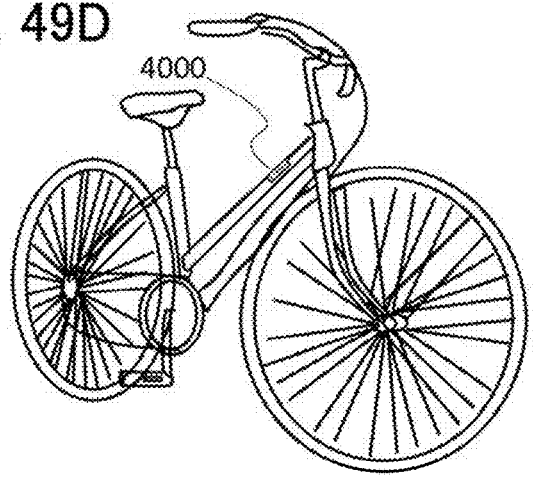
Figure 49E:
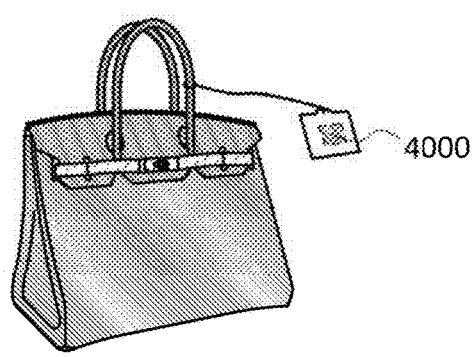
Figure 49F:
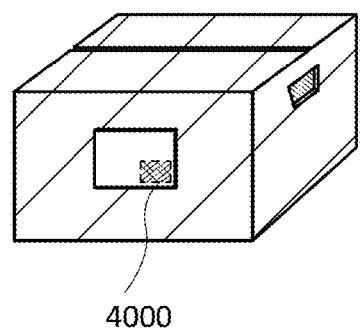

As shown in FIG. 48, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Furthermore, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Furthermore, the ROM 811 stores an identification number (ID) or the like and outputs it in accordance with processing.

Note that the decision whether each circuit described above is provided or not can be made as appropriate as needed.

Here, the above-described memory device can be used as the memory circuit 810. Since the memory device of one embodiment of the present invention can retain data even when not powered, the memory device is suitable for an RF tag. Furthermore, the memory device of one embodiment of the present invention needs power (voltage) needed for data writing lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 49A to 49F. The RF tag is widely used and can be provided for, for example, products such as bills, coins, securities, bearer bonds, documents (e.g., driver's licenses or resident's cards, see FIG. 49A), packaging containers (e.g., wrapping paper or bottles, see FIG. 49C), recording media (e.g., DVDs or video tapes, see FIG. 49B), vehicles (e.g., bicycles, see FIG. 49D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 49E and 49F).

An RF tag 4000 of one embodiment of the present invention is fixed on products by, for example, being attached to a surface thereof or being embedded therein. For example, the RF tag 4000 is fixed to each product by being embedded in paper of a book, or embedded in an organic resin of a package. The RF tag 4000 of one embodiment of the present invention is small, thin, and lightweight, so that the design of a product is not impaired even after the RF tag 4000 of one embodiment of the present invention is fixed thereto. Furthermore, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<CPU>

A CPU including a semiconductor device such as any of the above-described transistors or the above-described memory device is described below.

Figure 50:
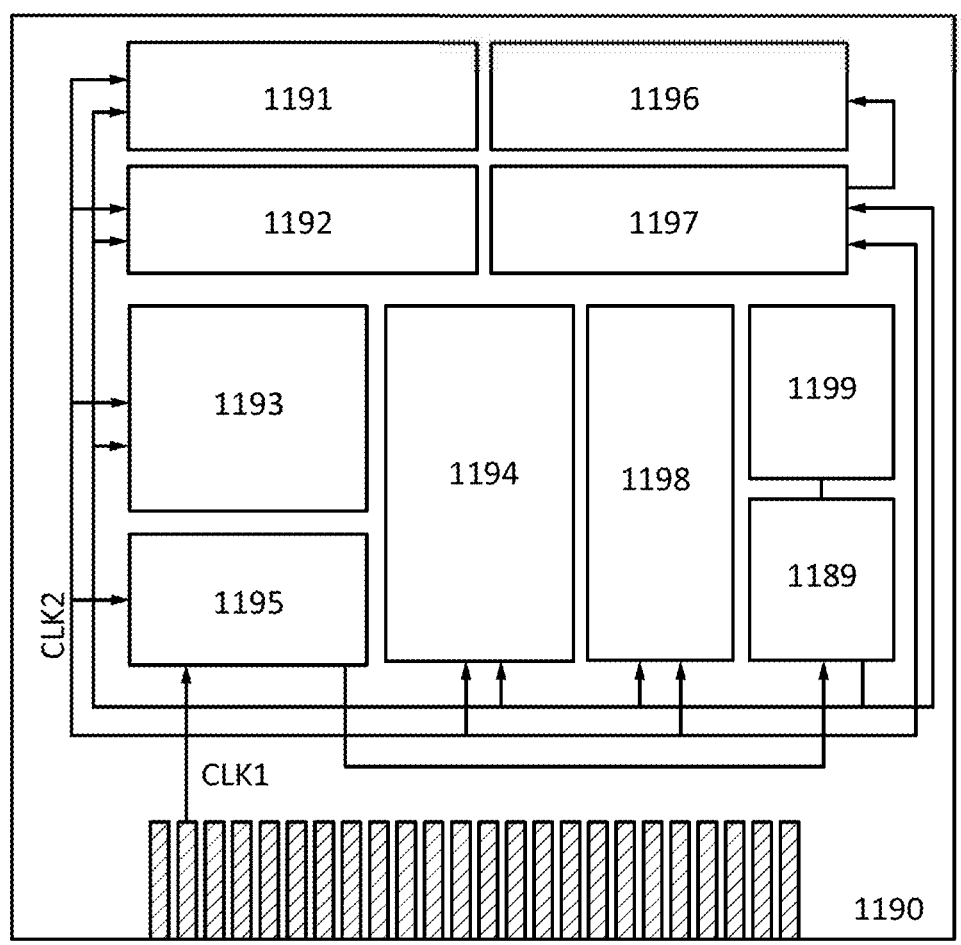
FIG. 50 is a block diagram illustrating a CPU of one embodiment of the present invention.

FIG. 50 is a block diagram illustrating a configuration example of a CPU including any of the above-described transistors as a component.

The CPU illustrated in FIG. 50 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 50 is just an example in which the configuration has been simplified, and an actual CPU may have a variety of configurations depending on the application. For example, the CPU may have the following configuration: a structure including the CPU illustrated in FIG. 50 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 50, a memory cell is provided in the register 1196. For the memory cell of the register 1196, any of the above-described transistors, the above-described memory device, or the like can be used.

In the CPU illustrated in FIG. 50, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 51:
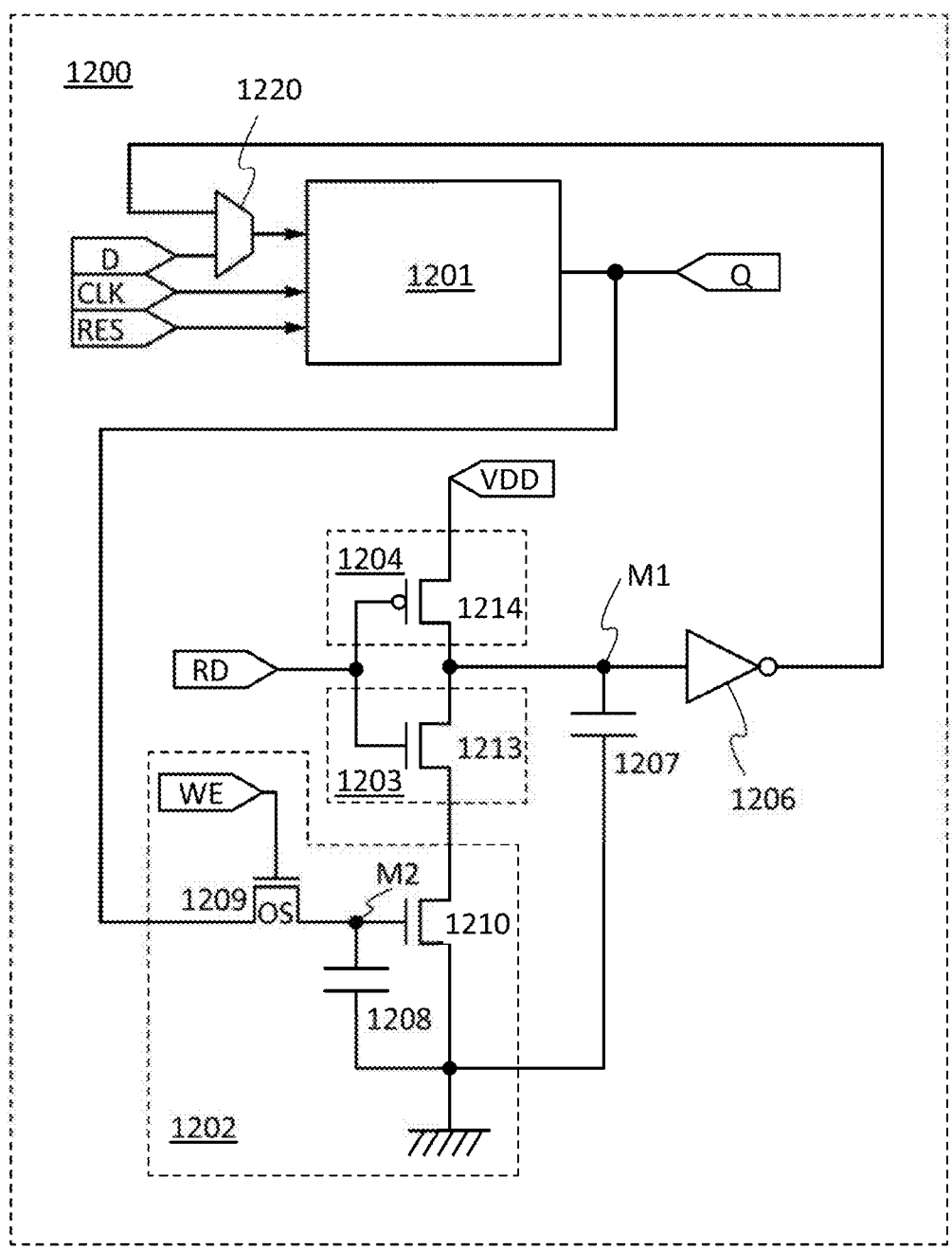
FIG. 51 is a circuit diagram of a memory element of one embodiment of the present invention.

FIG. 51 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 51 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 51, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 51, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon layer or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer or the substrate 1190 including a semiconductor other than an oxide semiconductor can be used for the rest of the transistors.

As the circuit 1201 in FIG. 51, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency identification (RF-ID).

<Display Device>

The following shows configuration examples of a display device of one embodiment of the present invention.

[Configuration example]

Figure 52A:
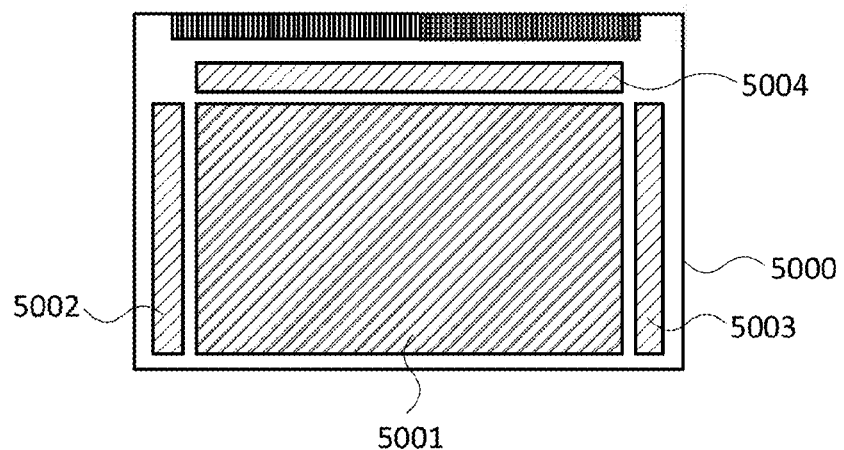
FIGS. 52A to 52C are a top view and circuit diagrams which illustrate a display device of one embodiment of the present invention.
Figure 52B:
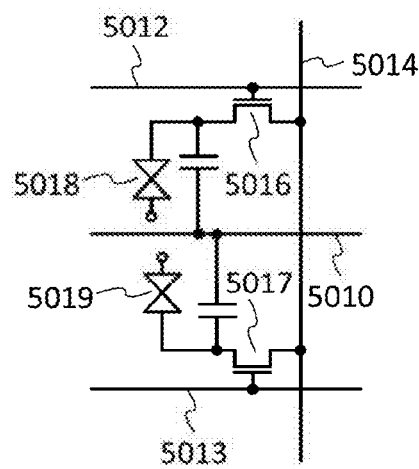
Figure 52C:
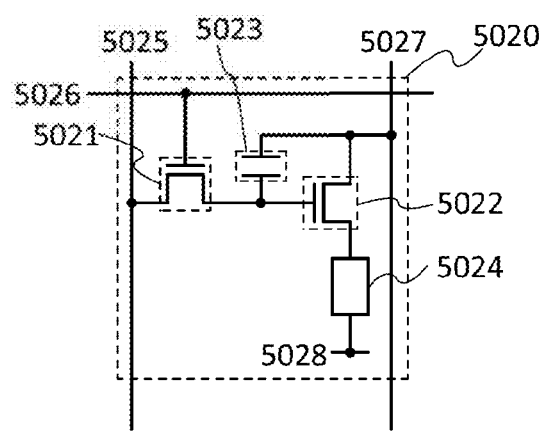

FIG. 52A is a top view of a display device of one embodiment of the present invention. FIG. 52B illustrates a pixel circuit where a liquid crystal element is used for a pixel of a display device of one embodiment of the present invention. FIG. 52C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Thus, by using any of the above-described transistors for a pixel or a driver circuit, the display device can have high display quality and/or high reliability.

FIG. 52A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as a flexible printed circuit (FPC).

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Furthermore, in the case where a driver circuit is separately formed, the number of wiring connections is increased. By providing the driver circuit over the substrate 5000, the number of wiring connections can be reduced. Accordingly, the reliability and/or yield can be improved.

[Liquid Crystal Display Device]

FIG. 52B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Thus, the liquid crystal display device can have high display quality and/or high reliability.

A first pixel electrode is electrically connected to the transistor 5016 and a second pixel electrode is electrically connected to the transistor 5017. The first pixel electrode and the second pixel electrode are separated. Shapes of the first pixel electrode and the second pixel electrode are not especially limited. For example, the first pixel electrode may have a V-like shape.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, a gate insulator functioning as a dielectric, and a capacitor electrode electrically connected to the first pixel electrode or the second pixel electrode.

The multi-domain pixel includes a first liquid crystal element 5018 and a second liquid crystal element 5019 in a pixel. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 52B. For example, a switch, a resistor, a capacitor, a transistor, a sensor, a logic circuit, or the like may be added to the pixel circuit shown in FIG. 52B.

[Organic EL Display Device]

FIG. 52C illustrates another example of a circuit configuration of the pixel. Here, a pixel structure of a display device using an organic EL element is shown.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 52C illustrates an example of a pixel circuit. Here, one pixel includes two n-channel transistors. Note that any of the above-described transistors can be used as the n-channel transistors. Furthermore, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used as appropriate. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage $V_{th}$ of the driver transistor 5022 is applied to the signal line 5025.

In the case of performing analog grayscale driving, a voltage higher than or equal to a voltage which is the sum of the forward voltage of the light-emitting element 5024 and the threshold voltage $V_{th}$ of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 52C. For example, a switch, a resistor, a capacitor, a sensor, a transistor, a logic circuit, or the like may be added to the pixel circuit shown in FIG. 52C.

In the case where any of the above-described transistors is used for the circuit shown in FIGS. 52A to 52C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode.

For example, in this specification and the like, a display element, a display device which is a device including a display element, a light-emitting element, and a light-emitting device which is a device including a light-emitting element can employ a variety of modes or can include a variety of elements. A display element, a display device, a light-emitting element, or a light-emitting device includes, for example, at least one of an EL element (e.g., an EL element including organic and inorganic materials, an organic EL element, or an inorganic EL element), an LED (e.g., a white LED, a red LED, a green LED, or a blue LED), a transistor (a transistor which emits light depending on current), an electron emitter, a liquid crystal element, electronic ink, an electrophoretic element, a grating light valve (GLV), a plasma display panel (PDP), a micro electro mechanical system (MEMS), a digital micromirror device (DMD), a digital micro shutter (DMS), an interferometric modulator display (IMOD) element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper.

A color layer (also referred to as a color filter) may be used in order to obtain a full-color display device in which white light (W) for a backlight (e.g., an organic EL element, an inorganic EL element, an LED, or a fluorescent lamp) is used. As the color layer, red (R), green (G), blue (B), yellow (Y), or the like may be combined as appropriate, for example. With the use of the color layer, higher color reproducibility can be obtained than in the case without the color layer. In this case, by providing a region with the color layer and a region without the color layer, white light in the region without the color layer may be directly utilized for display. By partly providing the region without the color layer, a decrease in luminance due to the color layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the color layer in some cases.

<Module>

A display module using a semiconductor device of one embodiment of the present invention is described below with reference to FIG. 53.

Figure 53:
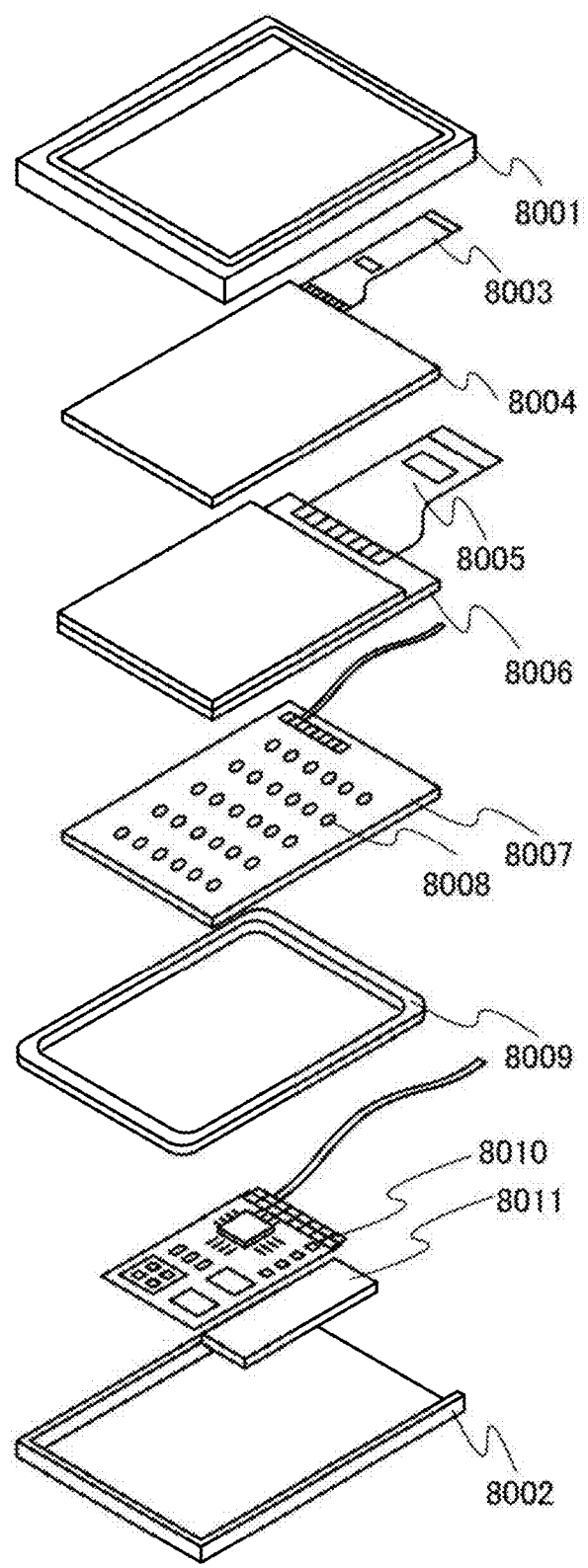
FIG. 53 illustrates a display module of one embodiment of the present invention.

In a display module 8000 in FIG. 53, a touch panel 8004 connected to an FPC 8003, a cell 8006 connected to an FPC 8005, a backlight unit 8007, a frame 8009, a printed circuit board 8010, and a battery 8011 are provided between an upper cover 8001 and a lower cover 8002. Note that the backlight unit 8007, the battery 8011, the touch panel 8004, and the like are not provided in some cases.

The semiconductor device of one embodiment of the present invention can be used for the cell 8006, for example.

The shapes and sizes of the upper cover 8001 and the lower cover 8002 can be changed as appropriate in accordance with the sizes of the touch panel 8004 and the cell 8006.

The touch panel 8004 can be a resistive touch panel or a capacitive touch panel and may be formed to overlap with the cell 8006. A counter substrate (sealing substrate) of the cell 8006 can have a touch panel function. A photosensor may be provided in each pixel of the cell 8006 so that an optical touch panel is obtained. An electrode for a touch sensor may be provided in each pixel of the cell 8006 so that a capacitive touch panel is obtained.

The backlight unit 8007 includes a light source 8008. The light source 8008 may be provided at an end portion of the backlight unit 8007 and a light diffusing plate may be used.

The frame 8009 may protect the cell 8006 and also function as an electromagnetic shield for blocking electromagnetic waves generated by the operation of the printed circuit board 8010. The frame 8009 may function as a radiator plate.

The printed circuit board 8010 has a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet <Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 54A to 54F illustrate specific examples of these electronic devices.

Figure 54A:
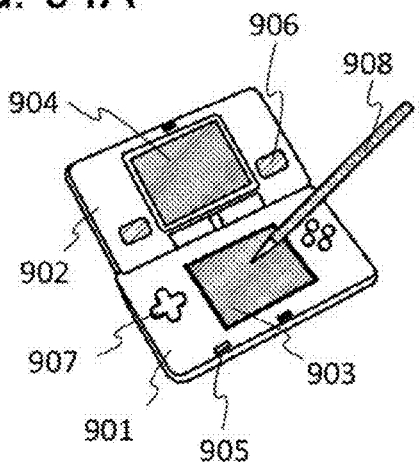
FIGS. 54A to 54F each illustrate an electronic device of one embodiment of the present invention.

FIG. 54A illustrates a portable game console including a housing 901, a housing 902, a display portion 903, a display portion 904, a microphone 905, a speaker 906, an operation key 907, a stylus 908, and the like. Although the portable game console in FIG. 54A has the two display portions 903 and 904, the number of display portions included in a portable game console is not limited to this.

Figure 54B:
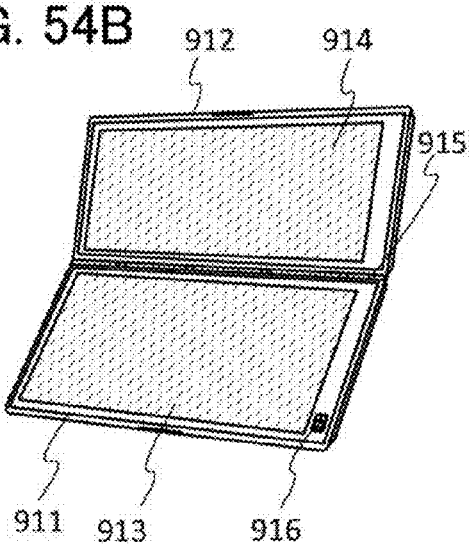

FIG. 54B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 54C:
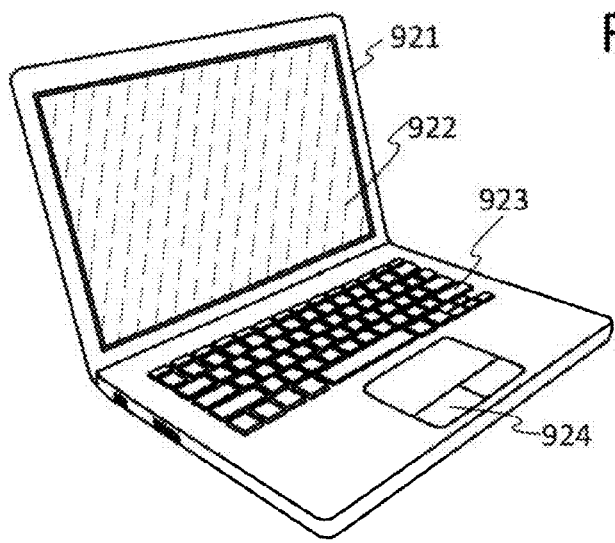

FIG. 54C illustrates a laptop personal computer, which includes a housing 921, a display portion 922, a keyboard 923, a pointing device 924, and the like.

Figure 54D:
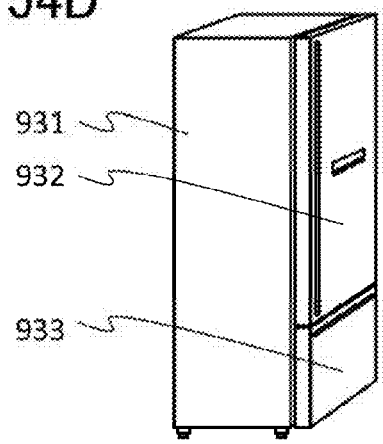

FIG. 54D illustrates the electric refrigerator-freezer including a housing 931, a refrigerator door 932, a freezer door 933, and the like.

Figure 54E:
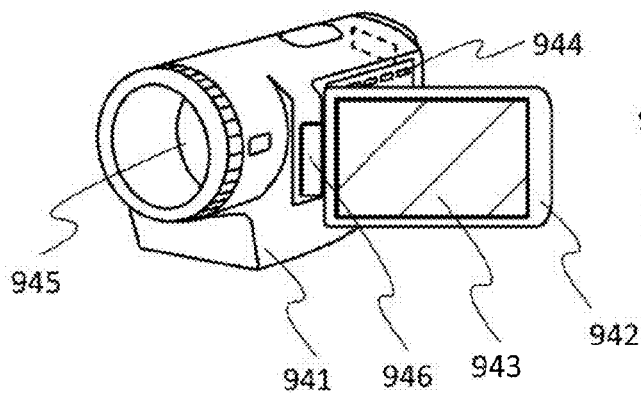

FIG. 54E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 54F:
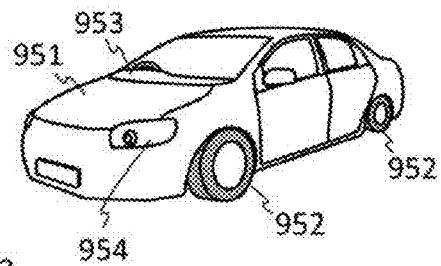

FIG. 54F illustrates an ordinary vehicle including a car body 951, wheels 952, a dashboard 953, lights 954, and the like.

<Electronic Device with Curved Display Region or Curved Light-Emitting Region>

Electronic devices with a curved display region or a curved light-emitting region, which are embodiments of the present invention, are described below with reference to FIGS. 55A1, 55A2, 55A3, 55B1, 55B2, 55C1, and 55C2. Here, information devices, in particular, portable information devices (portable devices) are described as examples of the electronic devices. The portable information devices include, for example, mobile phone devices (e.g., phablets and smartphones) and tablet terminals (slate PCs).

FIG. 55A1 is a perspective view illustrating an external shape of a portable device 1300A. FIG. 55A2 is a top view illustrating the portable device 1300A. FIG. 55A3 illustrates a usage state of the portable device 1300A.

FIGS. 55B1 and 55B2 are perspective views illustrating the outward form of a portable device 1300B.

FIGS. 55C1 and 55C2 are perspective views illustrating the outward form of a portable device 1300C.

<Portable Device>

The portable device 1300A has one or more functions of a telephone, email creating and reading, a notebook, information browsing, and the like.

A display portion of the portable device 1300A is provided along plural surfaces. For example, the display portion may be provided by placing a flexible display device along the inside of a housing. Thus, text data, image data, or the like can be displayed on a first region 1311 and/or a second region 1312.

For example, images used for three operations can be displayed on the first region 1311 (see FIG. 55A1). Furthermore, text data and the like can be displayed on the second region 1312 as indicated by dashed rectangles in the drawing (see FIG. 55A2).

In the case where the second region 1312 is on the upper portion of the portable device 1300A, a user can easily see text data or image data displayed on the second region 1312 of the portable device 1300A while the portable device 1300A is placed in a breast pocket of the user's clothes (see FIG. 55A3). For example, the user can see the phone number, name, and the like of the caller of an incoming call, from above the portable device 1300A.

The portable device 1300A may include an input device or the like between the display device and the housing, in the display device, or over the housing. As the input device, for example, a touch sensor, a light sensor, or an ultrasonic sensor may be used. In the case where the input device is provided between the display device and the housing or over the housing, a touch panel may be, for example, a matrix switch type, a resistive type, an ultrasonic surface acoustic wave type, an infrared type, electromagnetic induction type, or an electrostatic capacitance type. In the case where the input device is provided in the display device, an in-cell sensor, an on-cell sensor, or the like may be used.

Note that the portable device 1300A can be provided with a vibration sensor or the like and a memory device that stores a program for shifting a mode into an incoming call rejection mode based on vibration sensed by the vibration sensor or the like. Thus, the user can shift the mode into the incoming call rejection mode by tapping the portable device 1300A over his/her clothes to apply vibration.

The portable device 1300B includes a display portion including the first region 1311 and the second region 1312 and a housing 1310 that supports the display portion.

The housing 1310 has a plurality of bend portions, and the longest bend portion in the housing 1310 is between the first region 1311 and the second region 1312.

The portable device 1300B can be used with the second region 1312 provided along the longest bend portion facing sideward.

The portable device 1300C includes a display portion including the first region 1311 and the second region 1312 and the housing 1310 that supports the display portion.

The housing 1310 has a plurality of bend portions, and the second longest bend portion in the housing 1310 is between the first region 1311 and the second region 1312.

The portable device 1300C can be used with the second region 1312 facing upward.

Note that a content described in each embodiment, a part and another part can be combined, or the part can be replaced with another part, as appropriate. In each embodiment, a content described in the embodiment is a content described with reference to a variety of diagrams or a content described with a text disclosed in this specification.

Furthermore, a part of a drawing, another part of the drawing, and a part of another drawing are combined as appropriate, whereby more drawings can be made.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" is given, the value is not limited to the description. In other words, a description of a value that includes a term "preferable", "preferably", or the like does not necessarily limit the value.

As another specific example, a description "a voltage is preferred to be 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, a description "a film is an insulating film" is given to describe properties of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked structure, "a film is provided between an A film and a B film" is given. In that case, for example, it can be specified that the case where the film is a stacked film of four or more layers is excluded from the invention. For example, it can be specified that the case where a conductive film is provided between the A film and the film is excluded from the invention.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or a text described for an item in one embodiment can be taken out to constitute one embodiment of the invention. Thus, in the case where a diagram or a text related to a certain part is described, a content taken out from a diagram or a text of the certain part is also disclosed as one embodiment of the invention and can constitute one embodiment of the invention. The embodiment of the present invention is clear. Therefore, for example, part of a diagram or a text including one or more of active elements (e.g., transistors or diodes), wirings, passive elements (e.g., capacitors or resistors), conductors, insulators, semiconductors, organic materials, inorganic materials, components, devices, operating methods, manufacturing methods, or the like can be taken out to constitute one embodiment of the invention. For example, from a circuit diagram in which N circuit elements (e.g., transistors or capacitors; N is a natural number) are provided, it is possible to constitute one embodiment of the invention by taking out M circuit elements (e.g., transistors or capacitors; M is a natural number, where M<N). As another example, it is possible to constitute one embodiment of the invention by taking out M layers (M is a natural number, where M<1V) from a cross-sectional view in which N layers (N is a natural number) are provided. As another example, it is possible to constitute one embodiment of the invention by taking out M elements (M is a natural number, where M<N) from a flow chart in which N elements (N is a natural number) are provided. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or a text described in one embodiment in this specification and the like, it will be readily appreciated by those skilled in the art that a broader concept of the specific example can be derived. Therefore, in the case where at least one specific example is described in the diagram or the text described in one embodiment, a broader concept of the specific example is disclosed as one embodiment of the invention, and one embodiment of the invention can be constituted. The embodiment of the present invention is clear.

Note that in this specification and the like, a content described in at least a diagram (which may be part of the diagram) is disclosed as one embodiment of the invention, and one embodiment of the invention can be constituted. Therefore, when a certain content is described in a diagram, the content is disclosed as one embodiment of the invention even when the content is not described with a text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

[Example 1]

In this example, samples including a semiconductor of one embodiment of the present invention were fabricated and the crystallinity thereof was evaluated.

A method for fabricating the samples is described below.

First, a glass substrate with an area of 600 mm×720 mm was prepared as a substrate.

Then, a semiconductor was deposited to a thickness of 100 nm by a sputtering method. The semiconductor was deposited using an In—Ga—Zn oxide (In:Ga:Zn=5:5:6 (atomic ratio)) target with a shape of a 240 mm×1170 mm×6 mm (thickness) rectangular parallelepiped. The thickness of the backing plate was 11 mm, and the distance between the magnet unit and a surface of the target was 47 mm. In the deposition, the substrate temperature was 170° C., the oxygen gas proportion [$O_2/(O_2+Ar)$] was 50%, the pressure was 0.6 Pa, AC power was 2.5 kW, and the distance between the target and the substrate was 150 mm.

In this example, the semiconductors were deposited with sputtering apparatuses having different magnet units. Specifically, deposition was performed under the conditions that the intensities of the horizontal magnetic field at a surface of the target were 600 G and 210 G.

Figure 56A:
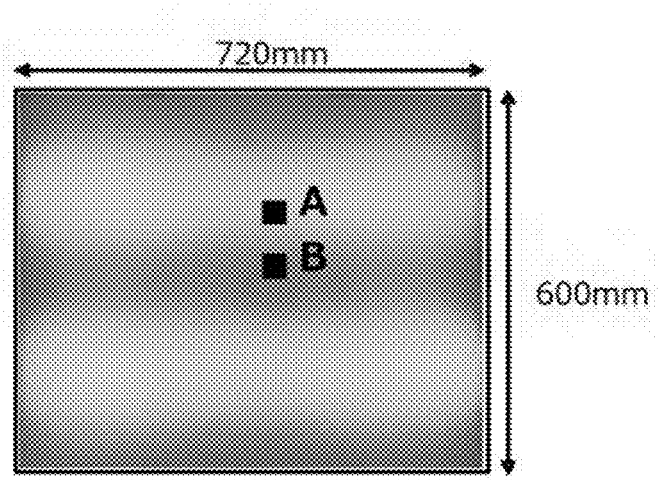
FIG. 56A shows the thickness distribution in a substrate plane and FIG. 56B shows the relations between intensities of the horizontal magnetic field of the magnet units and XRD.

Next, the crystallinity of each sample was evaluated. FIG. 56A shows points (a point A and a point B) where measurement was performed. FIG. 56A shows the thickness distribution of the semiconductor in the plane of the glass substrate. A lighter region has a larger thickness and a darker region has a smaller thickness. The crystallinity was observed by an out-of-plane method using an X-ray diffractometer D8 ADVANCE manufactured by Bruker AXS.

Figure 56B:
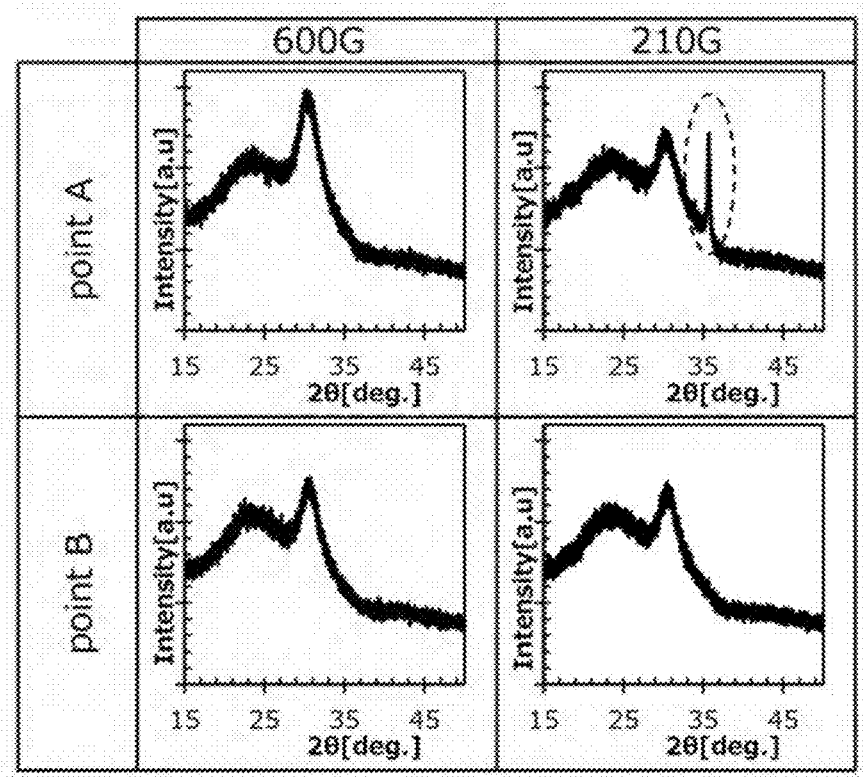

FIG. 56B shows the results. A peak indicating alignment was observed at 2θ of around 30° at any measured point in each sample. A sample showing such a peak probably includes a c-axis-aligned In—Ga—Zn oxide crystal. This implies that the samples fabricated in this example are each a CAAC-OS.

In the point A in the sample fabricated using the magnet unit with an intensity of the horizontal magnetic field of 210 G, a peak indicating alignment (surrounded by a dashed-line circle) was observed at 2θ of around 36°. A sample having such a peak have a crystal structure that is classified into the space group Fd-3m (e.g., a spinel structure); for example, a peak at 2θ of around 36° is likely to be derived from the (222) plane.

In contrast, in the sample fabricated using the magnet unit with an intensity of the horizontal magnetic field of 600 G, a peak indicating alignment was not observed at 2θ of around 36° at any measured point. Accordingly, by increasing the intensity of the horizontal magnetic field of the magnet unit from 210 G to 600 G, the crystallinity can be uniform in the plane of the substrate.

Therefore, in the sample fabricated using the magnet unit with an intensity of the horizontal magnetic field of 600 G, a CAAC-OS in the plane of the substrate can have high and uniform crystallinity. As the magnetic field is stronger, a CAAC-OS is easily formed; thus, a deposition model in which a pellet is moved above a top surface of a substrate by a magnetic field of magnetron sputtering is reasonable.

EXPLANATION OF REFERENCE

100: pellet, 100a: pellet, 100b: pellet, 101: ion, 102: zinc oxide particle, 120: substrate, 130: target, 161: region, 162: region, 163: region, 164: atomic void, 310: electron gun chamber, 312: optical system, 314: sample chamber, 316: optical system, 318: camera, 320: observation chamber, 322: film chamber, 324: electron, 328: substance, 332: fluorescent screen, 400: substrate, 402: insulator, 404: conductor, 406a: semiconductor, 406b: semiconductor, 406c: semiconductor, 408: insulator, 412: insulator, 413: conductor, 416a: conductor, 416b: conductor, 418: insulator, 423a: low-resistance region, 423b: low-resistance region, 424a: conductor, 424b: conductor, 426a: conductor, 426b: conductor, 428: insulator, 600: substrate, 604: conductor, 606a: semiconductor, 606b: semiconductor, 606c: semiconductor, 612: insulator, 613: conductor, 616a: conductor, 616b: conductor, 618: insulator, 620: insulator, 700: deposition apparatus, 701: atmosphere-side substrate supply chamber, 702: atmosphere-side substrate transfer chamber, 703a: load lock chamber, 703b: unload lock chamber, 704: transfer chamber, 705: substrate heating chamber, 706a: deposition chamber, 706b: deposition chamber, 706c: deposition chamber, 751: cryotrap, 752: stage, 761: cassette port, 762: alignment port, 763: transfer robot, 764: gate valve, 765: heating stage, 766: target, 767: attachment protection plate, 768: substrate stage, 769: substrate, 770: vacuum pump, 771: cryopump, 772: turbo molecular pump, 780: mass flow controller, 781: refiner, 782: gas heating system, 800: RF tag, 801: communication device, 802: antenna, 803: radio signal, 804: antenna, 805: rectifier circuit, 806: constant voltage circuit, 807: demodulation circuit, 808: modulation circuit, 809: logic circuit, 810: memory circuit, 811: ROM, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: refrigerator door, 933: freezer door, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 1300A: portable device, 1300B: portable device, 1300C: portable device, 1310: housing, 1311: region, 1312: region, 2100: transistor, 2200: transistor, 2201: insulator, 2202: conductor, 2203: conductor, 2204: insulator, 2205: conductor, 2206: conductor, 2207: insulator, 2208: insulator, 2211: semiconductor substrate, 2212: insulating layer, 2213: gate electrode, 2214: gate insulator, 2215: source and drain region, 3001: wiring, 3002: wiring, 3003: wiring, 3004: wiring, 3005: wiring, 3200: transistor, 3300: transistor, 3400: capacitor, 4000: RF tag, 5000: substrate, 5001: pixel portion, 5002: scan line driver circuit, 5003: scan line driver circuit, 5004: signal line driver circuit, 5010: capacitor wiring, 5012: gate wiring, 5013: gate wiring, 5014: drain electrode, 5016: transistor, 5017: transistor, 5018: liquid crystal element, 5019: liquid crystal element, 5020: pixel, 5021: switching transistor, 5022: driver transistor, 5023: capacitor, 5024: light-emitting element, 5025: signal line, 5026: scan line, 5027: power supply line, 5028: common electrode, 8000: display module, 8001: upper cover, 8002: lower cover, 8003: FPC, 8004: touch panel, 8005: FPC, 8006: cell, 8007: backlight unit, 8008: light source, 8009: frame, 8010: printed circuit board, and 8011: battery.

This application is based on Japanese Patent Application serial no. 2014-029542 filed with Japan Patent Office on Feb. 19, 2014, the entire contents of which are hereby incorporated by reference.

The invention claimed is:

1. An oxide comprising:
a plurality of plate-like In—Ga—Zn oxides over a surface,
wherein each of the plurality of plate-like In—Ga—Zn oxides has a crystal structure,
wherein each of the plurality of plate-like In—Ga—Zn oxides includes a first layer, a second layer, and a third layer,
wherein the first layer includes a gallium atom, a zinc atom, and an oxygen atom,
wherein the second layer includes an indium atom and an oxygen atom,
wherein the third layer includes a gallium atom, a zinc atom, and an oxygen atom, and
wherein a flat plane of each of the plurality of plate-like In—Ga—Zn oxides is substantially perpendicular to a normal vector of the surface.

2. An oxide comprising:
a plurality of plate-like In—Ga—Zn oxides including a first plate-like In—Ga—Zn oxide, a second plate-like In—Ga—Zn oxide, and a third plate-like In—Ga—Zn oxide over a surface,
wherein each of the plurality of plate-like In—Ga—Zn oxides has a crystal structure,
wherein each of the plurality of plate-like In—Ga—Zn oxides includes a first layer, a second layer, and a third layer,
wherein the first layer includes a gallium atom, a zinc atom, and an oxygen atom,
wherein the second layer includes an indium atom and an oxygen atom,
wherein the third layer includes a gallium atom, a zinc atom, and an oxygen atom,
wherein the first plate-like In—Ga—Zn oxide is between the second plate-like In—Ga—Zn oxide and the third plate-like In—Ga—Zn oxide,
wherein a flat-plane of each of the second plate-like In—Ga—Zn oxide and the third plate-like In—Ga—Zn oxide is substantially perpendicular to the normal vector of the surface, and wherein a flat plane of the first plate-like In—Ga—Zn oxide is not substantially perpendicular to the normal vector of the surface.

3. The oxide according to claim 1, wherein a composition formula of each of the plurality of plate-like In—Ga—Zn oxides is InGaZnO$_4$.

4. A semiconductor device comprising:
a semiconductor including the oxide according to claim 1;
an insulator; and
a conductor,
wherein the insulator includes a region in contact with the semiconductor, and
wherein the conductor includes a region where the conductor and the semiconductor overlap with each other with the insulator therebetween.

5. A module comprising:
the semiconductor device according to claim 4; and
a printed circuit board.

6. An electronic device comprising:
the semiconductor device according to claim 4 or the module according to claim 5; and
a speaker, an operation key, or a battery.

7. The oxide according to claim 1, wherein an average value of sizes of the plurality of plate-like In—Ga—Zn oxides is between 1.5 nm and 2.0 nm.

8. The oxide according to claim 1, wherein the oxide includes carbon and a concentration of carbon in the oxide is lower than $5 \times 10^{19}$ atoms/cm$^3$.

9. The oxide according to claim 2, wherein a composition formula of each of the plurality of plate-like In—Ga—Zn oxides is InGaZnO$_4$.

10. A semiconductor device comprising:
a semiconductor including the oxide according to claim 2;
an insulator; and
a conductor,
wherein the insulator includes a region in contact with the semiconductor, and
wherein the conductor includes a region where the conductor and the semiconductor overlap with each other with the insulator therebetween.

11. A module comprising:
the semiconductor device according to claim 10; and
a printed circuit board.

12. An electronic device comprising:
the semiconductor device according to claim 10 or the module according to claim 11; and
a speaker, an operation key, or a battery.

13. The oxide according to claim 2, wherein an average value of sizes of the plurality of plate-like In—Ga—Zn oxides is between 1.5 nm and 2.0 nm.

14. The oxide according to claim 2, wherein the oxide includes carbon and a concentration of carbon in the oxide is lower than $5 \times 10^{19}$ atoms/cm$^3$.

* * * * *